US011776964B2

(12) United States Patent
Yamazaki

(10) Patent No.: US 11,776,964 B2
(45) Date of Patent: Oct. 3, 2023

(54) SEMICONDUCTOR DEVICE

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 14 days.

(21) Appl. No.: 16/691,730

(22) Filed: Nov. 22, 2019

(65) Prior Publication Data

US 2020/0091154 A1    Mar. 19, 2020

Related U.S. Application Data

(63) Continuation of application No. 12/913,464, filed on Oct. 27, 2010, now Pat. No. 10,490,553.

(30) Foreign Application Priority Data

Oct. 29, 2009 (JP) .................................. 2009-249330
Jan. 22, 2010 (JP) .................................. 2010-012619

(51) Int. Cl.
*H01L 27/105*    (2023.01)
*H01L 29/06*    (2006.01)
(Continued)

(52) U.S. Cl.
CPC .......... *H01L 27/105* (2013.01); *G11C 11/405* (2013.01); *G11C 16/0433* (2013.01);
(Continued)

(58) Field of Classification Search
CPC ... H01L 29/788–7881; H01L 29/7869–78693; H01L 27/11551; H01L 27/0688; H01L 27/1207; H01L 27/1225
See application file for complete search history.

(56) References Cited

U.S. PATENT DOCUMENTS 4,466,081 A    8/1984  Masuoka
4,814,841 A *  3/1989  Masuoka ............ H01L 27/0688
                                                      257/69
(Continued)

FOREIGN PATENT DOCUMENTS

CN    101310371 A    11/2008
CN    101335276 A    12/2008
(Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Lauren R Bell
(74) *Attorney, Agent, or Firm* — Fish & Richardson P.C.

(57) ABSTRACT

Disclosed is a semiconductor device capable of functioning as a memory device. The memory device comprises a plurality of memory cells, and each of the memory cells contains a first transistor and a second transistor. The first transistor is provided over a substrate containing a semiconductor material and has a channel formation region in the substrate. The second transistor has an oxide semiconductor layer. The gate electrode of the first transistor and one of the source and drain electrodes of the second transistor are electrically connected to each other. The extremely low off current of the second transistor allows the data stored in the memory cell to be retained for a significantly long time even in the absence of supply of electric power.

15 Claims, 31 Drawing Sheets

(51) Int. Cl.

| | | |
|---|---|---|
| *H01L 29/786* | (2006.01) | |
| *H01L 21/02* | (2006.01) | |
| *H01L 21/46* | (2006.01) | |
| *H01L 27/12* | (2006.01) | |
| *G11C 11/405* | (2006.01) | |
| *G11C 16/04* | (2006.01) | |
| *H01L 21/8258* | (2006.01) | |
| *H10B 41/10* | (2023.01) | |
| *H10B 41/20* | (2023.01) | |
| *H10B 41/30* | (2023.01) | |
| *H10B 41/35* | (2023.01) | |
| *H10B 41/70* | (2023.01) | |
| *H01L 29/78* | (2006.01) | |
| *H01L 49/02* | (2006.01) | |
| *H01L 27/02* | (2006.01) | |

(52) U.S. Cl.
CPC ........ *H01L 21/02664* (2013.01); *H01L 21/46* (2013.01); *H01L 21/8258* (2013.01); *H01L 27/1225* (2013.01); *H01L 29/06* (2013.01); *H01L 29/7869* (2013.01); *H01L 29/78693* (2013.01); *H10B 41/10* (2023.02); *H10B 41/20* (2023.02); *H10B 41/30* (2023.02); *H10B 41/35* (2023.02); *H10B 41/70* (2023.02); *H01L 27/0207* (2013.01); *H01L 28/60* (2013.01); *H01L 29/7833* (2013.01)

(56) References Cited

U.S. PATENT DOCUMENTS

| | | |
|---|---|---|
| 4,902,637 A | 2/1990 | Kondou et al. |
| 5,112,765 A | 5/1992 | Cederbaum et al. |
| 5,198,683 A * | 3/1993 | Sivan .......... H01L 27/1104 257/331 |
| 5,349,366 A | 9/1994 | Yamazaki et al. |
| 5,366,922 A | 11/1994 | Aoki et al. |
| 5,436,506 A * | 7/1995 | Kim ............ H01L 27/1112 257/347 |
| 5,502,320 A | 3/1996 | Yamada |
| 5,526,304 A * | 6/1996 | Kawamura ........ H01L 27/1108 365/154 |
| 5,691,217 A * | 11/1997 | Honeycutt ........ H01L 27/11 148/DIG. 14 |
| 5,731,856 A | 3/1998 | Kim et al. |
| 5,744,864 A | 4/1998 | Cillessen et al. |
| 5,796,650 A | 8/1998 | Wik et al. |
| 5,812,231 A | 9/1998 | Kochi et al. |
| 5,851,866 A | 12/1998 | Son |
| 5,936,881 A | 8/1999 | Kawashima et al. |
| 5,964,750 A | 10/1999 | Tulleken et al. |
| 6,127,702 A | 10/2000 | Yamazaki et al. |
| 6,180,957 B1 | 1/2001 | Miyasaka et al. |
| 6,266,269 B1 | 7/2001 | Karp et al. |
| 6,271,542 B1 | 8/2001 | Emma et al. |
| 6,294,274 B1 | 9/2001 | Kawazoe et al. |
| 6,314,017 B1 | 11/2001 | Emori et al. |
| 6,396,745 B1 | 5/2002 | Hong et al. |
| 6,445,026 B1 | 9/2002 | Kubota et al. |
| 6,515,511 B2 | 2/2003 | Sugibayashi et al. |
| 6,563,174 B2 | 5/2003 | Kawasaki et al. |
| 6,625,057 B2 | 9/2003 | Iwata |
| 6,628,551 B2 | 9/2003 | Jain |
| 6,717,180 B2 | 4/2004 | Yamazaki et al. |
| 6,727,522 B1 | 4/2004 | Kawasaki et al. |
| 6,774,397 B2 | 8/2004 | Arao et al. |
| 6,808,965 B1 | 10/2004 | Miyasaka et al. |
| 6,808,971 B2 | 10/2004 | Bhattacharyya |
| 6,933,201 B2 | 8/2005 | Tominari et al. |
| 6,946,354 B2 | 9/2005 | Sakaguchi |
| 6,989,569 B1 | 1/2006 | Hiramoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,095,047 B2 | 8/2006 | Arao et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,335,597 B2 | 2/2008 | Arao et al. |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,483,013 B2 | 1/2009 | Osame |
| 7,501,293 B2 | 3/2009 | Ito et al. |
| 7,521,715 B2 | 4/2009 | Jang et al. |
| 7,575,966 B2 | 8/2009 | Lai et al. |
| 7,598,520 B2 | 10/2009 | Hirao et al. |
| 7,601,984 B2 | 10/2009 | Sano et al. |
| 7,663,165 B2 | 2/2010 | Mouli |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,074 B2 | 9/2010 | Iwasaki |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 7,977,169 B2 | 7/2011 | Hirao et al. |
| 7,982,250 B2 | 7/2011 | Yamazaki et al. |
| 7,993,964 B2 | 8/2011 | Hirao et al. |
| 7,994,500 B2 | 8/2011 | Kim et al. |
| 8,044,464 B2 | 10/2011 | Yamazaki et al. |
| 8,058,645 B2 | 11/2011 | Jeong et al. |
| 8,084,331 B2 | 12/2011 | Ofuji et al. |
| 8,098,361 B2 | 1/2012 | Takahashi et al. |
| 8,134,156 B2 | 3/2012 | Akimoto |
| 8,143,115 B2 | 3/2012 | Omura et al. |
| 8,148,721 B2 | 4/2012 | Hayashi et al. |
| 8,148,779 B2 | 4/2012 | Jeong et al. |
| 8,154,024 B2 | 4/2012 | Iwasaki |
| 8,158,464 B2 | 4/2012 | Akimoto |
| 8,164,256 B2 | 4/2012 | Sano et al. |
| 8,188,480 B2 | 5/2012 | Itai |
| 8,202,365 B2 | 6/2012 | Umeda et al. |
| 8,203,143 B2 | 6/2012 | Imai |
| 8,212,248 B2 | 7/2012 | Itagaki et al. |
| 8,217,435 B2 | 7/2012 | Chang et al. |
| 8,232,598 B2 | 7/2012 | Yamazaki et al. |
| 8,253,138 B2 | 8/2012 | Yamazaki et al. |
| 8,274,077 B2 | 9/2012 | Akimoto et al. |
| 8,339,828 B2 | 12/2012 | Yamazaki et al. |
| 8,351,012 B2 | 1/2013 | Takahashi et al. |
| 8,368,079 B2 | 2/2013 | Akimoto |
| 8,378,341 B2 | 2/2013 | Hayashi et al. |
| 8,389,417 B2 | 3/2013 | Yamazaki et al. |
| 8,400,817 B2 | 3/2013 | Yamazaki et al. |
| 8,450,783 B2 | 5/2013 | Yamazaki et al. |
| 8,455,868 B2 | 6/2013 | Yamazaki et al. |
| 8,466,463 B2 | 6/2013 | Akimoto et al. |
| 8,482,001 B2 | 7/2013 | Yamazaki et al. |
| 8,502,217 B2 | 8/2013 | Sato et al. |
| 8,525,165 B2 | 9/2013 | Akimoto |
| 8,530,246 B2 | 9/2013 | Ofuji et al. |
| 8,541,944 B2 | 9/2013 | Sano et al. |
| 8,559,220 B2 | 10/2013 | Yamazaki et al. |
| 8,569,812 B2 | 10/2013 | Chang et al. |
| 8,581,309 B2 | 11/2013 | Yamazaki et al. |
| 8,586,979 B2 | 11/2013 | Son et al. |
| 8,610,652 B2 | 12/2013 | Lee et al. |
| 8,629,069 B2 | 1/2014 | Akimoto et al. |
| 8,669,550 B2 | 3/2014 | Akimoto et al. |
| 8,742,412 B2 | 6/2014 | Goyal et al. |
| 9,099,562 B2 | 8/2015 | Akimoto et al. |

(56) References Cited

U.S. PATENT DOCUMENTS

| | | |
|---|---|---|
| 10,304,962 B2 | 5/2019 | Akimoto et al. |
| 2001/0015450 A1 | 8/2001 | Sugibayashi et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199960 A1* | 9/2005 | Hoffman ............. H01L 29/7869 257/368 |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0079034 A1 | 4/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0262483 A1 | 11/2006 | Osame |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063287 A1 | 3/2007 | Sano et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0286907 A1* | 11/2008 | Li ................... H01L 21/02628 438/141 |
| 2008/0296567 A1 | 12/2008 | Irving et al. |
| 2008/0296568 A1 | 12/2008 | Ryu et al. |
| 2008/0308805 A1 | 12/2008 | Akimoto et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0142888 A1 | 6/2009 | Tsuchiya |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0065844 A1 | 3/2010 | Tokunaga |
| 2010/0084649 A1* | 4/2010 | Seo ..................... H01L 29/7869 257/E29.296 |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2010/0149138 A1 | 6/2010 | Lee et al. |
| 2010/0193785 A1 | 8/2010 | Kimura |
| 2010/0203673 A1 | 8/2010 | Hayashi et al. |
| 2010/0219411 A1 | 9/2010 | Hoffman et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0104851 A1 | 5/2011 | Akimoto et al. |
| 2011/0110145 A1 | 5/2011 | Yamazaki et al. |
| 2011/0117697 A1 | 5/2011 | Akimoto et al. |
| 2011/0121290 A1 | 5/2011 | Akimoto et al. |
| 2011/0122673 A1 | 5/2011 | Kamata et al. |
| 2011/0134683 A1 | 6/2011 | Yamazaki et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0161220 A1 | 6/2012 | Yamazaki |
| 2012/0168750 A1 | 7/2012 | Hayashi et al. |
| 2012/0208318 A1 | 8/2012 | Hoffman et al. |
| 2014/0015021 A1 | 1/2014 | Chang et al. |
| 2015/0084048 A1 | 3/2015 | Hayashi et al. |
| 2019/0051759 A1 | 2/2019 | Akimoto et al. |
| 2022/0069137 A1 | 3/2022 | Akimoto et al. |

FOREIGN PATENT DOCUMENTS

| | | |
|---|---|---|
| EP | 0663697 A | 7/1995 |
| EP | 0689086 A | 12/1995 |
| EP | 0923138 A | 6/1999 |
| EP | 1398829 A | 3/2004 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2086013 A | 8/2009 |
| EP | 1727154 B | 5/2010 |
| EP | 2226847 A | 9/2010 |
| EP | 2339639 A | 6/2011 |
| EP | 3249694 A | 11/2017 |
| EP | 3614442 A | 2/2020 |
| JP | 47-016085 A | 8/1972 |
| JP | 51-035243 A | 3/1976 |
| JP | 57-105889 A | 7/1982 |

(56) References Cited

FOREIGN PATENT DOCUMENTS

| | | |
|---|---|---|
| JP | 60-198861 A | 10/1985 |
| JP | 62-230043 A | 10/1987 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-268184 A | 11/1988 |
| JP | 02-021653 A | 1/1990 |
| JP | 02-054572 A | 2/1990 |
| JP | 05-107561 A | 4/1993 |
| JP | 05-119298 A | 5/1993 |
| JP | 05-251705 A | 9/1993 |
| JP | 05-282881 A | 10/1993 |
| JP | 06-012799 B | 2/1994 |
| JP | 06-268174 A | 9/1994 |
| JP | 08-264794 A | 10/1996 |
| JP | 10-093100 A | 4/1998 |
| JP | 11-505377 | 5/1999 |
| JP | 11-233789 A | 8/1999 |
| JP | 2000-044236 A | 2/2000 |
| JP | 2000-114453 A | 4/2000 |
| JP | 2000-150900 A | 5/2000 |
| JP | 3126630 | 1/2001 |
| JP | 2001-053164 A | 2/2001 |
| JP | 2001-093988 A | 4/2001 |
| JP | 3174852 | 6/2001 |
| JP | 2001-230326 A | 8/2001 |
| JP | 2002-076356 A | 3/2002 |
| JP | 2002-216482 A | 8/2002 |
| JP | 2002-289859 A | 10/2002 |
| JP | 2002-319682 A | 10/2002 |
| JP | 2002-359192 A | 12/2002 |
| JP | 2002-368226 A | 12/2002 |
| JP | 2003-086000 A | 3/2003 |
| JP | 2003-086808 A | 3/2003 |
| JP | 2003-101407 A | 4/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2006-294116 A | 10/2006 |
| JP | 2006-352090 A | 12/2006 |
| JP | 2007-096055 A | 4/2007 |
| JP | 2007-103918 A | 4/2007 |
| JP | 2007-108689 A | 4/2007 |
| JP | 2007-122758 A | 5/2007 |
| JP | 2007-189235 A | 7/2007 |
| JP | 2008-004791 A | 1/2008 |
| JP | 2008-141119 A | 6/2008 |
| JP | 2008-146814 A | 6/2008 |
| JP | 2008-160125 A | 7/2008 |
| JP | 2008-277665 A | 11/2008 |
| JP | 2009-021612 A | 1/2009 |
| JP | 2009-033145 A | 2/2009 |
| JP | 2009-076879 A | 4/2009 |
| JP | 2009-094492 A | 4/2009 |
| JP | 2009-099953 A | 5/2009 |
| JP | 2009-105381 A | 5/2009 |
| JP | 2009-134274 A | 6/2009 |
| JP | 2009-135350 A | 6/2009 |
| JP | 2009-135482 A | 6/2009 |
| JP | 2009-152633 A | 7/2009 |
| JP | 2009-164393 A | 7/2009 |
| JP | 2009-167087 A | 7/2009 |
| JP | 2009-182194 A | 8/2009 |
| JP | 2009-528670 | 8/2009 |
| JP | 2009-198990 A | 9/2009 |
| JP | 2009-206508 A | 9/2009 |
| JP | 2009-212443 A | 9/2009 |
| JP | 2009-231613 A | 10/2009 |
| JP | 2009-535819 | 10/2009 |
| JP | 2010-016347 A | 1/2010 |
| JP | 4415062 | 2/2010 |
| JP | 2010-067954 A | 3/2010 |
| JP | 2010-141230 A | 6/2010 |
| JP | 2010-177431 A | 8/2010 |
| JP | 4571221 | 10/2010 |
| JP | 2012-160679 A | 8/2012 |
| KR | 2008-0052107 A | 6/2008 |
| KR | 2008-0053355 A | 6/2008 |
| KR | 2008-0059099 A | 6/2008 |
| KR | 10-0843506 | 7/2008 |
| KR | 2009-0031288 A | 3/2009 |
| KR | 2009-0084642 A | 8/2009 |
| KR | 10-1403629 | 6/2014 |
| TW | 200405409 | 4/2004 |
| TW | 200527657 | 8/2005 |
| TW | 200726310 | 7/2007 |
| TW | 200841475 | 10/2008 |
| TW | 200937613 | 9/2009 |
| TW | 200941724 | 10/2009 |
| TW | 200941729 | 10/2009 |
| WO | WO-2004/114391 | 12/2004 |
| WO | WO-2007/029844 | 3/2007 |
| WO | WO-2007/058329 | 5/2007 |
| WO | WO-2007/094501 | 8/2007 |
| WO | WO-2007/142167 | 12/2007 |
| WO | WO-2008/027392 | 3/2008 |
| WO | WO-2008/069056 | 6/2008 |
| WO | WO-2008/069255 | 6/2008 |
| WO | WO-2008/069286 | 6/2008 |
| WO | WO-2008/133345 | 11/2008 |
| WO | WO-2009/041713 | 4/2009 |
| WO | WO-2009/060922 | 5/2009 |
| WO | WO-2009/072532 | 6/2009 |
| WO | WO-2009/087943 | 7/2009 |
| WO | WO-2009/093625 | 7/2009 |
| WO | WO-2009/096608 | 8/2009 |
| WO | WO-2009/110623 | 9/2009 |
| WO | WO-2011/052396 | 5/2011 |

OTHER PUBLICATIONS

International Search Report (Application No. PCT/JP2010/068103) dated Dec. 28, 2010.

Written Opinion (Application No. PCT/JP2010/068103) dated Dec. 28, 2010.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,Or Zn] At Temperatures Over 1000°", Journal of Solid State Chemistry, 1985, vol. 60, pp. 382-384.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW'02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated By TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven By Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With Driver Circuit Using Amorphous In—Ga—Zn-Oxide TFTs", IDW'09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21,2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven By the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Kim.W et al., "An Experimental High-Density DRAM Cell with a Built-in Gain Stage", IEEE Journal of Solid-State Circuits, Aug. 1, 1994, vol. 29, No. 8, pp. 978-981.
Shukuri.S et al., "A Complementary Gain Cell Technology for sub-1 V Supply DRAMs", IEDM 92: Technical Digest of International Electron Devices Meeting, Dec. 13, 1992, pp. 1006-1008.
Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.
Kim.M et al., "High mobility bottom gate InGaZnO thin film transistors with SiOx etch stopper", Appl. Phys. Lett. (Applied Physics Letters), May 24, 2007, vol. 90, No. 21, p. 212114-1-212114-3.
Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Korean Office Action (Application No. 2012-7014969) dated Aug. 28, 2013.
Kameshiro.N et al., "A Fully Logic-Process-Compatible, 3-Transistor, SESO-memory Cell Featuring 0.1-FIT/Mb Soft Error, 100-MHz Random Cycle, and 100-ms Retention", 2008 Symposium on VLSI Circuits Digest of Technical Papers, Aug. 1, 2008, pp. 122-123.
Chinese Office Action (Application No. 201080049673.6) dated Mar. 31, 2014.
Hosono.H et al., "Achievement of High-Performance Transparent Transistor"—Using Transparent Oxide Semiconductor: InGaO3(ZnO)5 Film-, Japan Science and Technology Corporation Report, May 23, 2003, vol. 320, Japan Science and Technology Corporation.
Chinese Office Action (Application No. 201080049673.6) dated Dec. 3, 2014.
Korean Office Action (Application No. 2014-7011674) dated Apr. 13, 2015.
European Search Report (Application No. 10826530.7) dated Apr. 11, 2016.
Korean Office Action (Application No. 2014-7011674) dated Apr. 14, 2016.
Taiwanese Office Action (Application No. 104140138) dated Nov. 4, 2016.
Korean Office Action (Application No. 2012-7013714) dated Mar. 3, 2017.
Korean Office Action (Application No. 2017-7009832) dated May 20, 2017.
Taiwanese Office Action (Application No. 106114990) dated Mar. 23, 2018.
Chinese Office Action (Application No. 201610081971.2) dated Apr. 4, 2018.
Chinese Office Action (Application No. 201610082458.5) dated Apr. 4, 2018.
Godo.H et al., "Temperature Dependence of Transistor Characteristics and Electronic Structure for Amorphous In—Ga—Zn-Oxide Thin Film Transistor", Jpn. J. Appl. Phys. (Japanese Journal of Applied Physics), Mar. 1, 2010, vol. 49, No. 3, pp. 03CB04-1-03CB04-6.
Yin.H et al., "Program/Erase Characteristics of Amorphous Gallium Indium Zinc Oxide Nonvolatile Memory", IEEE Transactions On Electron Devices, Aug. 1, 2008, vol. 55, No. 8, pp. 2071-2077.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.
Taiwanese Office Action (Application No. 108142733) dated Sep. 14, 2020.

\* cited by examiner

SEMICONDUCTOR DEVICE

CROSS-REFERENCE TO RELATED APPLICATIONS

This application is a continuation of U.S. application Ser. No. 12/913,464, filed Oct. 27, 2010, now allowed, which claims the benefit of foreign priority applications filed in Japan as Serial No. 2009-249330 on Oct. 29, 2009, and Serial No. 2010-012619 on Jan. 22, 2010, all of which are incorporated by reference.

TECHNICAL FIELD

The invention disclosed herein relates to a semiconductor device using a semiconductor element and a method for manufacturing the semiconductor device.

BACKGROUND ART

Memory devices using semiconductor elements are broadly classified into two categories: a volatile device that loses stored data when power supply stops, and a non-volatile device that retains stored data even when power is not supplied.

A typical example of a volatile memory device is a DRAM (dynamic random access memory). A DRAM stores data in such a manner that a transistor included in a memory element is selected and charge is stored in a capacitor.

When data is read from a DRAM, charge in a capacitor is lost on the above-described principle; thus, another writing operation is necessary whenever data is read out. Moreover, a transistor included in a memory element has a leakage current and charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, an additional memory device using a magnetic material or an optical material is needed in order to hold the data for a long time.

Another example of a volatile memory device is an SRAM (static random access memory). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding charge in the floating gate. Therefore, a flash memory has advantages in that the data holding time is extremely long (almost permanent) and refresh operation which is necessary in a volatile memory device is not needed (e.g., see Patent Document 1).

However, a gate insulating layer included in a memory element deteriorates by tunneling current which flows in writing, so that the memory element stops its function after a numerous number of writing operations. In order to avoid this problem, a method in which the number of writing operations for memory elements is equalized is employed, for example. However, complicated supplemental circuits are additionally needed to realize this method. Moreover, employing such a method does not solve the fundamental problem of lifetime. In other words, a flash memory is not suitable for applications in which data is frequently rewritten.

In addition, high voltage is necessary for injecting charge to the floating gate or removing the charge. Further, it takes a relatively long time to injector remove charge, and it is not easy to perform writing and erasing at higher speed.

REFERENCE

Patent Document 1: Japanese Published Patent Application No. S57-105889

DISCLOSURE OF INVENTION

In view of the foregoing problems, an object of one embodiment of the invention disclosed herein is to provide a semiconductor device with a novel structure where stored data can be held even when power is not supplied and where there is no limitation on the number of times of writing.

One embodiment of the present invention is a semiconductor device having a layered structure of a transistor formed using an oxide semiconductor and a transistor formed using a material other than the oxide semiconductor. The following structures can be employed, for example.

An embodiment of the present invention is a semiconductor device including a first line (source line); a second line (bit line); a third line (first signal line); a fourth line (second signal line); a first transistor having a first gate electrode, a first source electrode, and a first drain electrode; and a second transistor having a second gate electrode, a second source electrode, and a second drain electrode. The first transistor is provided over a substrate including a semiconductor material. The second transistor includes an oxide semiconductor layer. The first gate electrode and one of the second source electrode and the second drain electrode are electrically connected to each other. The first line (source line) and the first source electrode are electrically connected to each other. The second line (bit line) and the first drain electrode are electrically connected to each other. The third line (first signal line) and the other of the second source electrode and the second drain electrode are electrically connected to each other. The fourth line (second signal line) and the second gate electrode are electrically connected to each other.

In the above structure, the first transistor includes a channel formation region provided over the substrate including the semiconductor material; impurity regions provided so as to sandwich the channel formation region; a first gate insulating layer over the channel formation region; the first gate electrode over the first gate insulating layer; and the first source electrode and the first drain electrode electrically connected to the impurity regions.

In the above structure, the second transistor includes the second gate electrode over the substrate including the semiconductor material; a second gate insulating layer over the second gate electrode; an oxide semiconductor layer over the second gate insulating layer; and the second source electrode and the second drain electrode electrically connected to the oxide semiconductor layer.

In the above structure, the substrate including the semiconductor material is preferably a single crystal semiconductor substrate or an SOI substrate. In particular, the semiconductor material is preferably silicon.

In the above structure, the oxide semiconductor layer preferably includes an In—Ga—Zn—O-based oxide semiconductor material. In particular, the oxide semiconductor layer preferably includes a crystal of $In_2Ga_2ZnO_7$. Further, the hydrogen concentration of the oxide semiconductor layer is preferably $5 \times 10^{19}$ atoms/cm$^3$ or less. The off current of the second transistor is preferably $1 \times 10^{-13}$ A or less, more preferably $1 \times 10^{-20}$ A or less.

In the above structure, the second transistor can be provided in a region overlapping with the first transistor.

Note that in this specification, the term such as "over" or "below" does not necessarily mean that a component is placed "directly on" or "directly under" another component. For example, the expression "a first gate electrode over a gate insulating layer" does not exclude the case where a component is placed between the gate insulating layer and the gate electrode. Moreover, the terms such as "over" and "below" are only used for convenience of description and can include the case where the positional relation of components is reversed, unless otherwise specified.

In addition, in this specification, the term such as "electrode" or "line" does not limit a function of a component. For example, an "electrode" is sometimes used as part of a "line", and vice versa. Furthermore, the term "electrode" or "line" can include the case where a plurality of "electrodes" or "lines" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a line.

In general, the term □SOI substrate□ means a substrate where a silicon semiconductor layer is provided on an insulating surface. In this specification, the term □SOI substrate□ also includes a substrate where a semiconductor layer formed using a material other than silicon is provided over an insulating surface in its category. That is, a semiconductor layer included in the □SOI substrate□ is not limited to a silicon semiconductor layer. A substrate in the "SOI substrate" is not limited to a semiconductor substrate such as a silicon wafer and can be a non-semiconductor substrate such as a glass substrate, a quartz substrate, a sapphire substrate, or a metal substrate. In other words, the □SOI substrate□ also includes a conductive substrate having an insulating surface or an insulating substrate provided with a layer formed of a semiconductor material in its category. In addition, in this specification, the term "semiconductor substrate" means not only a substrate formed using only a semiconductor material but also all substrates including a semiconductor material. That is, in this specification, the "SOI substrate" is also included in the category of the "semiconductor substrate".

One embodiment of the present invention provides a semiconductor device in which a transistor including a material other than an oxide semiconductor is placed in a lower portion and a transistor including an oxide semiconductor is placed in an upper portion.

Since the off current of a transistor including an oxide semiconductor is extremely low, stored data can be retained for an extremely long time by using the transistor. In other words, power consumption can be considerably reduced because refresh operation becomes unnecessary or the frequency of refresh operation can be extremely low. Moreover, stored data can be retained for a long time even when power is not supplied.

Further, high voltage is not needed to write data, and deterioration of the element is negligible. Furthermore, data is written by switching between the on state and the off state of the transistor, whereby high-speed operation can be easily realized. In addition, since data can be rewritten by controlling a potential input to the transistor, there is no need of operation for erasing data, which is another merit.

Since a transistor including a material other than an oxide semiconductor can operate at higher speed than a transistor including an oxide semiconductor, stored data can be read out at high speed by using the transistor.

A semiconductor device with a novel feature can be realized by including both the transistor including a material other than an oxide semiconductor and the transistor including an oxide semiconductor.

BEST MODE FOR CARRYING OUT THE INVENTION

Figure 1:
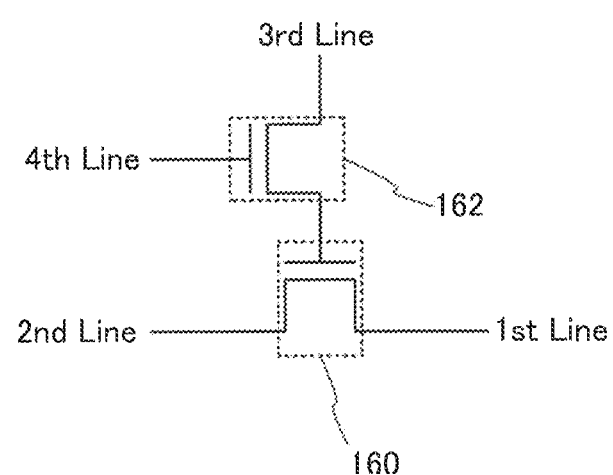
FIG. 1 is a circuit diagram of a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings is not accurately represented in some cases for easy understanding. Therefore, embodiments of the present invention are not necessarily limited to such a position, size, range, or the like disclosed in the drawings.

In this specification, ordinal numbers such as "first", "second", and "third" are used in order to avoid confusion among components, and the terms do not mean limitation of the number of components.

Embodiment 1

In this embodiment, a structure and a manufacturing method of a semiconductor device according to one embodiment of the invention disclosed herein will be described with reference to FIG. 1, FIGS. 2A and 2B, FIGS. 3A to 3H, FIGS. 4A to 4G, FIGS. 5A to 5D, FIG. 6, FIGS. 7A and 7B, FIGS. 8A and 8B, and FIGS. 9A and 9B.

<Circuit Configuration of Semiconductor Device>

FIG. 1 illustrates an example of a circuit configuration of a semiconductor device. The semiconductor device includes a transistor 160 formed using a material other than an oxide semiconductor (e.g., silicon), and a transistor 162 formed using an oxide semiconductor. Note that the semiconductor device illustrated in FIG. 1 is called a memory cell in some cases in the following description.

Here, a gate electrode of the transistor 160 is electrically connected to one of a source electrode and a drain electrode of the transistor 162. A first line (also referred to as a source line SL) is electrically connected to a source electrode of the transistor 160. A second line (also referred to as a bit line BL) is electrically connected to a drain electrode of the transistor 160. A third line (also referred to as a first signal line) is electrically connected to the other of the source electrode and the drain electrode of the transistor 162. A fourth line (also referred to as a second signal line) is electrically connected to a gate electrode of the transistor 162.

Since the transistor 160 including a material other than an oxide semiconductor can operate at higher speed than a transistor including an oxide semiconductor, stored data can be read out at high speed by using the transistor 160. Moreover, the transistor 162 including an oxide semiconductor has extremely low off current. For those reasons, a potential of the gate electrode of the transistor 160 can be held for an extremely long time by turning off the transistor 162. In addition, in the transistor 162 including an oxide semiconductor, a short channel effect does not occur, which is another merit.

Writing, holding, and reading of data can be performed in the following manner, using the advantage that the potential of the gate electrode can be held.

Firstly, writing and holding of data will be described. First, a potential of the fourth line is set to a potential at which the transistor 162 is turned on, and the transistor 162 is turned on. Thus, a potential of the third line is supplied to the gate electrode of the transistor 160 (writing). After that, the potential of the fourth line is set to a potential at which the transistor 162 is turned off, and the transistor 162 is turned off, whereby the potential of the gate electrode of the transistor 160 is held (holding).

Since the off current of the transistor 162 is extremely low, the potential of the gate electrode of the transistor 160 is held for a long time. For example, when the potential of the gate electrode of the transistor 160 is a potential at which the transistor 160 is turned on, the on state of the transistor 160 is kept for a long time. Moreover, when the potential of the gate electrode of the transistor 160 is a potential at which the transistor 160 is turned off, the off state of the transistor 160 is kept for a long time.

Secondly, reading of data will be described. When a predetermined potential (a low potential) is supplied to the first line in a state where the on state or the off state of the transistor 160 is kept as described above, a potential of the second line varies depending on the on state or the off state of the transistor 160. For example, when the transistor 160 is on, the potential of the second line becomes lower under the influence of the potential of the first line. In contrast, when the transistor 160 is off, the potential of the second line is not changed.

In such a manner, the potential of the second line and a predetermined potential are compared with each other in a state where data is held, whereby the data can be read out.

Thirdly, rewriting of data will be described. Rewriting of data is performed in a manner similar to that of the writing and holding of data. That is, the potential of the fourth line is set to a potential at which the transistor 162 is turned on, and the transistor 162 is turned on. Thus, a potential of the third line (a potential for new data) is supplied to the gate electrode of the transistor 160. After that, the potential of the fourth line is set to a potential at which the transistor 162 is turned off, and the transistor 162 is turned off, whereby the new data is stored.

In the semiconductor device according to the invention disclosed herein, data can be directly rewritten by another writing of data as described above. For that reason, erasing operation which is necessary for a flash memory or the like is not needed, so that a reduction in operation speed caused by the erasing operation can be prevented. In other words, high-speed operation of the semiconductor device can be realized.

Since an off current of the transistor 162 for writing, which includes an oxide semiconductor, is extremely small, the potential of the gate electrode of the transistor 160 is held for a long time. Therefore, for example, refresh operation needed for a conventional DRAM can be unnecessary, or the frequency of refresh operation can be significantly low (e.g., about once a month or a year). Thus, the semiconductor device according to the disclosed invention substantially has a feature of a nonvolatile memory device.

Further, in the semiconductor device of the disclosed invention, data is not lost when data is read unlike in a conventional DRAM; thus, rewriting of data is not necessary in every reading operation. As described above, the frequency of data writing can be significantly reduced as compared to a DRAM, which enables a sufficient reduction in power consumption.

Further, as for the semiconductor device according to the disclosed invention, data can be directly rewritten by overwriting of new data to the semiconductor device. Therefore, erasing operation which is necessary for a flash memory or the like is not needed, and reduction in operation speed, which is attributed to erasing operation, can be suppressed. In other words, high-speed operation of the semiconductor device can be realized. Moreover, a high voltage necessary for a conventional floating gate transistor to write and erase data is unnecessary; thus, power consumption of the semiconductor device can be further reduced.

The semiconductor device according to the disclosed invention may include at least a writing transistor and a reading transistor; therefore, the area of each memory cell can be sufficiently small as compared to an SRAM or the like which requires six transistors in each memory cell. In other words, such semiconductor devices can be arranged at high density.

In a conventional floating gate transistor, charge travels in a gate insulating film (tunnel insulating film) during writing operation, so that deterioration of the gate insulating film (tunnel insulating film) cannot be avoided. In contrast, in the memory cell according to an embodiment of the present invention, data is written by switching operation of a writing transistor; therefore, the deterioration of a gate insulating film, which has been traditionally recognized as a problem, can be neglected. This means that there is no limit on the number of times of writing in principle and writing durability is very high. For example, the current-voltage characteristics are not degraded even after data is written $1 \times 10^9$ or more times (one billion or more times).

Note that the field effect mobility of the transistor 162 for writing, which includes an oxide semiconductor, is 3 cm$^2$/Vs to 250 cm$^2$/Vs inclusive, preferably 5 cm$^2$/Vs to 200 cm$^2$/Vs inclusive, more preferably 10 cm$^2$/Vs to 150 cm$^2$/Vs inclusive, in an on state. Further, the subthreshold swing (S value) of the transistor including an oxide semiconductor is set to 0.1 V/dec. or less. With the use of such a transistor, time needed for data writing can be short enough.

The channel length L of the transistor 162 for writing, which includes an oxide semiconductor, is preferably 10 nm to 400 nm inclusive. With such a channel size, various effects such as high-speed operation, low power consumption, and high integration of the transistor can be obtained.

Note that a transistor including crystalline silicon is preferably used for the transistor 160 for reading. In particular, in terms of increasing speed of reading operation, an n-channel transistor including single crystal silicon is preferably used. Such a single crystal silicon transistor can be formed using, for example, bulk silicon (a so-called silicon wafer).

Note that an n-channel transistor is used in the above description; it is needless to say that a p-channel transistor can be used instead of the n-channel transistor.

<Planar Structure and Cross-Sectional Structure of Semiconductor Device>

Figure 2A:
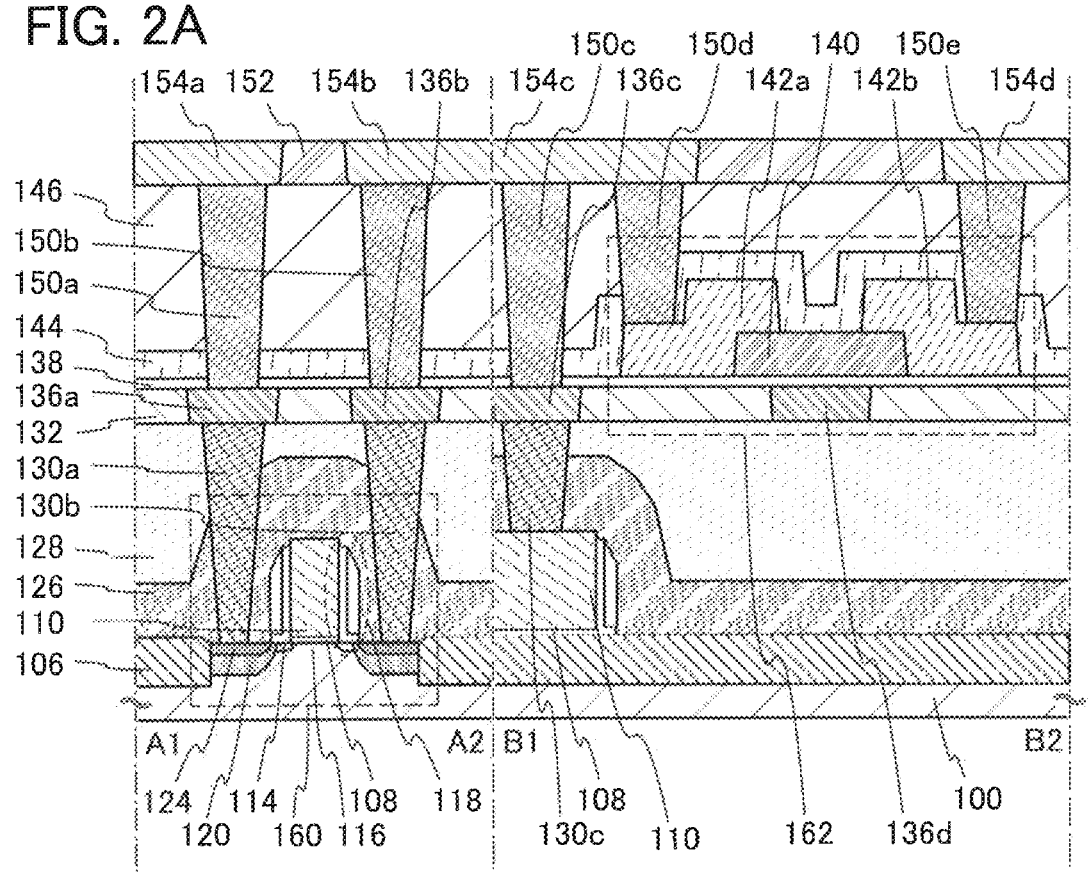
FIGS. 2A and 2B are a cross-sectional view and a plan view for illustrating a semiconductor device.
Figure 2B:
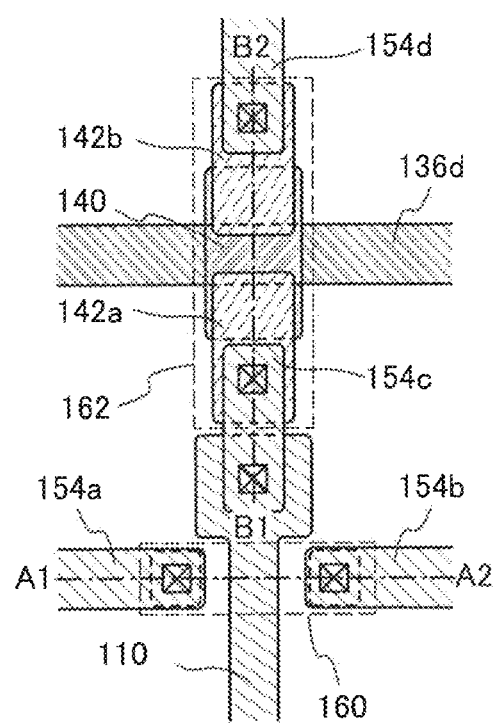

FIGS. 2A and 2B illustrate an example of a structure of the semiconductor device. FIG. 2A illustrates a cross section of the semiconductor device, and FIG. 2B illustrates a plan view of the semiconductor device. Here, FIG. 2A corresponds to a cross section along line A1-A2 and line B1-B2 in FIG. 2B. The semiconductor device illustrated in FIGS. 2A and 2B includes the transistor 160 including a material other than an oxide semiconductor in a lower portion, and the transistor 162 including an oxide semiconductor in an upper portion. Note that the transistors 160 and 162 are n-channel transistors here; alternatively, a p-channel transistor may be used. In particular, it is easy to use a p-channel transistor as the transistor 160.

The transistor 160 includes a channel formation region 116 provided in a substrate 100 including a semiconductor material, impurity regions 114 and high-concentration impurity regions 120 (these regions can be collectively referred to simply as impurity regions) provided so as to sandwich the channel formation region 116, a gate insulating layer 108 provided over the channel formation region 116, a gate electrode 110 provided over the gate insulating layer 108, and a source electrode or drain electrode (hereinafter referred to as a source/drain electrode) 130a and a source/drain electrode 130b electrically connected to the impurity regions 114.

A sidewall insulating layer 118 is provided on a side surface of the gate electrode 110. The high-concentration impurity region 120 is placed in a region of the substrate 100 that does not overlap with the sidewall insulating layer 118 as shown in the cross-sectional view. A metal compound region 124 is placed over the high-concentration impurity region 120. An element isolation insulating layer 106 is provided over the substrate 100 so as to surround the transistor 160. An interlayer insulating layer 126 and an interlayer insulating layer 128 are provided so as to cover the transistor 160. Each of the source/drain electrode 130a and the source/drain electrode 130b is electrically connected to the metal compound region 124 through an opening formed in the interlayer insulating layers 126 and 128. That is, each of the source/drain electrodes 130a and 130b is electrically connected to the high-concentration impurity region 120 and the impurity region 114 through the metal compound region 124. An electrode 130c that is formed in a manner similar to that of the source/drain electrodes 130a and 130b is electrically connected to the gate electrode 110.

The transistor 162 includes a gate electrode 136d provided over the interlayer insulating layer 128, a gate insulating layer 138 provided over the gate electrode 136d, an oxide semiconductor layer 140 provided over the gate insulating layer 138, and a source/drain electrode 142a and a source/drain electrode 142b that are provided over the oxide semiconductor layer 140 and electrically connected to the oxide semiconductor layer 140.

Here, the gate electrode 136d is provided so as to be embedded in an insulating layer 132 formed over the interlayer insulating layer 128. Like the gate electrode 136d, an electrode 136a, an electrode 136b, and an electrode 136c are formed in contact with the source/drain electrode 130a, the source/drain electrode 130b, and the electrode 130c, respectively.

A protective insulating layer 144 is provided over the transistor 162 so as to be in contact with part of the oxide semiconductor layer 140. An interlayer insulating layer 146 is provided over the protective insulating layer 144. Openings that reach the source/drain electrode 142a and the source/drain electrode 142b are formed in the protective insulating layer 144 and the interlayer insulating layer 146. An electrode 150d and an electrode 150e are formed in contact with the source/drain electrode 142a and the source/drain electrode 142b, respectively, through the respective openings. Like the electrodes 150d and 150e, an electrode 150a, an electrode 150b, and an electrode 150c are formed in contact with the electrode 136a, the electrode 136b, and the electrode 136c, respectively, through openings provided in the gate insulating layer 138, the protective insulating layer 144, and the interlayer insulating layer 146.

Here, the oxide semiconductor layer 140 is preferably a highly purified oxide semiconductor layer from which impurities such as hydrogen are sufficiently removed. Specifically, the concentration of hydrogen in the oxide semiconductor layer 140 is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Such an extremely low hydrogen concentration leads to a sufficiently low carrier concentration (e.g., less than $1 \times 10^{12}$/cm$^3$, or less than $1.45 \times 10^{10}$/cm$^3$) as compared to a general silicon wafer (a silicon wafer to which an impurity such as a slight amount of phosphorus or boron is added) having a carrier concentration of approximately $1 \times 10^{14}$/cm$^3$. The transistor 162 with significantly excellent off current characteristics can be obtained with the use of such an oxide semiconductor that is highly purified by a sufficient reduction in hydrogen concentration and becomes intrinsic (i-type) or substantially intrinsic (i-type). For example, the off current (per unit channel width (1 μm), here) of the transistor 162 at room temperature (25° C.) is 10 zA/μm (1 zA (zeptoampere) is $1 \times 10^{-21}$ A) or less, preferably 1 zA/μm or less. The off current of the transistor 162 at 85° C. is 100 zA/μm ($1 \times 10^{-19}$ A/μm) or less, preferably 10 zA/μm ($1 \times 10^{-20}$ A/μm) or less. The oxide semiconductor layer 140 which is made to be intrinsic or substantially intrinsic by a sufficient reduction in hydrogen concentration is used so that the off current of the transistor 162 is reduced, whereby a semiconductor device with a novel structure can be realized. Note that the concentration of hydrogen in the oxide semiconductor layer 140 is measured by secondary ion mass spectrometry (SIMS).

An insulating layer 152 is provided over the interlayer insulating layer 146. An electrode 154a, an electrode 154b, an electrode 154c, and an electrode 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

That is, in the semiconductor device illustrated in FIGS. 2A and 2B, the gate electrode 110 of the transistor 160 and the source/drain electrode 142a of the transistor 162 are electrically connected through the electrodes 130c, 136c, 150c, 154c, and 150d.

<Method for Manufacturing Semiconductor Device>

Next, an example of a method for manufacturing the semiconductor device will be described. First, a method for manufacturing the transistor 160 in the lower portion will be described below with reference to FIGS. 3A to 3H, and then a method for manufacturing the transistor 162 in the upper portion will be described with reference to FIGS. 4A to 4G and FIGS. 5A to 5D.

<Method for Manufacturing Lower Transistor>

Figure 3A:
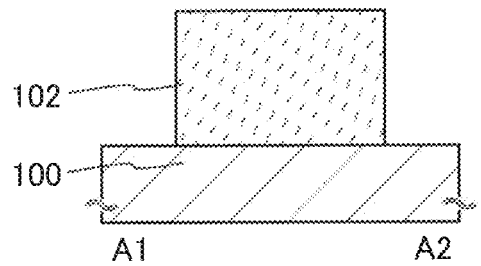
FIGS. 3A to 3H are cross-sectional views illustrating steps for manufacturing a semiconductor device.
Figure 3E:
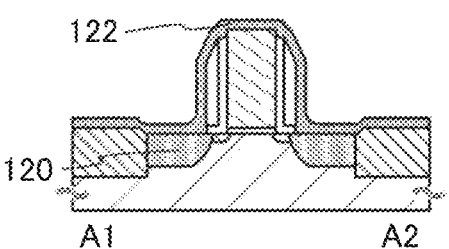

First, the substrate 100 including a semiconductor material is prepared (see FIG. 3A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described.

A protective layer 102 serving as a mask for forming an element isolation insulating layer is formed over the substrate 100 (see FIG. 3A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of the transistor. When the semiconductor material included in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 3B). As the etching, dry etching is preferably performed, but wet etching may be performed. An etching gas and an etchant can be selected as appropriate depending on a material of a layer to be etched.

Figure 3B:
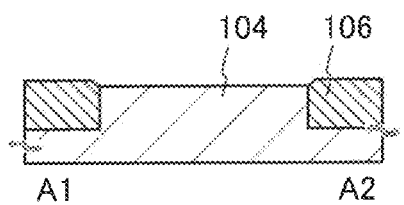
Figure 3F:
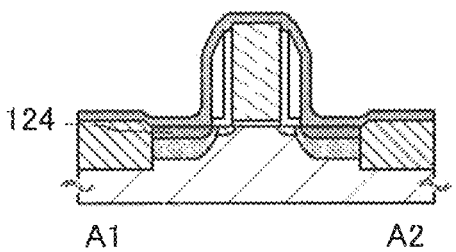

Then, an insulating layer is formed so as to cover the semiconductor region 104, and the insulating layer in a region overlapping with the semiconductor region 104 is selectively removed, so that element isolation insulating layers 106 are formed (see FIG. 3B). The insulating layer is formed using silicon oxide, silicon nitride, silicon nitride oxide, or the like. As a method for removing the insulating layer, any of etching treatment and polishing treatment such as CMP can be employed. Note that the protective layer 102 is removed after the formation of the semiconductor region 104 or after the formation of the element isolation insulating layers 106.

Next, an insulating layer is formed over the semiconductor region 104, and a layer including a conductive material is formed over the insulating layer.

Because the insulating layer serves as a gate insulating layer later, the insulating layer preferably has a single-layer structure or a layered structure using a film containing silicon oxide, silicon nitride oxide, silicon nitride, hafnium oxide, aluminum oxide, tantalum oxide, or the like formed by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer; the insulating layer can have a thickness of 1 nm to 100 nm inclusive, for example.

The layer including a conductive material can be formed using a metal material such as aluminum, copper, titanium, tantalum, or tungsten. The layer including a conductive material may be formed using a semiconductor material such as polycrystalline silicon containing a conductive material. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

Figure 3C:
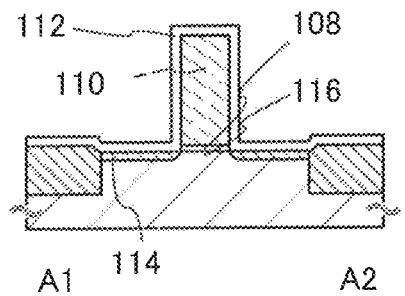

After that, the insulating layer and the layer including a conductive material are selectively etched, so that the gate insulating layer 108 and the gate electrode 110 are formed (see FIG. 3C).

Next, an insulating layer 112 that covers the gate electrode 110 is formed (see FIG. 3C). Then, the impurity regions 114 with a shallow junction depth with the substrate 100 are formed by adding phosphorus (P), arsenic (As), or the like to the semiconductor region 104 (see FIG. 3C). Note that phosphorus or arsenic is added here in order to form an n-channel transistor; an impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 3C). Here, the concentration of the impurity added can be set as appropriate; the concentration is preferably increased when the size of a semiconductor element is extremely decreased. The step in which the impurity regions 114 are formed after the formation of the insulating layer 112 is employed here; alternatively, the insulating layer 112 may be formed after the formation of the impurity regions 114.

Figure 3G:
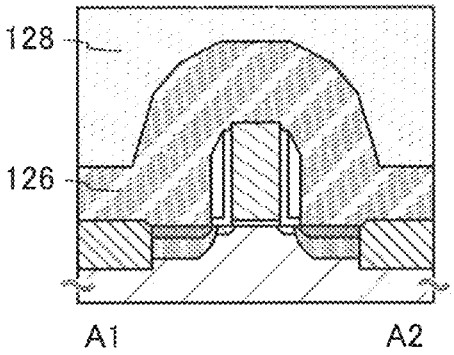
Figure 3D:
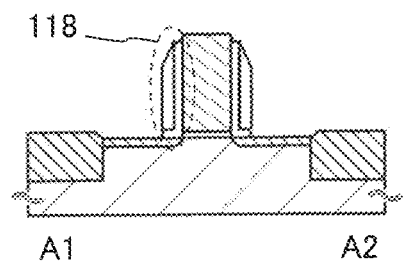

Next, the sidewall insulating layers 118 are formed (see FIG. 3D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed.

Then, an insulating layer is formed so as to cover the gate electrode 110, the impurity regions 114, the sidewall insulating layers 118, and the like. Next, phosphorus (P), arsenic (As), or the like is added to regions where the insulating layer is in contact with the impurity regions 114, so that the high-concentration impurity regions 120 are formed (see FIG. 3E). After that, the insulating layer is removed, and a metal layer 122 is formed so as to cover the gate electrode 110, the sidewall insulating layers 118, the high-concentration impurity regions 120, and the like (see FIG. 3E). A variety of film formation methods such as a vacuum evaporation method, a sputtering method, or a spin coating method can be employed for forming the metal layer 122. The metal layer 122 is preferably formed using a metal material that reacts with a semiconductor material included in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 3F). Note that when the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Then, the interlayer insulating layer 126 and the interlayer insulating layer 128 are formed so as to cover the components formed in the above steps (see FIG. 3G). The interlayer insulating layers 126 and 128 can be formed using a material including an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as a polyimide or an acrylic resin. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 3H:
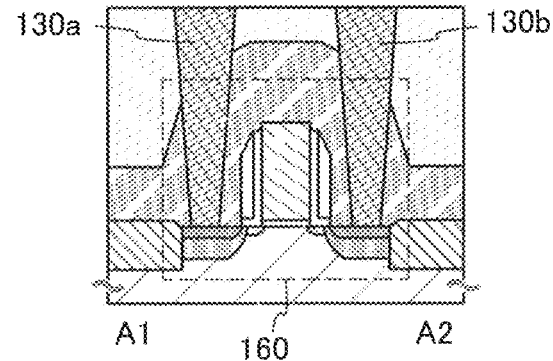

Then, openings that reach the metal compound regions 124 are formed in the interlayer insulating layers 126 and 128, and the source/drain electrode 130a and the source/drain electrode 130b are formed in the openings (see FIG. 3H). The source/drain electrodes 130a and 130b can be formed in such a manner, for example, that a conductive layer is formed in a region including the openings by a PVD method, a CVD method, or the like and then part of the conductive layer is removed by etching, CMP, or the like.

Note that in the case where the source/drain electrodes 130a and 130b are formed by removing part of the conductive layer, the process is preferably performed so that the surfaces are planarized. For example, when a thin titanium film or a thin titanium nitride film is formed in a region including the openings and then a tungsten film is formed so as to be embedded in the openings, excess tungsten, titanium, titanium nitride, or the like can be removed and the planarity of the surface can be improved by subsequent CMP. The surface including the source/drain electrodes 130a and 130b is planarized in such a manner, so that an electrode, a wiring, an insulating layer, a semiconductor layer, and the like can be favorably formed in later steps.

Note that only the source/drain electrodes 130a and 130b in contact with the metal compound regions 124 are shown here; however, an electrode that is in contact with the gate electrode 110 (e.g., the electrode 130c in FIG. 2A) and the like can also be formed in this step. There is no particular limitation on a material used for the source/drain electrodes 130a and 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 including a semiconductor material is formed. Note that an electrode, a wiring, an insulating layer, or the like may be further formed after the above step. When the wirings have a multi-layer structure including a layered structure of an interlayer insulating layer and a conductive layer, a highly integrated semiconductor device can be provided.

<Method for Manufacturing Upper Transistor>

Next, steps for manufacturing the transistor 162 over the interlayer insulating layer 128 will be described with reference to FIGS. 4A to 4G and FIGS. 5A to 5D. Note that FIGS. 4A to 4G and FIGS. 5A to 5D illustrate steps for manufacturing electrodes, the transistor 162, and the like over the interlayer insulating layer 128; therefore, the transistor 160 and the like placed below the transistor 162 are omitted.

Figure 4A:
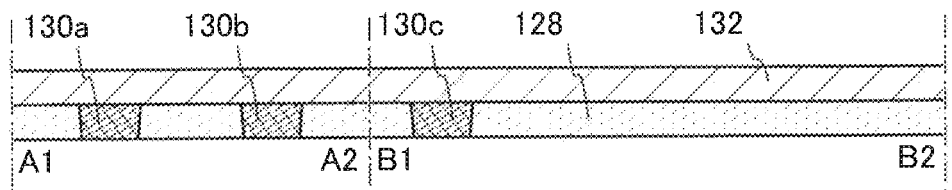
FIGS. 4A to 4G are cross-sectional views illustrating steps for manufacturing a semiconductor device.
Figure 4B:
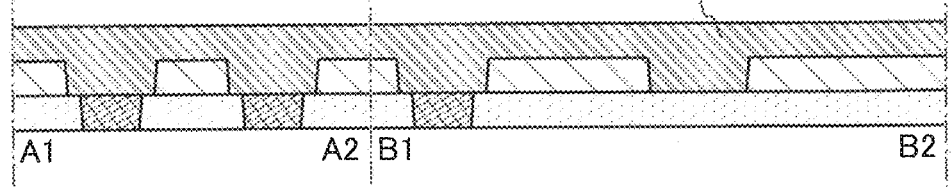

First, the insulating layer 132 is formed over the interlayer insulating layer 128, the source/drain electrodes 130a and 130b, and the electrode 130c (see FIG. 4A). The insulating layer 132 can be formed by a PVD method, a CVD method, or the like. The insulating layer 132 can be formed using a material including an inorganic insulating material such as silicon oxide, silicon nitride oxide, silicon nitride, hafnium oxide, aluminum oxide, or tantalum oxide.

Next, openings that reach the source/drain electrodes 130a and 130b and the electrode 130c are formed in the insulating layer 132. At this time, an opening is also formed in a region where the gate electrode 136d is to be formed later. Then, a conductive layer 134 is formed so as to be embedded in the openings (see FIG. 4B). The openings can be formed by a method such as etching using a mask. The mask can be formed by a method such as light exposure using a photomask. Either wet etching or dry etching may be used as the etching; dry etching is preferably used in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film formed on the surface of lower electrodes (here, the source/drain electrodes 130a and 130b, the electrode 130c, and the like) to decrease the contact resistance with the lower electrodes. The titanium nitride film formed after the formation of the titanium film has a barrier function of preventing diffusion of the conductive material. A copper film may be formed by a plating method after the formation of the barrier film of titanium, titanium nitride, or the like.

Figure 4C:
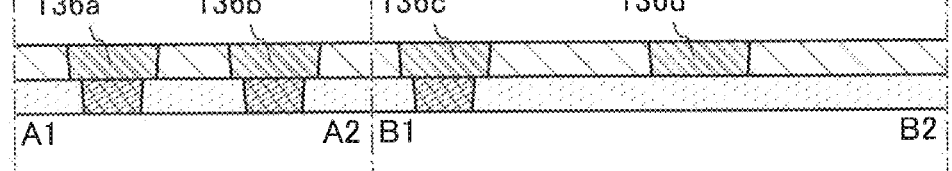

After the conductive layer 134 is formed, part of the conductive layer 134 is removed by etching, CMP, or the like, so that the insulating layer 132 is exposed and the electrodes 136a, 136b, and 136c and the gate electrode 136d are formed (see FIG. 4C). Note that when the electrodes 136a, 136b, and 136c and the gate electrode 136d are formed by removing part of the conductive layer 134, the process is preferably performed so that the surfaces are planarized. The surfaces of the insulating layer 132, the electrodes 136a, 136b, and 136c, and the gate electrode 136d are planarized in such a manner, whereby an electrode, a wiring, an insulating layer, a semiconductor layer, and the like can be favorably formed in later steps.

Figure 4D:
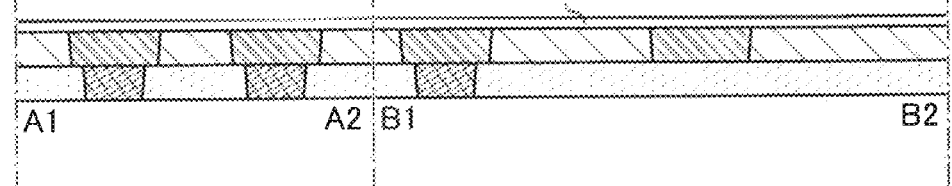

Next, the gate insulating layer 138 is formed so as to cover the insulating layer 132, the electrodes 136a, 136b, and 136c, and the gate electrode 136d (see FIG. 4D). The gate insulating layer 138 can be formed by a CVD method, a sputtering method, or the like. The gate insulating layer 138 is preferably formed using silicon oxide, silicon nitride, silicon oxynitride, silicon nitride oxide, aluminum oxide, hafnium oxide, tantalum oxide, or the like. Note that the gate insulating layer 138 may have a single-layer structure or a layered structure. For example, the gate insulating layer 138 made of silicon oxynitride can be formed by a plasma CVD method using silane ($SiH_4$), oxygen, and nitrogen as a source gas. There is no particular limitation on the thickness of the gate insulating layer 138; the gate insulating layer 138 can have a thickness of 10 nm to 500 nm inclusive, for example. In the case of employing a layered structure, for example, the gate insulating layer 138 is preferably a stack of a first gate insulating layer having a thickness of 50 nm to 200 nm inclusive, and a second gate insulating layer with a thickness of 5 nm to 300 nm inclusive over the first gate insulating layer.

Note that an oxide semiconductor that becomes intrinsic or substantially intrinsic by removal of impurities (a highly purified oxide semiconductor) is quite susceptible to the interface level and the interface charge; therefore, when such an oxide semiconductor is used for an oxide semiconductor layer, the interface with the gate insulating layer is important. In other words, the gate insulating layer 138 that is to be in contact with a highly purified oxide semiconductor layer needs to have high quality.

For example, the gate insulating layer 138 is preferably formed by a high-density plasma CVD method using a microwave (2.45 GHz) because the gate insulating layer 138 can be dense and have high withstand voltage and high quality. When a highly purified oxide semiconductor layer and a high-quality gate insulating layer are in contact with each other, the interface level can be reduced and interface characteristics can be favorable.

It is needless to say that, even when a highly purified oxide semiconductor layer is used, another method such as a sputtering method or a plasma CVD method can be employed as long as a high-quality insulating layer can be formed as a gate insulating layer. Moreover, it is possible to use an insulating layer whose quality and characteristics of an interface with the oxide semiconductor layer are improved with heat treatment performed after the formation of the insulating layer. In any case, an insulating layer that has favorable film quality as the gate insulating layer 138 and can reduce interface level density with an oxide semiconductor layer to form a favorable interface is formed as the gate insulating layer 138.

If an impurity is included in an oxide semiconductor, a bond between the impurity and a main component of the oxide semiconductor is cleaved by a stress such as high electric field or high temperature to result in a dangling bond, which causes a shift of the threshold voltage (Vth).

Impurities included in the oxide semiconductor, particularly hydrogen and water, are reduced to a minimum and interface characteristics between the oxide semiconductor and the gate insulating layer are made favorable as described above, whereby a transistor that is stable against stresses such as high electric field and high temperature can be obtained.

Figure 4E:
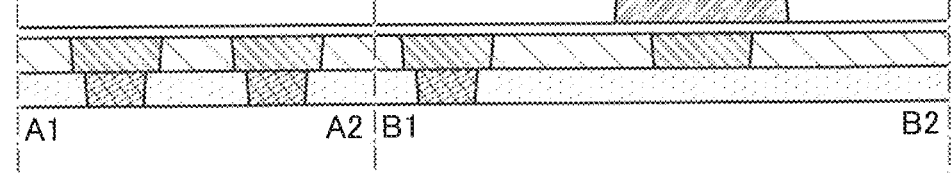

Next, an oxide semiconductor layer is formed over the gate insulating layer 138 and processed by a method such as etching using a mask, so that the island-shaped oxide semiconductor layer 140 is formed (see FIG. 4E).

As the oxide semiconductor layer, it is preferable to use an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer. It is particularly preferred that these oxide semiconductor layers exist in an amorphous state. In this embodiment, as the oxide semiconductor layer, an amorphous oxide semiconductor layer is formed by a sputtering method using a target for depositing an In—Ga—Zn—O-based oxide semiconductor. Note that since crystallization of an amorphous oxide semiconductor layer can be suppressed by adding silicon to the amorphous oxide semiconductor layer, an oxide semiconductor layer may be formed, for example, using a target containing $SiO_2$ at 2 wt % to 10 wt % inclusive.

As a target used for forming an oxide semiconductor layer by a sputtering method, an oxide semiconductor deposition target containing zinc oxide as its main component can be used, for example. Moreover, a target for depositing an oxide semiconductor containing In, Ga, and Zn (a composition ratio of $In_2O_3:Ga_2O_3:ZnO=1:1:1$ [molar ratio]) can be used, for example. Furthermore, a target for depositing an oxide semiconductor containing In, Ga, and Zn (a composition ratio of $In_2O_3:Ga_2O_3:ZnO=1:1:2$ [molar ratio] or a composition ratio of $In_2O_3:Ga_2O_3:ZnO=1:1:4$ [molar ratio]) may be used. The filling rate of a target for depositing an oxide semiconductor is 90% to 100% □□□□□□□□□□, preferably greater than or equal to 95% (e.g., 99.9%). A dense oxide semiconductor layer is formed using a target for depositing an oxide semiconductor with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas, for example, from which an impurity such as hydrogen, water, a compound having a hydroxyl group, or a hydride is removed so that the concentration is several ppm (preferably several ppb).

In forming the oxide semiconductor layer, the substrate is held in a treatment chamber that is maintained at reduced pressure and the substrate temperature is set to 100° C. to 600° C. inclusive, preferably 200° C. to 400° C. inclusive. The oxide semiconductor layer is formed while the substrate is heated, so that the impurity concentration of the oxide semiconductor layer can be reduced. Moreover, damage of the oxide semiconductor layer due to sputtering is reduced. Then, a sputtering gas from which hydrogen and water are removed is introduced into the treatment chamber from which remaining moisture is being removed, and the oxide semiconductor layer is formed using a metal oxide as a target. An entrapment vacuum pump is preferably used in order to remove moisture remaining in the treatment chamber. For example, a cryopump, an ion pump, or a titanium sublimation pump can be used. An evacuation unit may be a turbo pump provided with a cold trap. In the deposition chamber that is evacuated with the cryopump, in addition to a compound containing a carbon atom, a hydrogen atom, a compound containing a hydrogen atom such as water ($H_2O$), and the like are removed, whereby the impurity concentration of the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the flow rate of oxygen is 100%). Note that it is preferable to use a pulse direct current (DC) power supply because powder substances (also referred to as particles or dust) generated in film deposition can be reduced and the thickness distribution can be small. The thickness of the oxide semiconductor layer is 2 nm to 200 nm inclusive, preferably 5 nm to 30 nm inclusive. Note that an appropriate thickness differs depending on an oxide semiconductor material, and the thickness is set as appropriate depending on the material to be used.

Note that before the oxide semiconductor layer is formed by a sputtering method, dust on a surface of the gate insulating layer 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that a nitrogen atmosphere, a helium atmosphere, an oxygen atmosphere, or the like may be used instead of an argon atmosphere.

As an etching method for the oxide semiconductor layer, either dry etching or wet etching may be employed. It is needless to say that dry etching and wet etching can be used in combination. The etching conditions (e.g., an etching gas or an etching solution, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). Moreover, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid or the like can be used. An etchant such as ITO07N (produced by KANTO CHEMICAL CO., INC.) may also be used.

Then, first heat treatment is preferably performed on the oxide semiconductor layer. The oxide semiconductor layer can be dehydrated or dehydrogenated with the first heat treatment. The temperature of the first heat treatment is greater than or equal to 300° C. and less than or equal to 750° C., preferably greater than or equal to 400° C. and less than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out from the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, the oxide semiconductor layer sometimes becomes a layer in which a microcrystal (the grain size is 1 nm to 20 nm inclusive, typically 2 nm to 4 nm inclusive) is mixed in an amorphous oxide semiconductor (e.g., a surface of the oxide semiconductor layer).

The electrical characteristics of the oxide semiconductor layer can be changed by aligning microcrystals in an amorphous region of the oxide semiconductor layer. For example, when the oxide semiconductor layer is formed using a target for depositing In—Ga—Zn—O-based oxide semiconductor, the electrical characteristics of the oxide semiconductor layer can be changed by formation of a microcrystalline portion in which crystal grains of $In_2Ga_2ZnO_7$ with electrical anisotropy are aligned.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the first heat treatment can be referred to as dehydration treatment, dehydrogenation treatment, or the like because of its effect of dehydration or dehydrogenation on the oxide semiconductor layer 140. Such dehydration treatment or dehydrogenation treatment can be performed, for example, after the oxide semiconductor layer is formed, after a source electrode and a drain electrode are stacked over the oxide semiconductor layer 140, or after a protective insulating layer is formed over the source and drain electrodes. Such dehydration treatment or dehydrogenation treatment may be performed once or plural times.

Figure 4F:
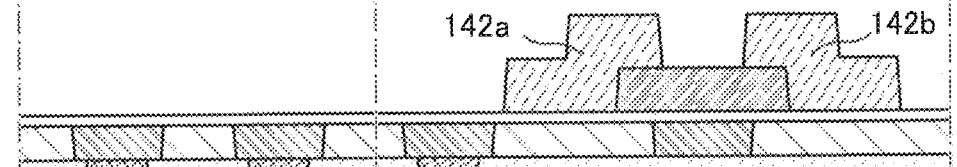

Next, the source/drain electrode 142a and the source/drain electrode 142b are formed in contact with the oxide semiconductor layer 140 (see FIG. 4F). The source/drain electrodes 142a and 142b can be formed in such a manner that a conductive layer is formed so as to cover the oxide semiconductor layer 140 and then is selectively etched.

The conductive layer can be formed by a PVD method such as a sputtering method, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Moreover, one or more materials selected from manganese, magnesium, zirconium, beryllium, or thorium may be used. Aluminum combined with one or more of elements selected from titanium, tantalum, tungsten, molybdenum, chromium, neodymium, or scandium may be used. The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

Here, ultraviolet light, KrF laser light, or ArF laser light is preferably used for light exposure in forming a mask used for etching.

The channel length (L) of the transistor is determined by a distance between a lower edge portion of the source/drain electrode 142a and a lower edge portion of the source/drain electrode 142b. Note that for light exposure in the case where the channel length (L) is less than 25 nm, light exposure for forming a mask is performed with extreme ultraviolet rays whose wavelength is several nanometers to several hundreds of nanometers, which is extremely short. The resolution of light exposure with extreme ultraviolet rays is high and the depth of focus is large. For these reasons, the channel length (L) of the transistor to be formed later can be in the range of 10 nm to 1000 nm, and the circuit can operate at higher speed. Moreover, the off current is extremely low, which prevents power consumption from increasing.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source/drain electrode 142a and between the oxide semiconductor layer 140 and the source/drain electrode 142b. The oxide conductive layer and a metal layer for forming the source/drain electrodes 142a and 142b can be successively formed. The oxide conductive layer can function as a source region and a drain region. The placement of such an oxide conductive layer can reduce the resistance of the source region and the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached to an exposed surface of the oxide semiconductor layer. Plasma treatment may be performed using a mixed gas of oxygen and argon.

Figure 4G:
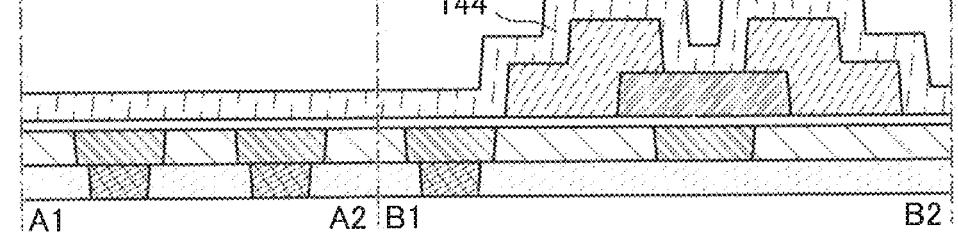

Next, the protective insulating layer 144 is formed in contact with part of the oxide semiconductor layer 140 without exposure to the air (see FIG. 4G).

The protective insulating layer 144 can be formed by a method by which impurities such as water and hydrogen are prevented from being mixed to the protective insulating layer 144, such as a sputtering method, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a layered structure. The substrate temperature in forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, the hydrogen may enter the oxide semiconductor layer or extract oxygen in the oxide semiconductor layer, whereby the resistance of the oxide semiconductor layer on the backchannel side might be decreased and a parasitic channel might be formed. Therefore, it is important not to use hydrogen in forming the protective insulating layer 144 so that the oxide insulating layer 140 contains hydrogen as little as possible.

Moreover, the protective insulating layer 144 is preferably formed while water left in the treatment chamber is removed, in order that hydrogen, a hydroxyl group, or water is not contained in the oxide semiconductor layer 140 and the protective insulating layer 144.

An entrapment vacuum pump is preferably used in order to remove moisture remaining in the treatment chamber. For example, a cryopump, an ion pump, or a titanium sublimation pump is preferably used. An evacuation unit may be a turbo pump provided with a cold trap. In the deposition chamber that is evacuated with the cryopump, a hydrogen atom and a compound containing a hydrogen atom, such as water ($H_2O$), are removed, for example; thus, the impurity concentration of the protective insulating layer 144 formed in the deposition chamber can be reduced.

As a sputtering gas used for forming the protective insulating layer 144, it is preferable to use a high-purity gas from which an impurity such as hydrogen, water, a compound having a hydroxyl group, or a hydride is removed so that the concentration of the impurity is reduced to several ppm (preferably several ppb).

Next, second heat treatment is preferably performed in an inert gas atmosphere or an oxygen gas atmosphere (at 200° C. to 400° C. inclusive, for example, at 250° C. to 350° C. inclusive). For example, the second heat treatment is performed at 250° C. for one hour in a nitrogen atmosphere. The second heat treatment can reduce variation in electric characteristics of the transistor.

Furthermore, heat treatment may be performed at 100° C. to 200° C. for one hour to 30 hours in the air. This heat treatment may be performed at a fixed heating temperature; alternatively, the following change in the heating temperature may be conducted plural times repeatedly: the heating temperature is increased from room temperature to a temperature of 100° C. to 200° C. and then decreased to room temperature. This heat treatment may be performed under a reduced pressure before the protective insulating layer is formed. The heat treatment time can be shortened under the reduced pressure. This heat treatment under a reduced pressure may be performed instead of the second heat treatment or may be performed before or after the second heat treatment, for example.

Figure 5A:
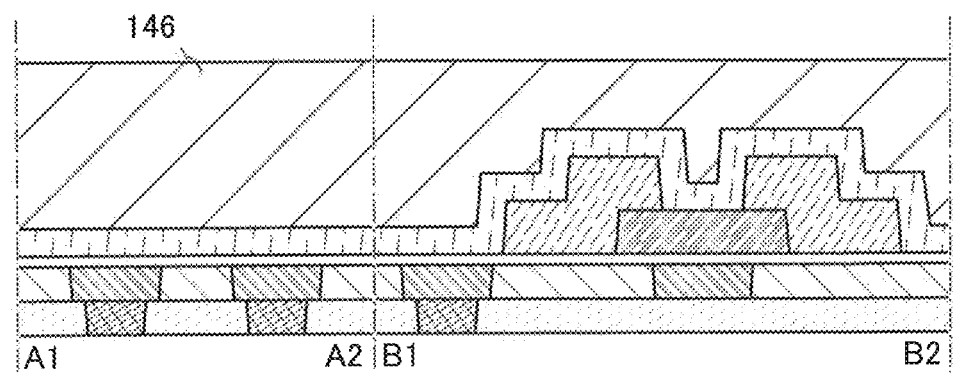
FIGS. 5A to 5D are cross-sectional views illustrating steps for manufacturing a semiconductor device.
Figure 5B:
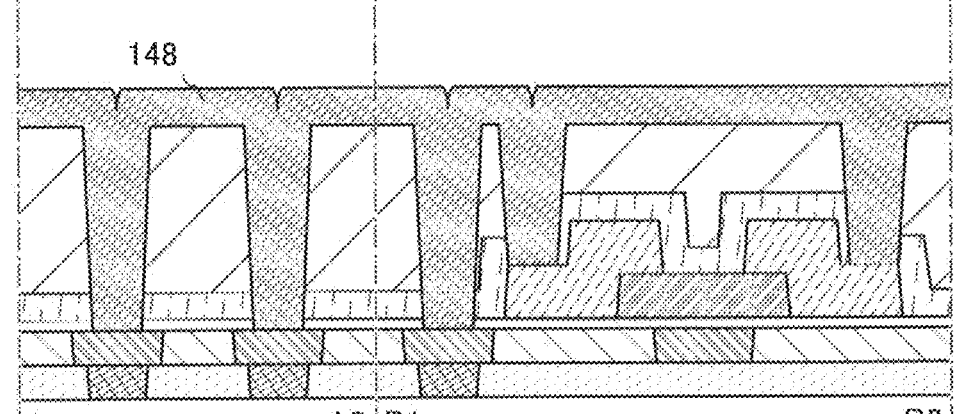

Next, the interlayer insulating layer 146 is formed over the protective insulating layer 144 (see FIG. 5A). The interlayer insulating layer 146 can be formed by a PVD method, a CVD method, or the like. The interlayer insulating layer 146 can be formed using a material including an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrodes 136a, 136b, and 136c and the source/drain electrodes 142a and 142b are formed in the interlayer insulating layer 146, the protective insulating layer 144, and the gate insulating layer 138. Then, a conductive layer 148 is formed so as to be embedded in the openings (see FIG. 5B). The openings can be formed by a method such as etching using a mask. The mask can be formed by a method such as light exposure using a photomask. Either wet etching or dry etching may be used as the etching; dry etching is preferably used in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film formed on the surface of lower electrodes (here, the electrodes 136a, 136b, and 136c and the source/drain electrodes 142a and 142b) to decrease the contact resistance with the lower electrodes. The titanium nitride film formed after the formation of the titanium film has a barrier function of preventing diffusion of the conductive material. A copper film may be formed by a plating method after the formation of the barrier film of titanium, titanium nitride, or the like.

Figure 5C:
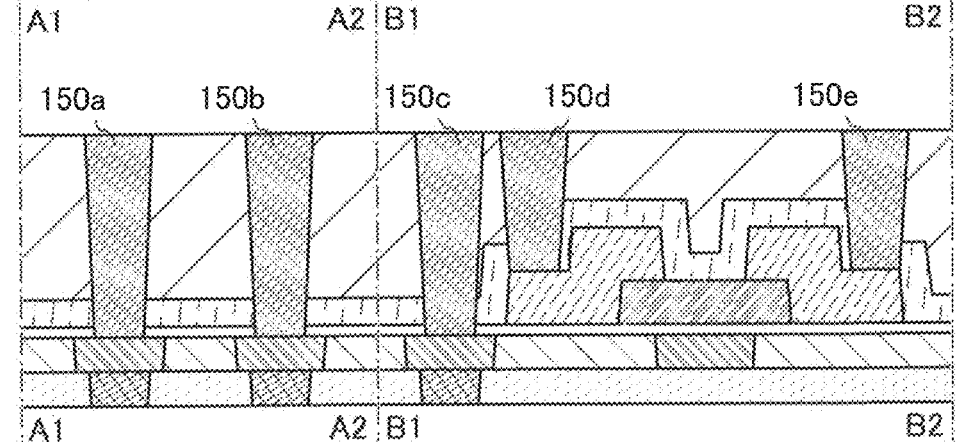
Figure 5D:
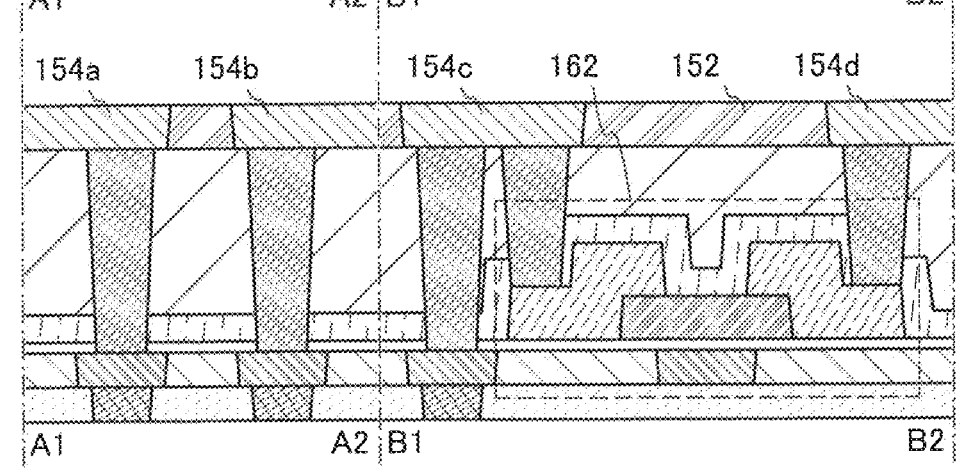

After the conductive layer 148 is formed, part of the conductive layer 148 is removed by etching, CMP, or the like, so that the interlayer insulating layer 146 is exposed and the electrodes 150a, 150b, 150c, 150d, and 150e are formed (see FIG. 5C). Note that when the electrodes 150a, 150b, 150c, 150d, and 150e are formed by removing part of the conductive layer 148, the process is preferably performed so that the surfaces are planarized. The surfaces of the interlayer insulating layer 146 and the electrodes 150a, 150b, 150c, 150d, and 150e are planarized in such a manner, whereby an electrode, a wiring, an insulating layer, and the like can be favorably formed in later steps.

Then, the insulating layer 152 is formed, and openings that reach the electrodes 150a, 150b, 150c, 150d, and 150e are formed in the insulating layer 152. After a conductive layer is formed so as to be embedded in the openings, part of the conductive layer is removed by etching, CMP, or the like. Thus, the insulating layer 152 is exposed and the electrodes 154a, 154b, 154c, and 154d are formed (see FIG. 5D). This step is similar to the step of forming the electrode 150a and the like; therefore, the detailed description is not repeated.

In the case where the transistor 162 is formed by the above-described method, the hydrogen concentration of the oxide semiconductor layer 140 is $5 \times 10^{19}$ atoms/cm$^3$ or less and the off current of the transistor 162 is 100 zA/μm or less. The transistor 162 with excellent characteristics can be obtained by the application of the oxide semiconductor layer 140 that is highly purified by a sufficient reduction in hydrogen concentration as described above. Moreover, it is possible to manufacture a semiconductor device that has excellent characteristics and includes the transistor 160 formed using a material other than an oxide semiconductor in the lower portion and the transistor 162 formed using an oxide semiconductor in the upper portion.

Note that silicon carbide (e.g., 4H—SiC) is given as a semiconductor material which can be compared with an oxide semiconductor. An oxide semiconductor and 4H—SiC have several common features. The carrier density is one of them. The density of intrinsic carriers in an oxide semiconductor at a normal temperature is estimated to be approximately $10^{-7}$/cm$^3$. This value of the intrinsic carrier density is extremely small similarly to that in 4H—SiC, $6.7 \times 10^{-11}$/cm$^3$. When the intrinsic carrier density of an oxide semiconductor is compared with the intrinsic carrier density of silicon (approximately $1.4 \times 10^{10}$/cm$^3$), it can be understood well that the intrinsic carrier density of an oxide semiconductor is significantly low.

Further, the energy band gap of an oxide semiconductor is 3.0 eV to 3.5 eV and the energy band gap of 4H—SiC is 3.26 eV. Thus, an oxide semiconductor and silicon carbide are similar in that they are both wide-gap semiconductors.

On the other hand, there is a major difference between an oxide semiconductor and silicon carbide, that is, the process temperature. Since silicon carbide generally needs to be subjected to heat treatment at 1500° C. to 2000° C., it is difficult to form a stack of silicon carbide and a semiconductor element formed using a semiconductor material other than silicon carbide. This is because a semiconductor substrate, the semiconductor element, or the like is damaged at such high temperatures. Meanwhile, an oxide semiconductor can be formed with heat treatment at 300° C. to 500° C. (the glass transition temperature or lower, up to about 700° C.); therefore, it is possible to form an integrated circuit with the use of a semiconductor material other than an oxide semiconductor and then to form a semiconductor element including an oxide semiconductor.

In addition, in contrast to silicon carbide, an oxide semiconductor is advantageous because a low heat-resistant substrate such as a glass substrate can be used. Moreover, an oxide semiconductor does not need to be subjected to heat treatment at high temperature, so that energy cost can be reduced sufficiently as compared to silicon carbide, which is another advantage.

Although many researches on properties of an oxide semiconductor have been conducted, they do not include the idea of sufficiently reducing localized levels itself in an energy gap. According to an embodiment of the disclosed invention, a highly purified oxide semiconductor is formed by removing water or hydrogen that can be a cause of the formation of localized levels. This is based on the idea that the localized levels in an energy gap are sufficiently reduced. Such a highly purified oxide semiconductor enables fabrication of remarkably excellent industrial products.

Further, it is also possible to form a more highly purified (i-type) oxide semiconductor by supplying oxygen to a dangling bond of metal which is generated by oxygen vacancy to reduce the localized levels due to the oxygen vacancy. For example, an oxide film containing excessive oxygen is formed in contact with a channel formation region and then oxygen is supplied to the channel formation region from the oxide film, so that the localized levels due to oxygen vacancy can be reduced.

A defect of an oxide semiconductor is said to be attributed to a shallow level under the conduction band due to excessive hydrogen, a deep level due to deficiency of oxygen, or the like. Thorough removal of hydrogen and sufficient supply of oxygen are performed for elimination of such a defect.

(Conduction Mechanism of Transistor Including Oxide Semiconductor)

Next, the conduction mechanism of a transistor including an oxide semiconductor will be described with reference to FIG. 11, FIGS. 12A and 12B, FIGS. 13A and 13B, and FIG. 14. Note that the following description is based on the assumption of an ideal situation for simplification.

Figure 11:
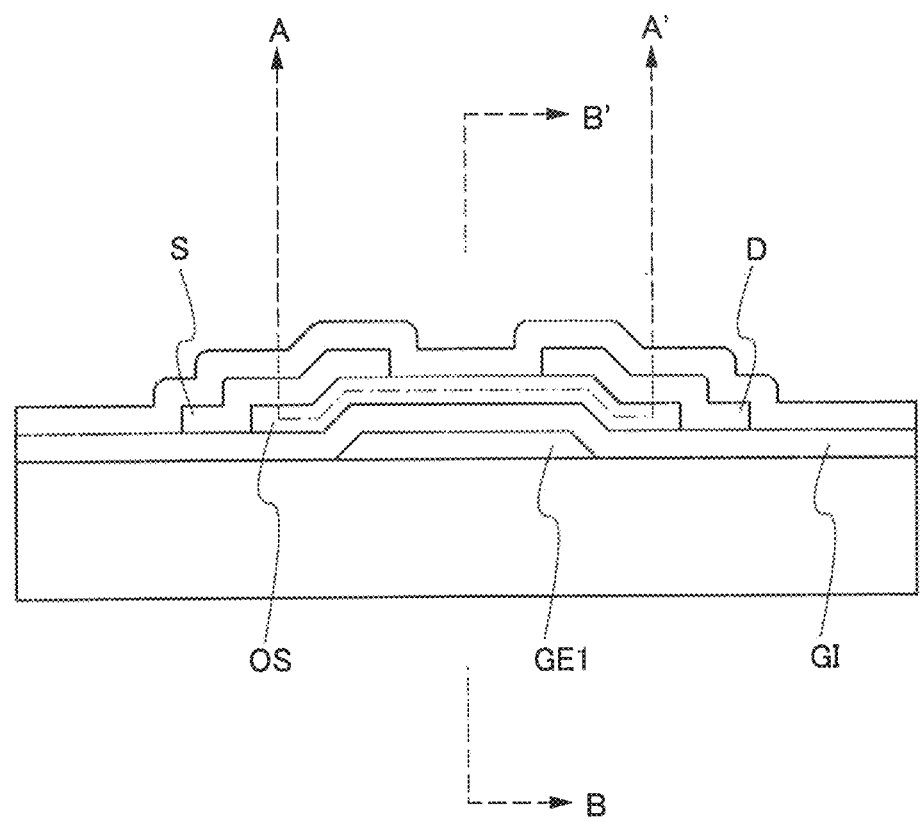
FIG. 11 is a cross-sectional view of an inverted staggered transistor including an oxide semiconductor.

FIG. 11 is a cross-sectional view of an inverted staggered transistor including an oxide semiconductor. An oxide semiconductor layer (OS) is provided over a gate electrode layer (GE1) with a gate insulating layer (GI) therebetween, and a source electrode (S) and a drain electrode (D) are provided over the oxide semiconductor layer.

Figure 12A:
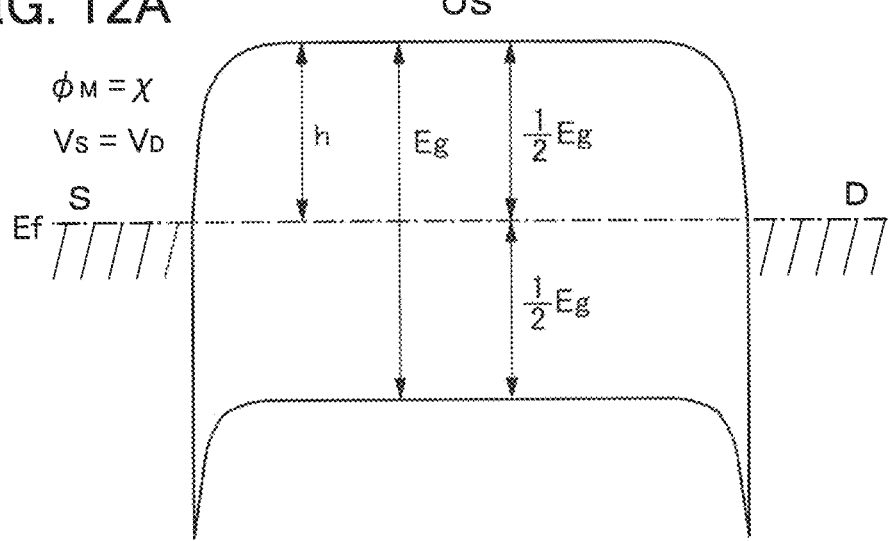
FIGS. 12A and 12B are energy band diagrams (schematic diagrams) of a cross section A-A' in FIG. 11.
Figure 12B:
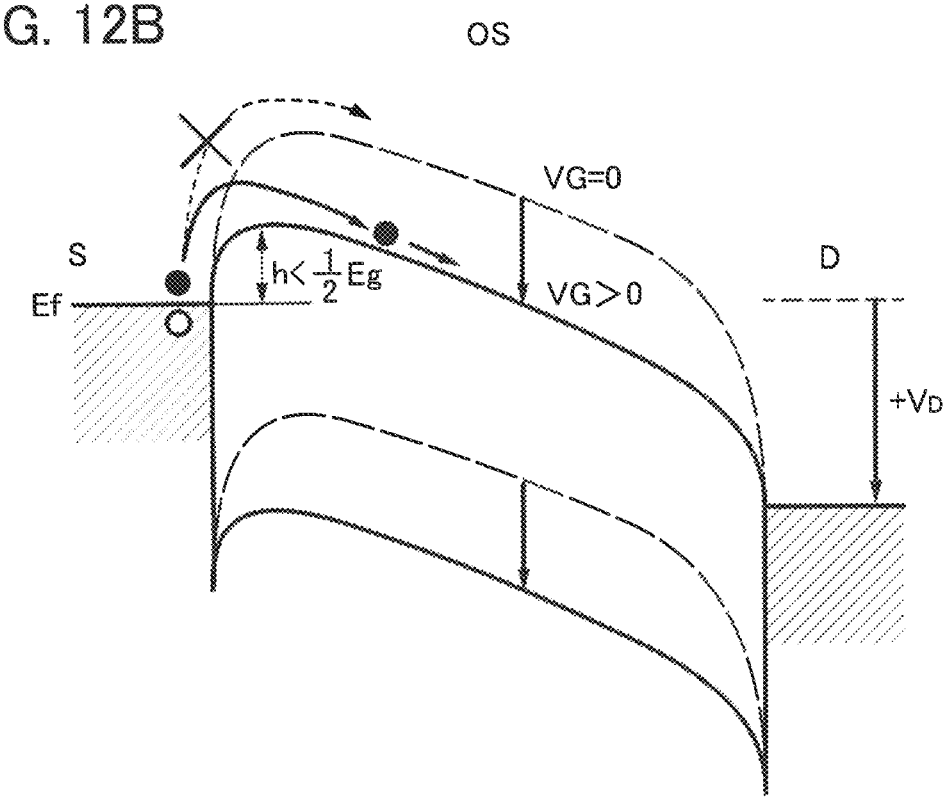

FIGS. 12A and 12B are schematic diagrams of energy band structures along A-A' in FIG. 11. FIG. 12A illustrates a case where a voltage is not applied to the gate electrode layer ($V_G=0$), and no voltage or the same voltage is applied to the drain electrode and the source electrode ($V_D=V_S=0$ or $V_D=V_S$). FIG. 12B illustrates the case where a positive voltage ($V_D>0$) is applied to the drain electrode and a voltage is not applied to the gate electrode layer ($V_G=0$) (shown by dashed lines) and the case where a positive voltage ($V_D>0$) is applied to the drain electrode and a positive voltage $+V_G$ ($V_G>0$) is applied to the gate electrode layer (shown by solid lines). In the case where a voltage is not applied to the gate electrode layer, a carrier (electron) is not injected to the oxide semiconductor side from the source electrode because of the high potential barrier, so that a current does not flow, which means an off state. On the other hand, when a positive voltage is applied to the gate electrode layer, the potential barrier is reduced and thus a current flows, which means an on state.

Figure 13A:
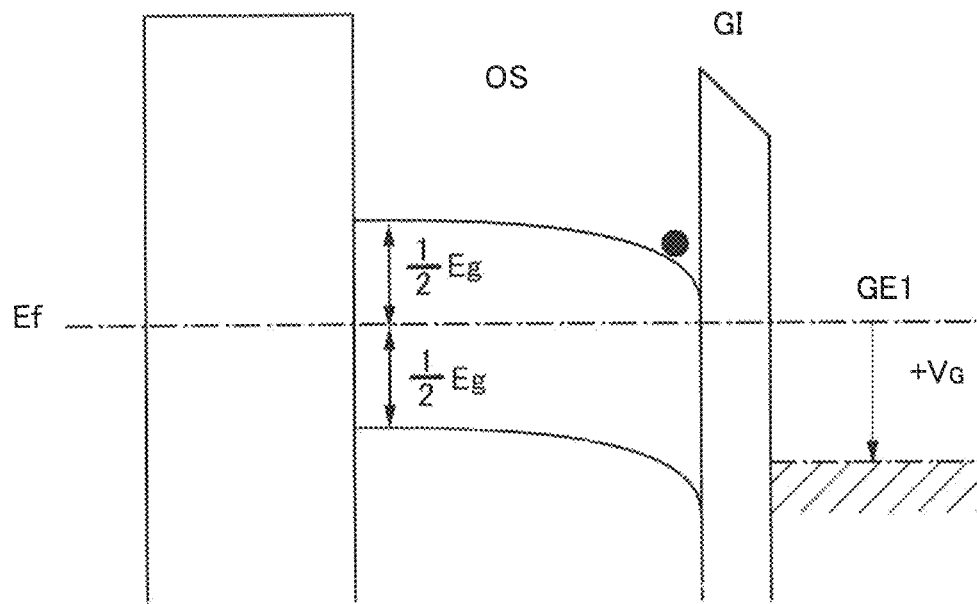
FIG. 13A illustrates a state in which a positive potential $(+V_G)$ is applied to a gate (GE1)
Figure 13B:
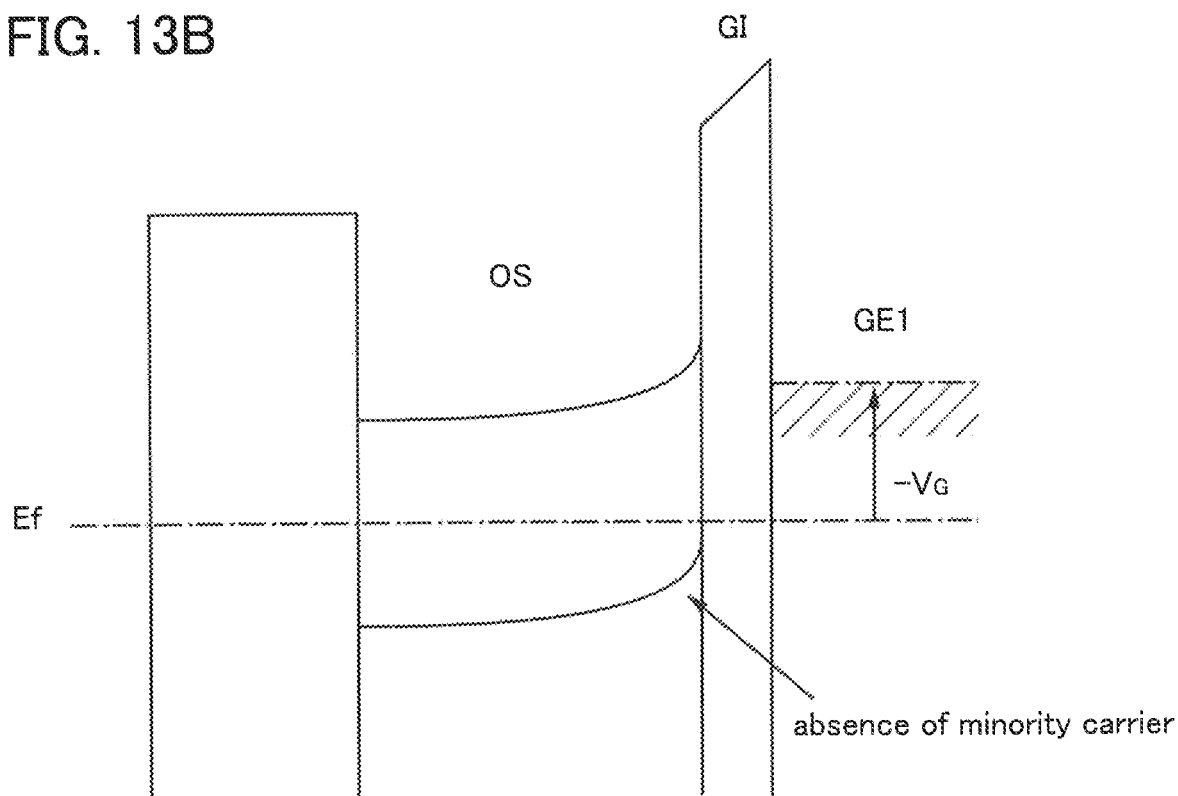
FIG. 13B illustrates a state in which a negative potential $(-V_G)$ is applied to the gate (GE1)

FIGS. 13A and 13B are energy band diagrams (schematic diagrams) along B-B' in FIG. 11. FIG. 13A illustrates a state where a positive potential ($V_G>0$) is supplied to the gate electrode layer (GE1), that is, an on state where a carrier (electron) flows between the source electrode and the drain electrode. FIG. 13B illustrates a state where a negative potential $-V_G$ ($V_G>0$) is supplied to the gate (GE1), that is, an off state (where a minority carrier does not flow).

Figure 14:
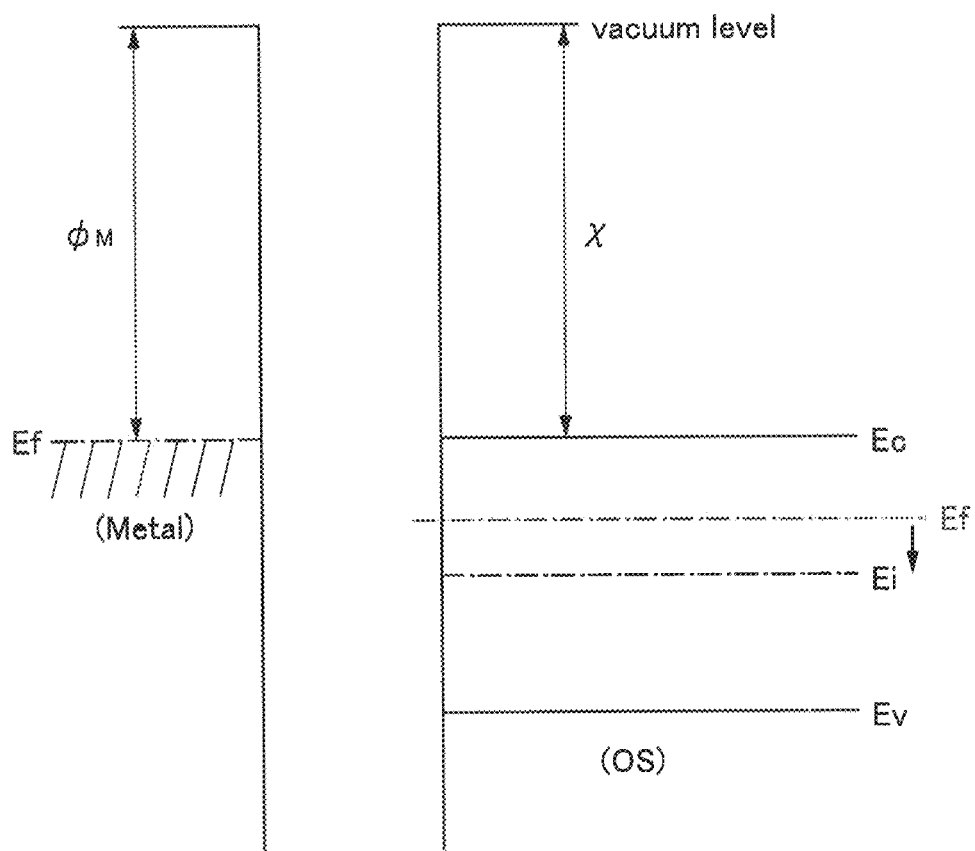
FIG. 14 illustrates a relation of vacuum level, work function $(\varphi_M)$ of a metal, and electron affinity $(\chi)$ of an oxide semiconductor.

FIG. 14 illustrates the relation between the vacuum level, the work function of metal ($\varphi_M$), and the electron affinity of an oxide semiconductor ($\chi$).

Metal degenerates and the Fermi level exists in the conduction band. Meanwhile, a conventional oxide semiconductor is n-type, and the Fermi level ($E_f$) is distant from the intrinsic Fermi level ($E_i$) in the center of the band gap and is located near the conduction band. It is known that hydrogen in an oxide semiconductor partly becomes a donor and is one of the causes to produce an n-type oxide semiconductor. Further, oxygen vacancy is known as one of the causes to produce an n-type oxide semiconductor.

In contrast, an oxide semiconductor according to an embodiment of the disclosed invention is an oxide semiconductor that is made to be intrinsic (i-type) or to be close to intrinsic in the following manner: hydrogen, which is the cause to produce an n-type oxide semiconductor, is removed from the oxide semiconductor by high purification, so that the oxide semiconductor includes an element (impurity element) other than the main component of the oxide semiconductor as little as possible and oxygen vacancy is eliminated. That is, a feature of an embodiment of the present invention is that an oxide semiconductor is made to be or be close to a highly-purified i-type (intrinsic) semiconductor not by addition of an impurity element but by elimination of impurities such as hydrogen and water and oxygen vacancy as much as possible. Thus, the Fermi level ($E_f$) can be comparable with the intrinsic Fermi level ($E_i$).

The band gap ($E_g$) and the electron affinity ($\chi$) of an oxide semiconductor are said to be 3.15 eV and 4.3 eV, respectively. The work function of titanium (Ti) contained in the source electrode or the drain electrode is substantially equal to the electron affinity ($\chi$) of an oxide semiconductor. In this case, a Schottky barrier against an electron is not formed at the interface between metal and an oxide semiconductor.

In the case where the work function of metal ($\chi_M$) is equal to the electron affinity of an oxide semiconductor ($\chi$), an energy band diagram (schematic diagram) in FIG. 12A is obtained when the metal and the oxide semiconductor are in contact with each other.

In FIG. 12B, a black dot (●) indicates an electron. When a positive potential is supplied to the drain electrode, the electron crosses over a barrier (h) to be injected into the oxide semiconductor, and flows to the drain electrode. The height of the barrier (h) depends on a gate voltage ($V_G$). When a positive drain voltage is applied to the drain electrode, the height of the barrier (h) is lower than the height of the barrier in FIG. 12A where a voltage is not applied, that is, half the band gap ($E_g$).

At that time, as illustrated in FIG. 13A, the electron travels in the vicinity of the interface between a gate insulating layer and the highly-purified oxide semiconductor (the bottom portion where the oxide semiconductor is stable in terms of energy).

As illustrated in FIG. 13B, in the case where a negative potential is supplied to the gate electrode (GE1), since a hole which is a minority carrier does not exist substantially, the current value is as close to 0 as possible.

For example, the off current is 10 zA/μm ($1\times10^{-20}$ A/μm) or less or 1 zA/μm ($1\times10^{-21}$ A/μm) or less at room temperature (25° C.). As a result, a transistor having a sub-threshold swing (S value) of 0.1 V/dec. can be obtained.

In this manner, an oxide semiconductor is highly purified so as to include an impurity other than the main component of the oxide semiconductor as little as possible, whereby operation of a transistor can be favorable.

MODIFICATION EXAMPLE

FIG. 6, FIGS. 7A and 7B, FIGS. 8A and 8B, and FIGS. 9A and 9B illustrate modification examples of structures of semiconductor devices. The semiconductor devices in each of which the transistor 162 has a structure different from that described above will be described below as modification examples. That is, the structure of the transistor 160 is the same as the above.

Figure 6:
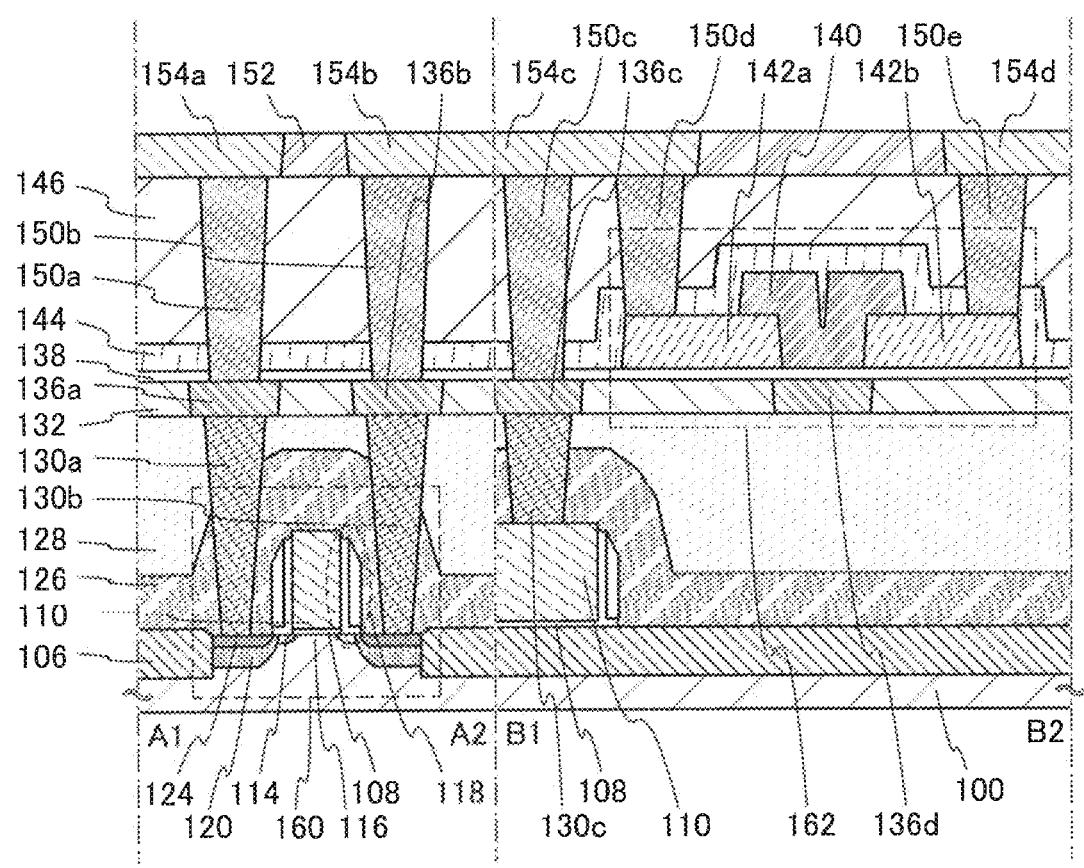
FIG. 6 is a cross-sectional view of a semiconductor device.

FIG. 6 illustrates an example of a semiconductor device including the transistor 162 in which the gate electrode 136d is placed below the oxide semiconductor layer 140 and the source/drain electrodes 142a and 142b are in contact with a bottom surface of the oxide semiconductor layer 140. Note that the planar structure can be changed as appropriate to correspond to the cross section; therefore, only the cross section is shown here.

A large difference between the structure in FIG. 6 and the structure in FIG. 2A is the position at which the oxide semiconductor layer 140 is connected to the source/drain electrodes 142a and 142b. That is, a top surface of the oxide semiconductor layer 140 is in contact with the source/drain electrodes 142a and 142b in the structure in FIG. 2A, whereas the bottom surface of the oxide semiconductor layer 140 is in contact with the source/drain electrodes 142a and 142b in the structure in FIG. 6. Moreover, the difference in the contact position results in a different arrangement of other electrodes, an insulating layer, and the like. The details of each component are the same as those of FIGS. 2A and 2B.

Specifically, the semiconductor device illustrated in FIG. 6 includes the gate electrode 136d provided over the interlayer insulating layer 128, the gate insulating layer 138 provided over the gate electrode 136d, the source/drain electrodes 142a and 142b provided over the gate insulating layer 138, and the oxide semiconductor layer 140 in contact with top surfaces of the source/drain electrodes 142a and 142b.

Here, the gate electrode 136d is provided so as to be embedded in the insulating layer 132 formed over the interlayer insulating layer 128. Like the gate electrode 136d, the electrode 136a, the electrode 136b, and the electrode 136c are formed in contact with the source/drain electrode 130a, the source/drain electrode 130b, and the electrode 130c, respectively.

The protective insulating layer 144 is provided over the transistor 162 so as to be in contact with part of the oxide semiconductor layer 140. The interlayer insulating layer 146 is provided over the protective insulating layer 144. Openings that reach the source/drain electrode 142a and the source/drain electrode 142b are formed in the protective insulating layer 144 and the interlayer insulating layer 146. The electrode 150d and the electrode 150e are formed in contact with the source/drain electrode 142a and the source/drain electrode 142b, respectively, through the respective openings. Like the electrodes 150d and 150e, the electrodes 150a, 150b, and 150c are formed in contact with the electrodes 136a, 136b, and 136c, respectively, through openings provided in the gate insulating layer 138, the protective insulating layer 144, and the interlayer insulating layer 146.

The insulating layer 152 is provided over the interlayer insulating layer 146. The electrodes 154a, 154b, 154c, and 154d are provided so as to be embedded in the insulating layer 152. The electrode 154a is in contact with the electrode 150a. The electrode 154b is in contact with the electrode 150b. The electrode 154c is in contact with the electrode 150c and the electrode 150d. The electrode 154d is in contact with the electrode 150e.

Figure 7A:
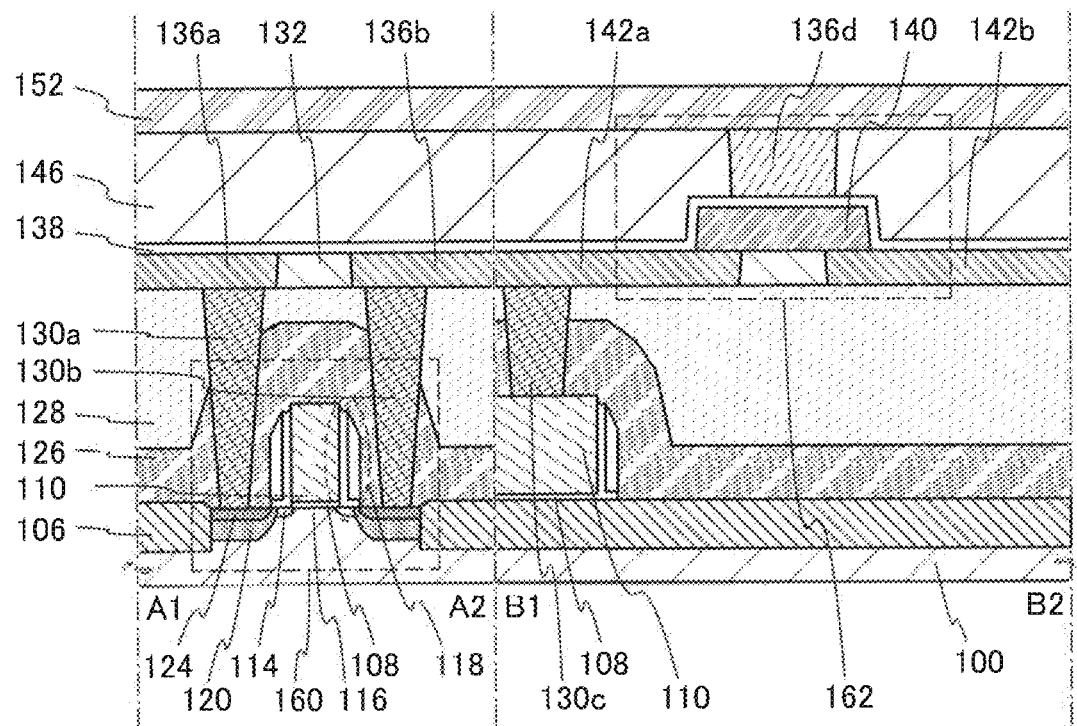
FIGS. 7A and 7B are cross-sectional views each illustrating a semiconductor device.
Figure 7B:
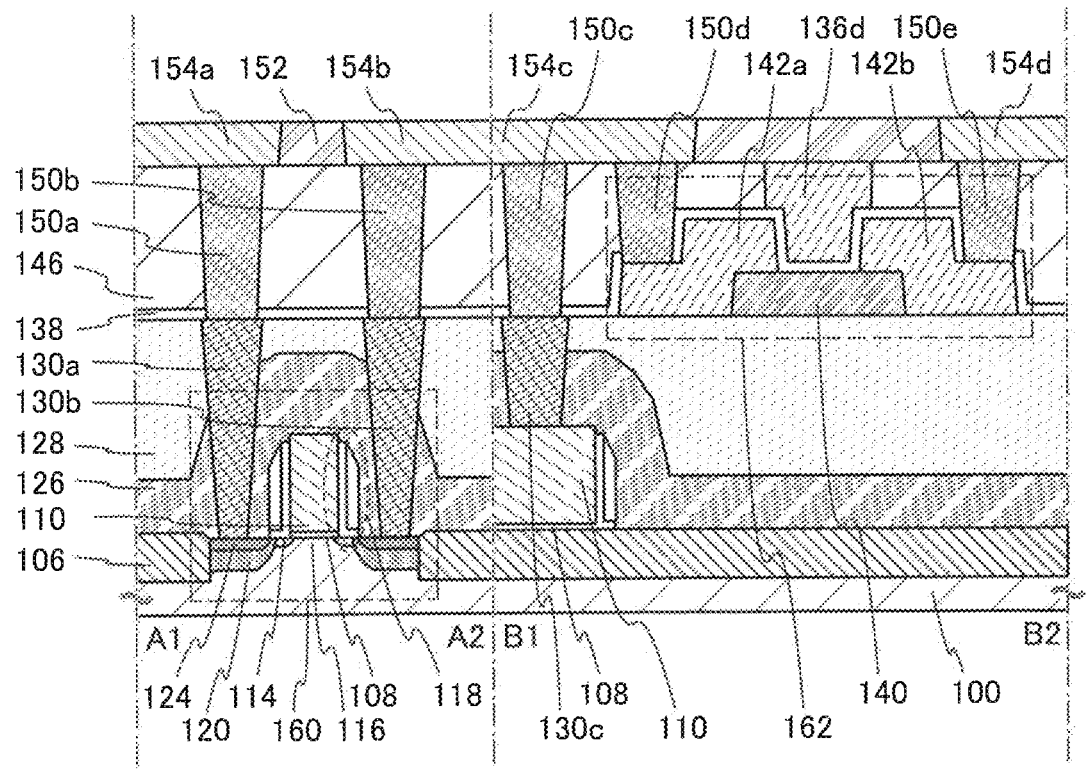

FIGS. 7A and 7B each illustrate an example of a structure of a semiconductor device in which the gate electrode 136d is placed over the oxide semiconductor layer 140. FIG. 7A illustrates an example of a structure in which the source/drain electrodes 142a and 142b are in contact with a bottom surface of the oxide semiconductor layer 140. FIG. 7B illustrates an example of a structure in which the source/drain electrodes 142a and 142b are in contact with a top surface of the oxide semiconductor layer 140.

A large difference between the structures in FIGS. 7A and 7B and those in FIG. 2A and FIG. 6 is that the gate electrode 136d is placed over the oxide semiconductor layer 140. Furthermore, a large difference between the structure in FIG. 7A and the structure in FIG. 7B is that the source/drain electrodes 142a and 142b are in contact with either the bottom surface or the top surface of the oxide semiconductor layer 140. Moreover, these differences result in a different arrangement of other electrodes, an insulating layer, and the like. The details of each component are the same as those of FIGS. 2A and 2B, and the like.

Specifically, the semiconductor device illustrated in FIG. 7A includes the source/drain electrodes 142a and 142b provided over the interlayer insulating layer 128, the oxide semiconductor layer 140 in contact with top surfaces of the source/drain electrodes 142a and 142b, the gate insulating layer 138 provided over the oxide semiconductor layer 140, and the gate electrode 136d over the gate insulating layer 138 in a region overlapping with the oxide semiconductor layer 140.

The semiconductor device in FIG. 7B includes the oxide semiconductor layer 140 provided over the interlayer insulating layer 128, the source/drain electrodes 142a and 142b provided to be in contact with a top surface of the oxide semiconductor layer 140, the gate insulating layer 138 provided over the oxide semiconductor layer 140 and the source/drain electrodes 142a and 142b, and the gate electrode 136d over the gate insulating layer 138 in a region overlapping with the oxide semiconductor layer 140.

Note that in the structures in FIGS. 7A and 7B, a component (e.g., the electrode 150a or the electrode 154a) can be omitted from the structure in FIGS. 2A and 2B or the like in some cases. In such cases, a secondary effect such as simplification of a manufacturing process can be obtained. It is needless to say that a nonessential component can be omitted in the structures in FIGS. 2A and 2B and the like.

Figure 8A:
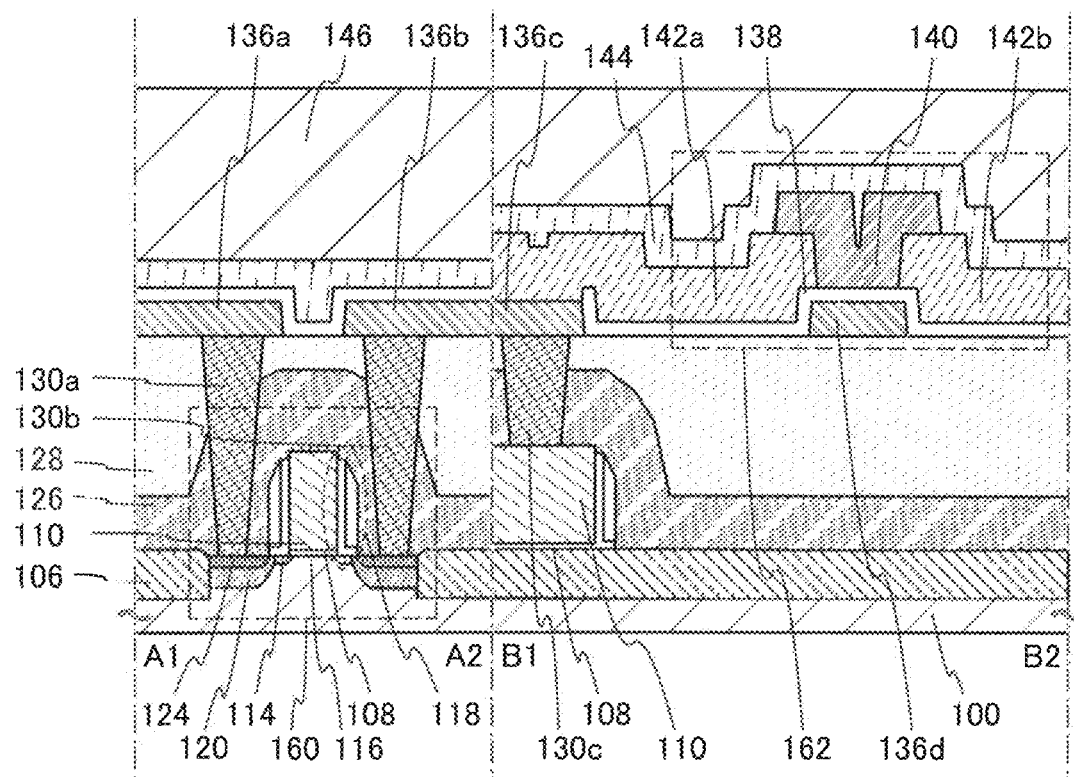
FIGS. 8A and 8B are cross-sectional views each illustrating a semiconductor device.
Figure 8B:
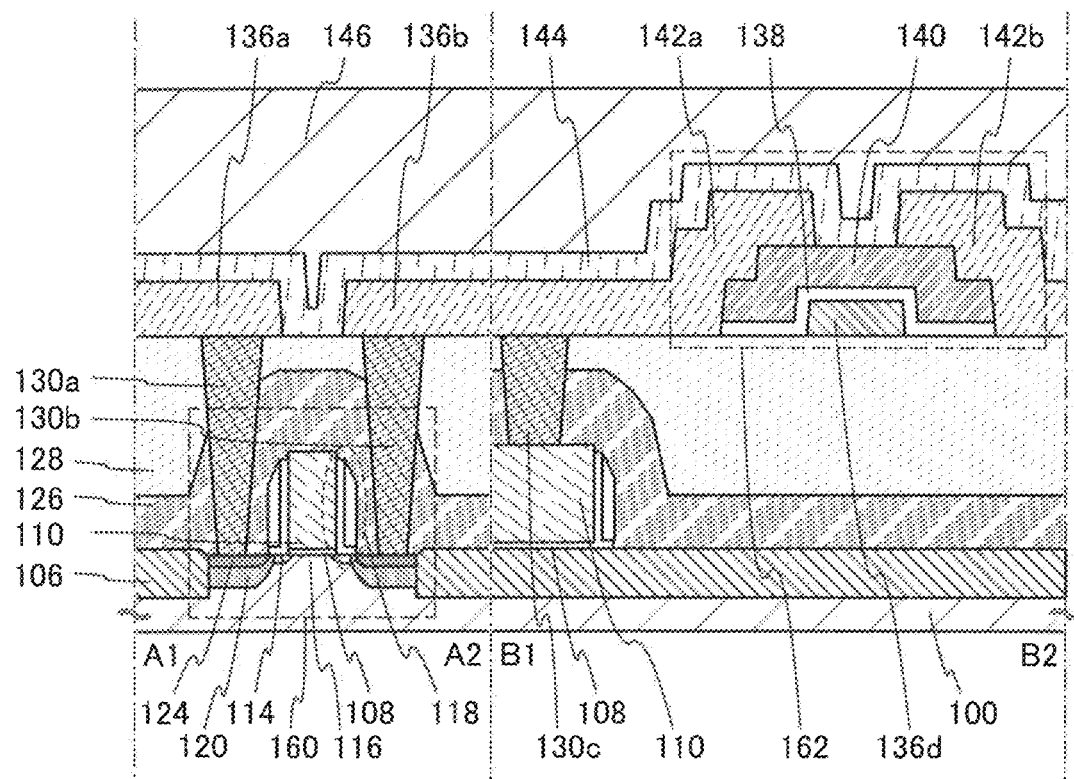

FIGS. 8A and 8B each illustrate an example of the case where the size of the element is relatively large and the gate electrode 136d is placed below the oxide semiconductor layer 140. In this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 can be formed in a similar manner.

A large difference between the structure in FIG. 8A and the structure in FIG. 8B is that the source/drain electrodes 142a and 142b are in contact with either the bottom surface or the top surface of the oxide semiconductor layer 140. Moreover, these differences result in other electrodes, an insulating layer, and the like being arranged in a different manner. The details of each component are the same as those of FIGS. 2A and 2B, and the like.

Specifically, the semiconductor device in FIG. 8A includes the gate electrode 136d provided over the interlayer insulating layer 128, the gate insulating layer 138 provided over the gate electrode 136d, the source/drain electrodes 142a and 142b provided over the gate insulating layer 138, and the oxide semiconductor layer 140 in contact with top surfaces of the source/drain electrodes 142a and 142b.

The semiconductor device in FIG. 8B includes the gate electrode 136d provided over the interlayer insulating layer 128, the gate insulating layer 138 provided over the gate electrode 136d, the oxide semiconductor layer 140 provided over the gate insulating layer 138 in a region overlapping with the gate electrode 136d, and the source/drain electrodes 142a and 142b provided to be in contact with a top surface of the oxide semiconductor layer 140.

Note that also in the structures in FIGS. 8A and 8B, a component can be omitted from the structure in FIGS. 2A and 2B or the like in some cases. Also in such cases, a secondary effect such as simplification of a manufacturing process can be obtained.

Figure 9A:
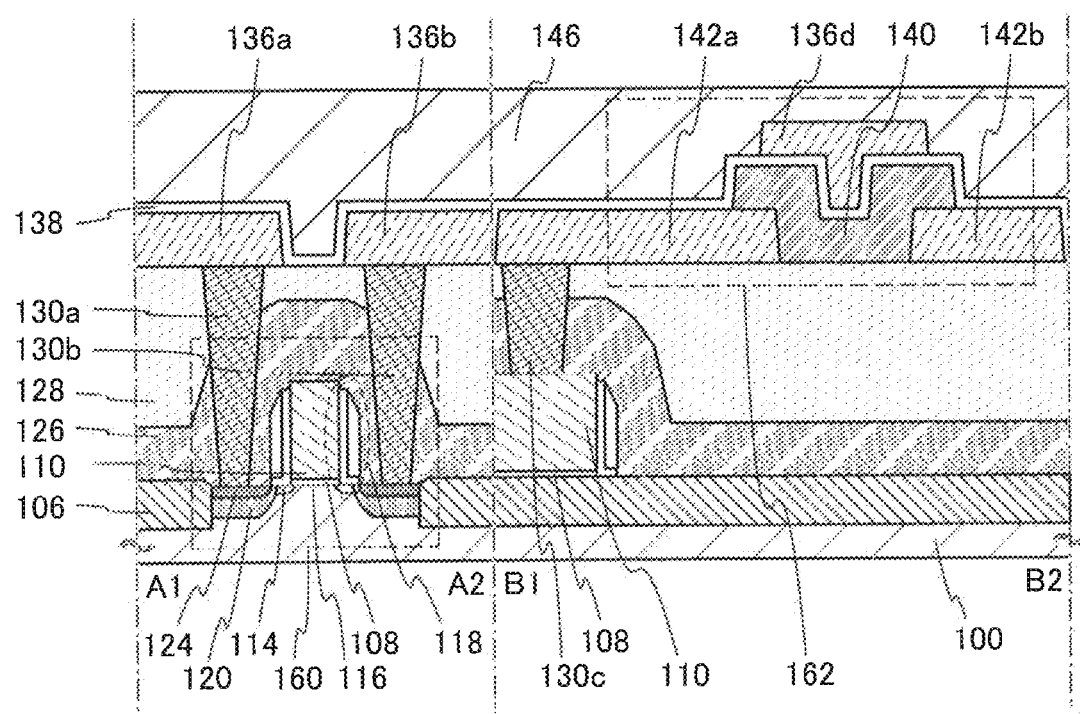
FIGS. 9A and 9B are cross-sectional views each illustrating a semiconductor device.
Figure 9B:
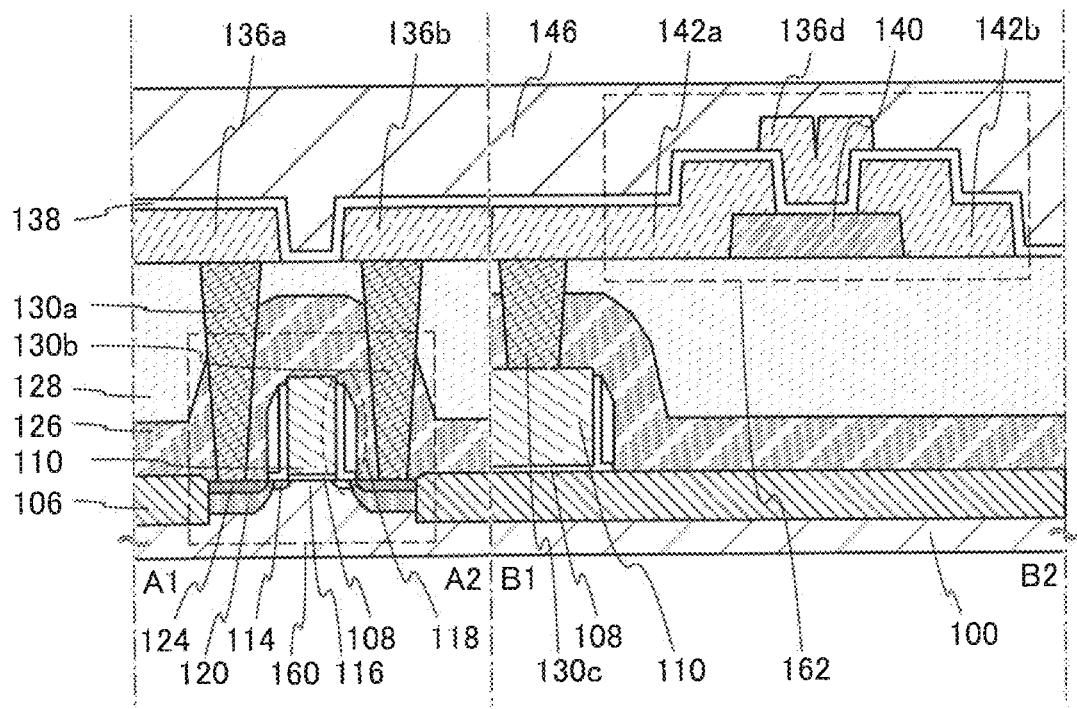

FIGS. 9A and 9B each illustrate an example of the case where the size of the element is relatively large and the gate electrode 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate electrode 136d and the like can be formed by patterning after formation of a conductive layer. Note that although not illustrated here, the transistor 160 can be formed in a similar manner.

A large difference between the structure in FIG. 9A and the structure in FIG. 9B is that the source/drain electrodes 142a and 142b are in contact with either the bottom surface or the top surface of the oxide semiconductor layer 140. Moreover, the difference results in other electrodes, an insulating layer, and the like being arranged in a different manner. The details of each component are the same as those of FIGS. 2A and 2B, and the like.

Specifically, the semiconductor device in FIG. 9A includes the source/drain electrodes 142a and 142b provided over the interlayer insulating layer 128, the oxide semiconductor layer 140 in contact with top surfaces of the source/drain electrodes 142a and 142b, the gate insulating layer 138 provided over the source/drain electrodes 142a and 142b and the oxide semiconductor layer 140, and the gate electrode 136d provided over the gate insulating layer 138 in a region overlapping with the oxide semiconductor layer 140.

The semiconductor device in FIG. 9B includes the oxide semiconductor layer 140 provided over the interlayer insulating layer 128, the source/drain electrodes 142a and 142b provided to be in contact with a top surface of the oxide semiconductor layer 140, the gate insulating layer 138 provided over the source/drain electrodes 142a and 142b and the oxide semiconductor layer 140, and the gate electrode 136d provided over the gate insulating layer 138 in a region overlapping with the oxide semiconductor layer 140.

Note that also in the structures in FIGS. 9A and 9B, a component can be omitted from the structure in FIGS. 2A and 2B or the like in some cases. Also in such cases, a secondary effect such as simplification of a manufacturing process can be obtained.

As described above, a semiconductor device with a novel structure can be realized according to one embodiment of the invention disclosed herein. In this embodiment, the examples in each of which the semiconductor device is formed by stacking the transistor 160 and the transistor 162 are described; however, the structure of the semiconductor device is not limited to this structure. Moreover, this embodiment shows the examples in each of which the channel length direction of the transistor 160 is perpendicular to that of the transistor 162; however, the positional relation between the transistors 160 and 162 is not limited to this example. In addition, the transistor 160 and the transistor 162 may be provided to overlap with each other.

In this embodiment, the semiconductor device with a minimum storage unit (one bit) is described for simplification; however, the structure of the semiconductor device is not limited thereto. A more advanced semiconductor device can be formed by connecting a plurality of semiconductor devices as appropriate. For example, a NAND-type or NOR-type semiconductor device can be formed by using a plurality of the above-described semiconductor devices. The wiring configuration is not limited to that in FIG. 1 and can be changed as appropriate.

The semiconductor device according to this embodiment can store data for an extremely long time because the transistor 162 has low off current. That is, refresh operation which is necessary in a DRAM and the like is not needed, so that power consumption can be suppressed. Moreover, the semiconductor device according to this embodiment can be used as a substantially non-volatile semiconductor device.

Since writing or the like of data is performed with switching operation of the transistor 162, high voltage is not necessary and deterioration of the element can be neglected. Furthermore, data is written and erased depending on the on and off states of the transistor, whereby high-speed operation can be easily realized. In addition, it is also advantageous in that there is no need of operation for erasing data because data can be directly rewritten by controlling a potential to be input to the transistor, which is necessary in a flash memory and the like.

Since a transistor including a material other than an oxide semiconductor can operate at higher speed than a transistor including an oxide semiconductor, stored data can be read out at high speed by using the transistor.

The structures and methods described in this embodiment can be combined as appropriate with any of the structures and methods described in the other embodiments.

Embodiment 2

In this embodiment, a structure and a manufacturing method of a semiconductor device, according to another embodiment of the disclosed invention, will be described with reference to FIGS. 15A and 15B.

Figure 15A:
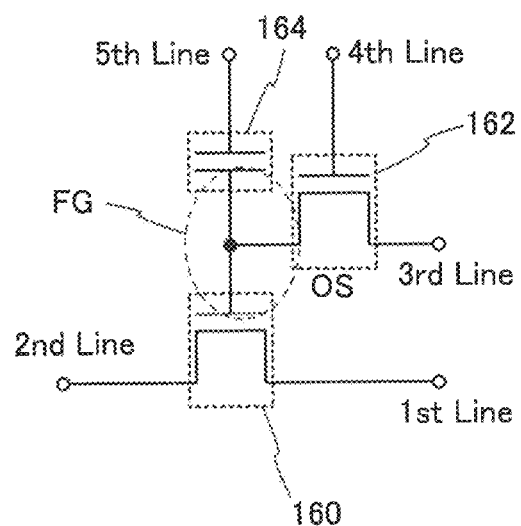
FIGS. 15A and 15B are circuit diagrams of semiconductor devices.

FIG. 15A illustrates an example of a circuit configuration of a semiconductor device. FIG. 15A is different from FIG. 1 in that a capacitor 164 is provided. That is, in FIG. 15A, one of a source electrode and a drain electrode of the transistor 162, one of electrodes of the capacitor 164, and a gate electrode of the transistor 160 are electrically connected to one another. A first line (also referred to as a source line BL) and a source electrode of the transistor 160 are electrically connected to each other, and a second line (also referred to as a bit line BL) and a drain electrode of the transistor 160 are electrically connected to each other. A third line (also referred to as a first signal line S1) and the other of the source electrode and the drain electrode of the transistor 162 are electrically connected to each other, and a fourth line (also referred to as a second signal line S2) and a gate electrode of the transistor 162 are electrically connected to each other. A fifth line (also referred to as a word line WL) and the other of the electrodes of the transistor 164 are electrically connected to each other. Note that in each of FIGS. 15A and 15B, "OS" is written beside a transistor in order to indicate that the transistor includes an oxide semiconductor.

Here, a transistor including an oxide semiconductor, which is described above, is used as the transistor 162. A transistor including an oxide semiconductor has a characteristic of a significantly small off current. Therefore, when the transistor 162 is off, the potential of the gate electrode of the transistor 160 can be held for a very long time. Provision of the capacitor 164 facilitates holding of charge given to the gate electrode of the transistor 160 and reading of stored data.

Note that there is no particular limitation on the transistor 160. In terms of increasing the speed of reading data, it is preferable to use, for example, a transistor with high switching rate such as a transistor formed using single crystal silicon.

The semiconductor device in FIG. 15A utilizes a characteristic in which the potential of the gate electrode of the transistor 160 can be held, thereby writing, storing, and reading data as follows.

Writing and storing of data will be described. First, the potential of the fourth line is set to a potential at which the transistor 162 is turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, one of charges for supply of two different potentials (hereinafter, a charge for supply of a low potential is referred to as a charge $Q_L$ and a charge for supply of a high potential is referred to as a charge $Q_H$) is given to the gate electrode of the transistor 160. Note that charges giving three or more different potentials may be applied to improve a storage capacitor. After that, the potential of the fourth line is set to a potential at which the transistor 162 is turned off, so that the transistor 162 is turned off. Thus, the charge given to the gate electrode of the transistor 160 is held (storing).

Since the off current of the transistor 162 is significantly small, the charge of the gate electrode of the transistor 160 is held for a long time.

Next, operation of data reading will be described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth line, which is needed to turn on the transistor 160. Thus, the potential of the fifth line is set to a potential $V_0$ intermediate between $V_{th\_H}$ and $V_{th\_L}$, whereby charge given to the gate electrode of the transistor 160 can be determined. For example, in the case where $Q_H$ is given in writing, when the potential of the fifth line is set to $V_0$ ($>V_{th\_H}$), the transistor 160 is turned on. In the case where $Q_L$ is given in writing, even when the potential of the fifth line is set to $V_0$ ($>V_{th\_L}$), the transistor 160 remains in an off state. Therefore, the stored data can be read by the potential of the second line.

Note that in the case where memory cells are arrayed to be used, only data of desired memory cells is needed to be read. Thus, in the case where data of predetermined memory cells is read and data of the other memory cells is not read, a potential which allows the transistor 160 to be turned off regardless of a state of the gate electrode, that is, a potential lower than $V_{th\_H}$ may be applied to fifth lines of the memory cells whose data is not to be read. Alternatively, a potential which allows the transistor 160 to be turned on regardless of a state of the gate electrode, that is, a potential higher than $V_{th\_L}$ may be applied to the fifth lines.

Next, rewriting of data will be described. Data rewriting is performed similarly to the writing or storing of data. That is, the potential of the fourth line is set to a potential which allows the transistor 162 to be turned on, whereby the transistor 162 is turned on. Accordingly, the potential of the third line (potential related to new data) is supplied to the gate electrode of the transistor 160 and the capacitor 164. After that, the potential of the fourth line is set to a potential which allows the transistor 162 to be turned off, whereby the transistor 162 is turned off. Accordingly, charge related to new data is given to the gate electrode of the transistor 160.

Thus, in the semiconductor device according to the disclosed invention, data can be directly rewritten by overwriting of new data. Therefore, extracting of charge from a floating gate with the use of a high voltage needed in a flash memory or the like is not necessary and thus, reduction in operation speed, which is attributed to erasing operation, can be suppressed. That is, high-speed operation of the semiconductor device can be achieved.

Note that the source electrode or the drain electrode of the transistor 162 is electrically connected to the gate electrode of the transistor 160, thereby having an effect similar to that of a floating gate of a floating gate transistor used for a nonvolatile memory element. Therefore, a portion in the drawing where the source electrode or the drain electrode of the transistor 162 is electrically connected to the gate electrode of the transistor 160 is called a floating gate portion FG in some cases. When the transistor 162 is off, the floating gate portion FG can be regarded as being embedded in an insulator and thus charge is held in the floating gate portion FG. The amount of off current of the transistor 162 including an oxide semiconductor is smaller than or equal to one hundred thousandth of the amount of off current of a transistor including a silicon semiconductor; thus, lost of the charge accumulated in the floating gate portion FG due to a leakage current of the transistor 162 is negligible. That is, with the transistor 162 including an oxide semiconductor, a nonvolatile memory device which can store data without being supplied with power can be realized.

For example, when the off current of the transistor 162 is 10 zA (1 zA (zeptoampere) is $1\times10^{-21}$ A) or less at room temperature (25° C.) and the capacitance value of the capacitor 164 is approximately 10 fF, data can be stored for $10^4$ seconds or longer. It is needless to say that the storage time depends on transistor characteristics and the capacitance value.

Further, in that case, the problem of deterioration of a gate insulating film (tunnel insulating film), which is pointed out in a conventional floating gate transistor, does not exist. That is to say, the deterioration of a gate insulating film due to injection of an electron into a floating gate, which has been traditionally regarded as a problem, can be neglected. This means that there is no limit on the number of times of writing in principle. Furthermore, a high voltage needed for writing or erasing in a conventional floating gate transistor is not necessary.

Figure 15B:
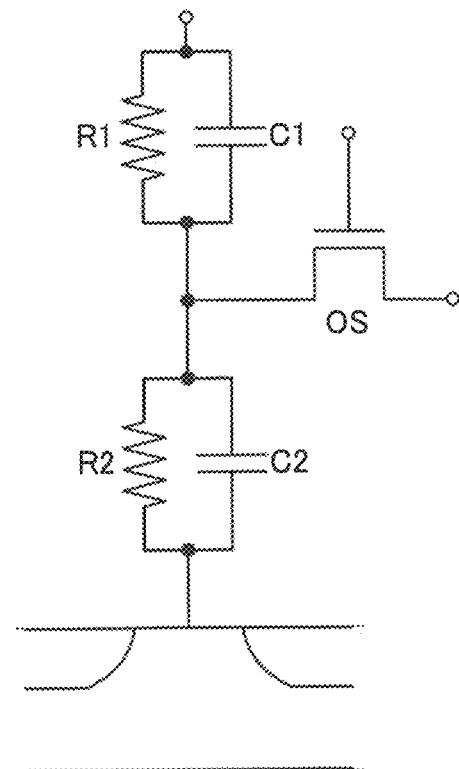

The components such as transistors in the semiconductor device in FIG. 15A can be regarded as being composed of a resistor and a capacitor as shown in FIG. 15B r. That is, in FIG. 15B, the transistor 160 and the capacitor 164 are each regarded as including a resistor and a capacitor. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of so-called gate capacitance (capacitance formed between the gate electrode and the source electrode or the drain electrode and capacitance formed between the gate electrode and the channel formation region).

An electron holding period (also referred to as a data storing period) is determined mainly by an off current of the transistor 162 under the conditions that gate leakage of the transistor 162 is sufficiently small and that R1≥ROS and R2≥ROS are satisfied, where the resistance value (also referred to as effective resistance) between the source electrode and the drain electrode in the case where the transistor 162 is off is ROS.

On the other hand, when the conditions are not met, it is difficult to sufficiently secure the holding period even if the off current of the transistor 162 is small enough. This is because a leakage current other than the off current of the transistor 162 (e.g., a leakage current generated between the source electrode and the gate electrode) is large. Thus, it can be said that the semiconductor device disclosed in this embodiment desirably satisfies the above relation.

It is desirable that C1≥C2 be satisfied. If C1 is large, variation in potential of the fifth line can be suppressed when the potential of the floating gate portion FG is controlled by the fifth line (e.g., at the time of reading).

When the above relation is satisfied, a more preferable semiconductor device can be realized. Note that R1 and R2 are controlled by the gate insulating layer of the transistor 160 and the insulating layer of the capacitor 164. The same relation is applied to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current flows in applying a high electrical field.

Further, because of the above principle of a flash memory, deterioration of an insulating film proceeds and thus another problem of the limit on the number of times of rewriting (approximately $10^4$ to $10^5$ times) occurs.

The semiconductor device according to the disclosed invention is operated by switching of a transistor including an oxide semiconductor and does not use the above-described principle of charge injection by a tunneling current. That is, a high electrical field for charge injection is not necessary unlike a flash memory. Accordingly, it is not necessary to consider an influence of a high electrical field from a control gate on an adjacent cell, which facilitates high integration.

Further, charge injection by a tunneling current is not utilized, which means that there is no causes for deterioration of a memory cell. In other words, the semiconductor device according to the disclosed invention has higher durability and reliability than a flash memory.

In addition, it is also advantageous that a high electrical field is unnecessary and a large supplemental circuit (such as a booster circuit) is unnecessary as compared to a flash memory.

In the case where the dielectric constant εr1 of the insulating layer included in C1 is different from the dielectric constant εr2 of the insulating layer included in C2, it is easy to satisfy C1≥C2 while 2·S2≥S1 (desirably, S2≥S1) is satisfied where S1 is the area of C1 and S2 is the area of C2. Specifically, for example, a film formed of a high-k material such as hafnium oxide or a stack of a film formed of a high-k material such as hafnium oxide and a film formed of an oxide semiconductor is used for C1 so that εr1 can be set to 10 or more, preferably 15 or more, and silicon oxide is used for C2 so that εr2 can be set to 3 to 4. Combination of such structures enables high integration of the semiconductor device according to the disclosed invention.

Note that in the above description, an n-channel transistor is used. However, it is needless to say that a p-channel transistor can be used instead of the n-channel transistor.

As described above, a semiconductor device according to an embodiment of the disclosed invention has a nonvolatile memory cell including a writing transistor where a leakage current (off current) between a source and a drain is small in an off state, a reading transistor formed of a semiconductor material different from that of the writing transistor, and a capacitor.

The off current of the writing transistor is 100 zA ($1\times10^{-19}$ A) or less, preferably 10 zA ($1\times10^{-20}$ A) or less at room temperature (e.g., 25° C.), more preferably 1 zA ($1\times10^{-21}$ A) or less at room temperature (e.g., 25° C.). In the case of a general silicon semiconductor, it is difficult to achieve a small off current as described above. However, in a transistor obtained by processing an oxide semiconductor under an appropriate condition, a small off current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, rising of a writing pulse given to the floating gate portion FG can be very sharp. Further, an off current is small and thus, the amount of charge held in the floating gate portion FG can be reduced. That is, by using a transistor including an oxide semiconductor, rewriting of data can be performed at high speed.

As for the reading transistor, it is desirable to use a transistor which operates at high speed in order to increase the reading rate. For example, a transistor with a switching rate of 1 nano second or lower is preferably used as the reading transistor.

Data is written to the memory cell by turning on the writing transistor so that a potential is supplied to the floating gate portion FG where one of a source electrode and a drain electrode of the writing transistor, one of electrodes of the capacitor, and a gate electrode of the reading transistor are electrically connected, and then turning off the writing transistor so that the predetermined amount of charge is held in the floating gate portion FG. Here, the off current of the writing transistor is very small; thus, the charge supplied to the floating gate portion FG is held for a long time. When an off current is, for example, substantially 0, refresh operation needed for a conventional DRAM can be unnecessary or the frequency of refresh operation can be significantly low (for example, about once a month or a year). Accordingly, power consumption of a semiconductor device can be reduced sufficiently.

Further, data can be rewritten directly by overwriting of new data to the memory cell. Therefore, erasing operation which is necessary for a flash memory or the like is not needed, and reduction in operation speed, which is attributed to erasing operation, can be suppressed. In other words, high-speed operation of the semiconductor device can be realized. Moreover, a high voltage needed for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower or 3 V or lower in each memory cell in the case where data of two stages (one bit) is written.

The memory cell provided in the semiconductor device according to the disclosed invention may include at least the writing transistor and the reading transistor; therefore, for example, the area of each memory cell can be sufficiently small as compared to an SRAM which requires six transistors in each memory cell. In other words, memory cells can be arranged in a semiconductor device at high density.

In a conventional floating gate transistor, charge travels in a gate insulating film (tunnel insulating film) during writing operation, so that deterioration of the gate insulating film (tunnel insulating film) cannot be avoided. In contrast, in the memory cell according to an embodiment of the present invention, data is written by switching operation of a writing transistor; therefore, there is no deterioration of a gate insulating film. This means that there is no limit on the number of times of writing in principle and rewriting durability is very high. For example, in the memory cell according to one embodiment of the present invention, the current-voltage characteristic is not degraded even after data is written $1\times10^9$ or more times (one billion or more times).

Further, in the case of using a transistor including an oxide semiconductor as the writing transistor of the memory cell, the current-voltage characteristic of the memory cell is not degraded even at, for example, a high temperature of 150° C. because an oxide semiconductor generally has a wide energy gap (e.g., 3.0 to 3.5 eV in the case of an In—Ga—Zn—O-based oxide semiconductor) and extremely few thermally excited carriers.

By using such a transistor having excellent characteristics as the writing transistor of the memory cell, a semiconductor device having a novel feature can be provided.

The methods and structures described in this embodiment can be combined as appropriate with any of the methods and structures described in the other embodiments.

Embodiment 3

In this embodiment, application examples of a semiconductor device according to another embodiment of the disclosed invention will be described with reference to FIG. 16, FIGS. 17A and 17B, FIGS. 18A to 18C, FIG. 19, FIG. 20, and FIG. 21.

Figure 16:
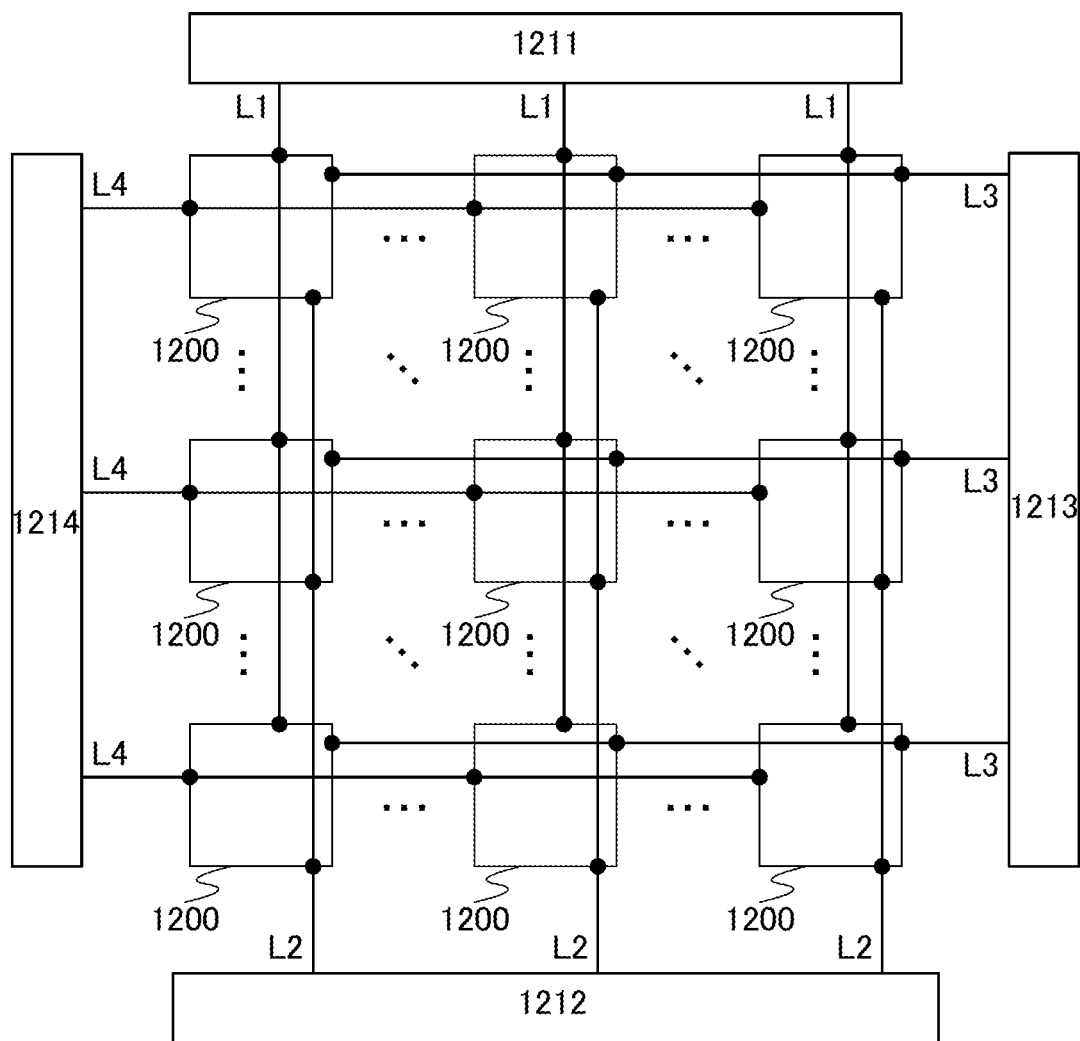
FIG. 16 is a circuit diagram of a semiconductor device.

FIG. 16 illustrates a schematic of a semiconductor device according to this embodiment.

FIG. 16 is an example of a circuit diagram of a semiconductor device including a plurality of semiconductor devices (hereinafter also referred to as memory cells 1200) illustrated in FIG. 1 or FIG. 15A.

The semiconductor device in FIG. 16 includes a memory cell array where the plurality of memory cells 1200 are arranged in matrix, a first driver circuit 1211, a second driver circuit 1212, a third driver circuit 1213, a fourth driver circuit 1214, a plurality of lines L1 electrically connected to the first driver circuit 1211, a plurality of lines L2 electrically connected to the second driver circuit 1212, a plurality of lines L3 electrically connected to the third driver circuit 1213, and a plurality of lines L4 electrically connected to the fourth driver circuit 1214.

As illustrated in FIG. 16, the lines L1, L2, L3, and L4 are electrically connected to each of the memory cells 1200. Thus, operation of each of the memory cells 1200 can be controlled using the first driver circuit 1211, the second driver circuit 1212, the third driver circuit 1213, and the fourth driver circuit 1214. The memory cells 1200 are arranged in matrix and the lines L1, L2, L3, and L4 are provided in a low direction or a column direction in a grid pattern, whereby writing operation and reading operation of the semiconductor device may be performed in each row or each column of the memory cells 1200.

Note that one line from each of the first driver circuit 1211 to the fourth driver circuit 1214 is electrically connected to the memory cell 1200 in FIG. 16; however, the disclosed invention is not limited to this. Plural lines from any one or some of the driver circuits may be electrically connected to the memory cell 1200. Alternatively, a structure may be employed in which a line of any one of the driver circuits or lines of some of the driver circuits is/are not electrically connected to any one or some of the memory cells 1200.

In the semiconductor device in FIG. 16, the first driver circuit 1211, the second driver circuit 1212, the third driver circuit 1213, and the fourth driver circuit 1214 are separately provided; however, the disclosed invention is not limited to this. A driver circuit having any one or some of the functions may alternatively be used. Note that the driver circuit is desirably formed using a single crystal semiconductor material in order to secure an adequate operation speed. For example, bulk silicon (a so-called silicon wafer) is preferably used.

Next, more concrete configuration examples will be described.

Figure 17A:
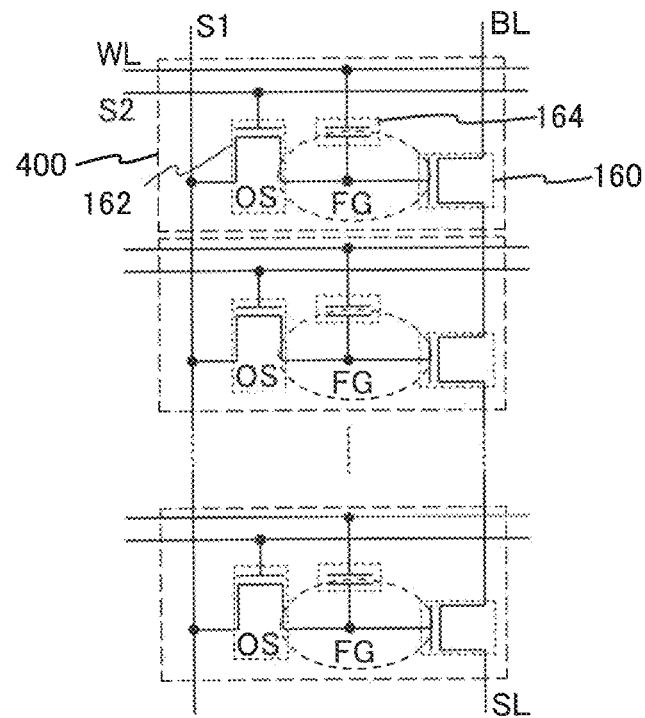
FIGS. 17A and 17B are circuit diagrams of semiconductor devices.
Figure 17B:
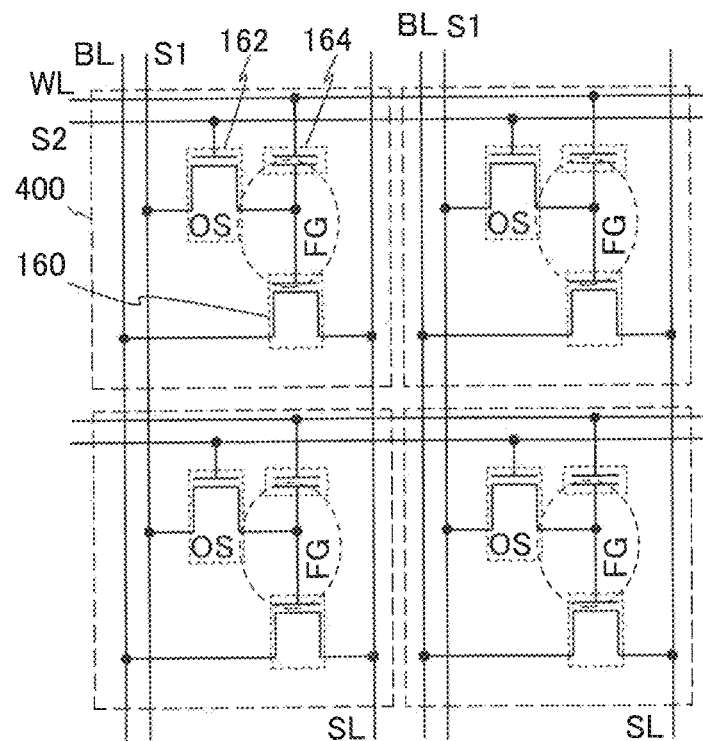

FIGS. 17A and 17B are examples of circuit diagrams of semiconductor devices each including a plurality of semiconductor devices (hereinafter also referred to as memory cells 400) illustrated in FIG. 15A. FIG. 17A is a circuit diagram of a so-called NAND semiconductor device in which the memory cells 400 are connected in series, and FIG. 17B is a circuit diagram of a so-called NOR semiconductor device in which the memory cells 400 are connected in parallel.

The semiconductor device in FIG. 17A includes a source line SL, a bit line BL, a first signal line S1, a plurality of second signal lines S2, a plurality of word lines WL, and the plurality of memory cells 400. In FIG. 17A, one source line SL and one bit line BL are provided in the semiconductor device; however, an embodiment of the disclosed invention is not limited to this. A plurality of source lines SL and a plurality of bit lines BL may be provided.

In each of the memory cells 400, a gate electrode of the transistor 160, one of a source electrode and a drain electrode of the transistor 162, and one of electrodes of the capacitor 164 are electrically connected to one another. The first signal line S1 and the other of the source electrode and the drain electrode of the transistor 162 are electrically connected to each other, and the second signal line S2 and a gate electrode of the transistor 162 are electrically connected to each other. The word line WL and the other of the electrodes of the capacitor 164 are electrically connected to each other.

Further, the source electrode of the transistor 160 included in the memory cell 400 is electrically connected to the drain electrode of the transistor 160 in the adjacent memory cell 400. The drain electrode of the transistor 160 included in the memory cell 400 is electrically connected to the source electrode of the transistor 160 in the adjacent memory cell 400. Note that the drain electrode of the transistor 160 included in the memory cell 400 of the plurality of memory cells connected in series, which is provided at one of ends, is electrically connected to the bit line BL. The source electrode of the transistor 160 included in the memory cell 400 of the plurality of memory cells connected in series, which is provided at the other end, is electrically connected to the source line SL.

In the semiconductor device in FIG. 17A, writing operation and reading operation are performed in each row. The writing operation is performed as follows. A potential at which the transistor 162 is turned on is supplied to the second signal line S2 of a row where writing is to be performed, so that the transistor 162 of the row where writing is to be performed is turned on. Accordingly, a potential of the first signal line S1 is supplied to the gate electrode of the transistor 160 of the specified row, so that predetermined charge is given to the gate electrode. Thus, data can be written to the memory cell of the specified row.

Further, the reading operation is performed as follows. First, a potential at which the transistor 160 is turned on regardless of charge given to the gate electrode thereof is supplied to the word lines WL of the rows other than the row where reading is to be performed, so that the transistors 160 of the rows other than the row where reading is to be performed are turned on. Then, a potential (reading potential) at which an on state or an off state of the transistor 160 is determined depending on charge in the gate electrode of the transistor 160 is supplied to the word line WL of the row where reading is to be performed. After that, a constant potential is supplied to the source line SL so that a reading circuit (not illustrated) connected to the bit line BL is operated. Here, the plurality of transistors 160 between the source line SL and the bit line BL are on except the transistors 160 of the row where reading is to be performed; therefore, conductance between the source line SL and the bit line BL is determined by a state (an on state or an off state) of the transistors 160 of the row where reading is to be performed. The conductance of the transistors 160 on which reading is performed depends on charge in the gate electrodes thereof. Thus, a potential of the bit line BL varies accordingly. By reading the potential of the bit line BL with the reading circuit, data can be read from the memory cells of the specified row.

The semiconductor device in FIG. 17B includes a plurality of source lines SL, a plurality of bit lines BL, a plurality of first signal lines S1, a plurality of second signal lines S2, a plurality of word lines WL, and a plurality of the memory cells 400. A gate electrode of the transistor 160, one of a source electrode and a drain electrode of the transistor 162, and one of electrodes of the capacitor 164 are electrically connected to one another. The source line SL and a source electrode of the transistor 160 are electrically connected to each other. The bit line BL and a drain electrode of the transistor 160 are electrically connected to each other. The first signal line S1 and the other of the source electrode and the drain electrode of the transistor 162 are electrically connected to each other, and the second signal line S2 and a gate electrode of the transistor 162 are electrically connected to each other. The word line WL and the other of the electrodes of the capacitor 164 are electrically connected to each other.

In the semiconductor device in FIG. 17B, writing operation and reading operation are performed in each row. The writing operation is performed in a manner similar to that of the semiconductor device in FIG. 17A. The reading operation is performed as follows. First, a potential at which the transistor 160 is turned off regardless of charge given to the gate electrode thereof is supplied to the word lines WL of the rows other than the row where reading is to be performed, so that the transistors 160 of the rows other than the row where reading is to be performed are turned off. Then, a potential (reading potential) at which an on state or an off state of the transistor 160 is determined depending on charge in the gate electrode thereof is supplied to the word line WL of the row where reading is to be performed. After that, a constant potential is supplied to the source lines SL so that a reading circuit (not illustrated) connected to the bit lines BL is operated. Here, conductance between the source lines SL and the bit lines BL is determined by a state (an on state or an off state) of the transistors 160 of the row where reading is to be performed. That is, a potential of the bit lines BL depends on charge in the gate electrodes of the transistors 160 of the row where reading is to be performed. By reading a potential of the bit lines BL with the reading circuit, data can be read from the memory cells of the specified row.

Although the amount of data which can be stored in each of the memory cells 400 is one bit in the above description, the structure of the memory device of this embodiment is not limited to this. The amount of data which is stored in each of the memory cells 400 may be increased by preparing three or more potentials to be supplied to the gate electrode of the transistor 160. For example, in the case where the number of potentials to be supplied to the gate electrode of the transistor 160 is four, data of two bits can be stored in each of the memory cells.

Next, examples of reading circuits which can be used for the semiconductor devices in FIGS. 17A and 17B, or the like will be described with reference to FIGS. 18A to 18C.

Figure 18A:
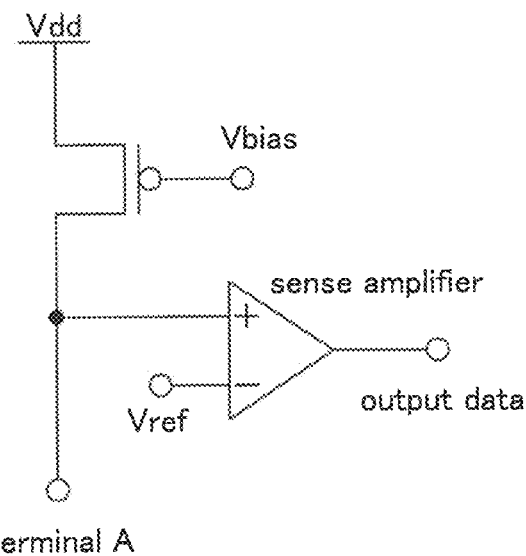
FIGS. 18A to 18C are circuit diagrams of a semiconductor device.

FIG. 18A illustrates a schematic of the reading circuit. The reading circuit includes a transistor and a sense amplifier circuit.

At the time of reading data, a terminal A is connected to a bit line BL to which a memory cell from which data is to be read is connected. Further, a bias potential Vbias is applied to a gate electrode of a transistor so that a potential of the terminal A is controlled.

The resistance of the memory cell 400 varies depending on stored data. Specifically, when the transistor 160 of the selected memory cell 400 is on, the memory cell 400 has a low resistance, whereas when the transistor 160 of the selected memory cell 400 is off, the memory cell 400 has a high resistance.

When the memory cell has a high resistance, a potential of the terminal A is higher than a reference potential Vref and the sense amplifier circuit outputs a potential corresponding to the potential of the terminal A. On the other hand, when the memory cell has a low resistance, the potential of the terminal A is lower than the reference potential Vref and the sense amplifier circuit outputs a potential corresponding to the potential of the terminal A.

Thus, by using the reading circuit, data can be read from the memory cell. Note that the reading circuit of this embodiment is one of examples. Another circuit may be used. The reading circuit may further include a precharge circuit. Instead of the reference potential Vref, a reference bit line BL may be connected to the sense amplifier circuit.

Figure 18B:
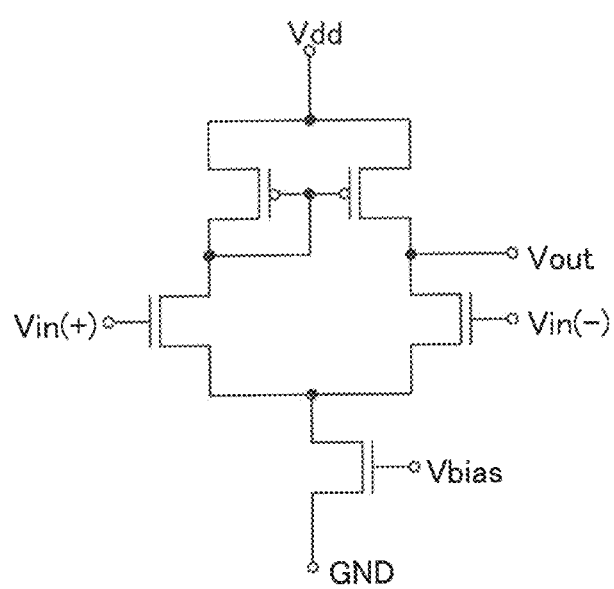

FIG. 18B illustrates a differential sense amplifier which is an example of sense amplifier circuits. The differential sense amplifier has an input terminals Vin (+) and Vin (−) and an output terminal Vout and amplifies the potential difference between Vin (+) and Vin (−). If the potential of Vin (+) is higher than the potential of Vin (−), Vout outputs a signal High, whereas if the potential of Vin (+) is lower than the potential of Vin (−), Vout outputs a signal Low. In the case where the differential sense amplifier is used for the reading circuit, one of Vin (+) and Vin (−) is connected to the terminal A, and the reference potential Vref is supplied to the other of Vin (+) and Vin (−).

Figure 18C:
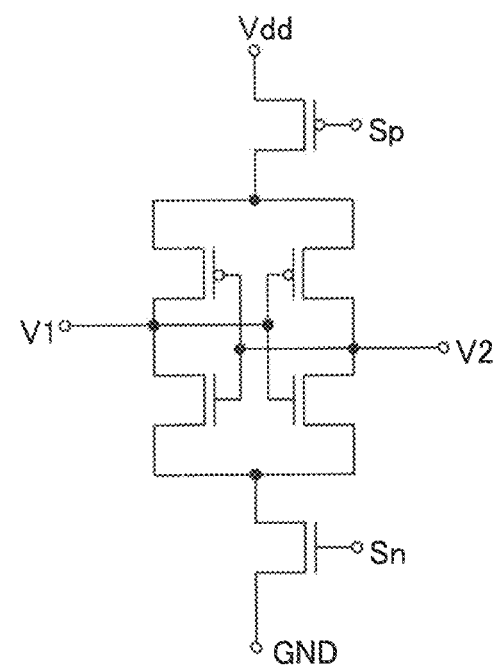

FIG. 18C illustrates a latch sense amplifier which is an example of sense amplifier circuits. The latch sense amplifier has input/output terminals V1 and V2 and input terminals of control signals Sp and Sn. First, the control signals Sp and Sn are set to a signal High and a signal Low, respectively, and a power supply potential (Vdd) is interrupted. Then, respective potentials V1in and V2in for comparison are supplied to V1 and V2, respectively. After that, the control signals Sp and Sn are set to a signal Low and a signal High, respectively, and a power supply potential (Vdd) is supplied. If V1in>V2in is satisfied for the potentials for comparison V1in and V2in, an output from V1 is a signal High and an output from V2 is a signal Low, whereas an output from V1 is a signal Low and an output from V2 is a signal High if V1in<V2in is satisfied. By utilizing such a relation, the difference between V1in and V2in can be amplified. In the case where the latch sense amplifier is used for the reading circuit, one of V1 and V2 is connected to the terminal A and the output terminal through a switch, and the reference potential Vref is supplied to the other of V1 and V2.

Figure 19:
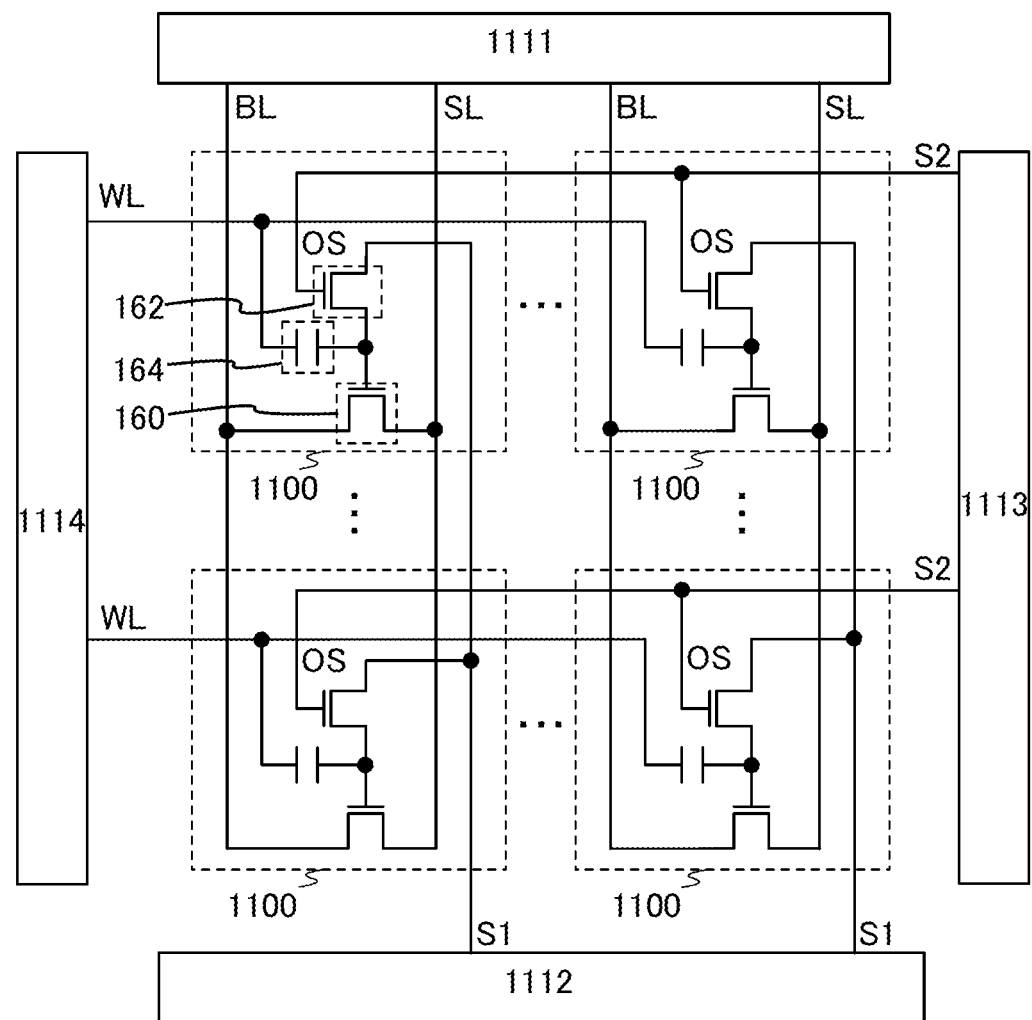
FIG. 19 is a circuit diagram of a semiconductor device.

FIG. 19 is an example of a circuit diagram of a semiconductor device including a plurality of the semiconductor devices in FIG. 15A. The semiconductor device in FIG. 19 has memory capacity of m×n bits.

The semiconductor device in FIG. 19 includes a memory cell array where m word lines WL, m second signal lines S2, n bit lines BL, n source lines SL, n first signal lines S1, and a plurality of memory cells 1100 are arranged in matrix of m (rows) (in a vertical direction)×n (columns) (in a horizontal direction) (m and n are natural numbers) and peripheral circuits of a first driver circuit 1111, a second driver circuit 1112, a third driver circuit 1113, and a fourth driver circuit 1114. Here, the configuration described in any of the foregoing embodiments (e.g., the configuration in FIG. 15A) is applied to the memory cell 1100.

That is, each of the memory cells 1100 includes the first transistor 160, the second transistor 162, and the capacitor 164. A gate electrode of the first transistor 160, one of a source electrode and a drain electrode of the second transistor 162, and one of electrodes of the capacitor 164 are connected to one another. The source line SL and a source electrode of the first transistor 160 are connected to each other. The bit line BL and a drain electrode of the first transistor 160 are connected to each other. The first signal line S1 and the other of the source electrode and the drain electrode of the second transistor 162 are connected to each other. The second signal line S2 and a gate electrode of the second transistor 162 are connected to each other. The word line WL and the other of the electrodes of the capacitor 164 are connected to each other.

Further, the memory cells 1100 are connected in parallel between the source line SL and the bit line BL. For example, the memory cell 1100 of an i-th row and a j-column (i,j) (i is an integer which is larger than or equal to 1 and smaller than or equal to m, and j is an integer which is larger than or equal to 1 and smaller than or equal to n) is connected to the source lines SL(j), the bit lines BL(j), the first signal lines S1(j), the word lines WL(i), and the second signal lines S2(i).

The source lines SL and the bit lines BL are connected to the first driver circuit 1111. The first signal lines S1 are connected to the second driver circuit 1112. The second signal lines S2 are connected to the third driver circuit 1113. The word lines WL are connected to the fourth driver circuit 1114. Note that here, the first driver circuit 1111, the second driver circuit 1112, the third driver circuit 1113, and the fourth driver circuit 1114 are separately provided; however, the disclosed invention is not limited to this. A decoder having any one or some of the functions may alternatively be used.

Next, writing operation and reading operation of the semiconductor device in FIG. 19 will be described with reference to a timing chart in FIG. 20.

Although operation of semiconductor devices of two rows and two columns will be described for simplification, the disclosed invention is not limited to this.

Figure 20:
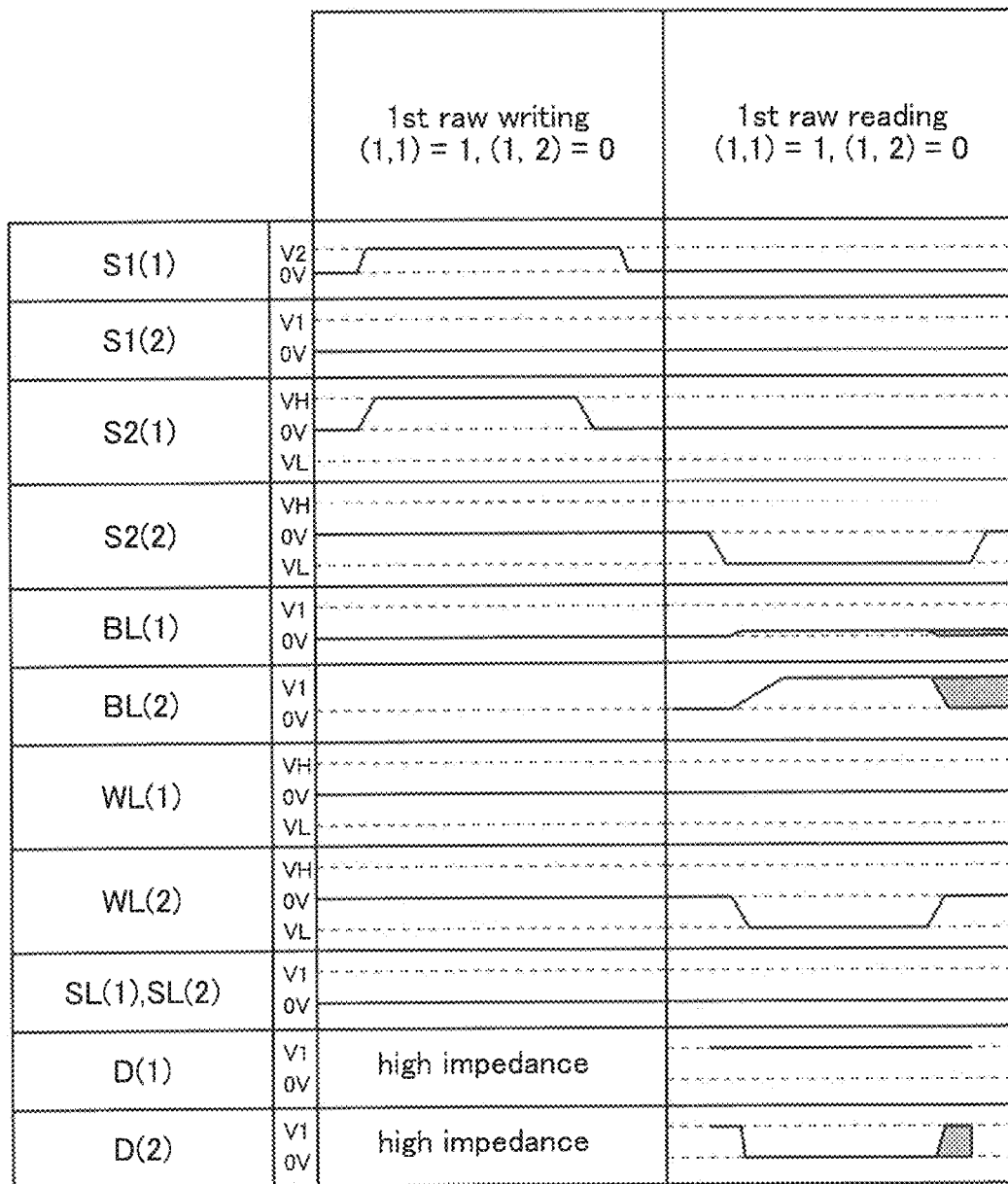
FIG. 20 is a timing chart for illustrating the relation of potentials.

FIG. 20 is a chart illustrating operation of the semiconductor device in FIG. 19. In FIG. 20, S1(1) and S1(2) are potentials of the first signal line S1; S2(1) and S2(2) are potentials of the second signal line S2; BL(1) and BL(2) are potentials of the bit line BL; WL(1) and WL(2) are potentials of the word line WL; and SL(1) and SL(2) are potentials of the source line SL.

First, writing data to the memory cell (1,1) and the memory cell (1,2) which are in the first row and reading data from the memory cell (1,1) and the memory cell (1,2) which are in the first row will be described. Note that in the following description, it is assumed that data to be written to the memory cell (1,1) is "1" and data to be written to the memory cell (1,2) is "0".

First, the writing will be described. In a writing period of the first row, a potential VH is supplied to the second signal line S2(1) of the first row so that the second transistors 162 of the first row are turned on. Further, a potential of 0 V is supplied to the second signal line S2(2) of the second row so that the second transistors 162 of the second row are turned off.

Next, the potential V2 and a potential 0 V are applied to the first signal line S1(1) of the first column and the first signal line S1(2) of the second column, respectively.

As a result, the potential V2 and a potential 0 V are applied to a floating gate portion FG of the memory cell (1,1) and a floating gate portion FG of the memory cell (1,2), respectively. Here, the potential V2 is higher than the threshold voltage of the first transistors 160. Then, the potential of the second signal line S2(1) of the first row is set to 0 V so that the second transistors 162 of the first row are turned off. Thus, the writing is completed.

Note that the word lines WL(1) and WL(2) are at a potential of 0 V. Further, before the potential of the first signal line S1(1) of the first row is changed, the potential of the second signal line S2(1) of the first row is set to 0 V. The threshold voltage of a memory element to which data has been written is Vw0 in the case of data "0" and Vw1 in the case of data "1", assuming that a terminal connected to the word line WL is a control gate electrode, the source electrode of the first transistor 160 is a source electrode, and the drain electrode of the second transistor 162 is a drain electrode, in the memory element. Here, the threshold voltage of the memory cell means a voltage of the terminal connected to the word line WL, which changes resistance between the source electrode and the drain electrode of the first transistor 160. Note that Vw0>0>Vw1 is satisfied.

Then, the reading will be described. In a reading period of the first row, a potential 0 V and the potential VL are supplied to the word line WL(1) of the first row and the word line WL(2) of the second row, respectively. The potential VL is lower than the threshold voltage Vw1. When WL(1) is at a potential of 0 V, in the first row, the first transistor 160 of the memory cell (1,2) in which data "0" is stored is off, and the first transistor 160 of the memory cell (1,1) in which data "1" is stored is on. When WL(2) is at the potential VL, in the second row, the first transistors 160 of the memory cells (2,1) and (2,2) in which either data "0" or data "1" is stored is off.

Next, a potential of 0 V is supplied to the source line SL(1) of the first column and the source line SL(2) of the second column.

As a result, the first transistor 160 of the memory cell (1,1) between the bit line BL(1) and the source line SL(1) is turned on, thereby having a low resistance, and the first transistor 160 of the memory cell (1,2) between the bit line BL(2) and the source line SL(2) is turned off, thereby having a high resistance. A reading circuit connected to the bit line BL(1) and the bit line BL(2) can read data based on a difference in resistance between the bit lines.

Further, a potential of 0 V and the potential VL are supplied to the second signal line S2(1) and the second signal line S2(2), respectively, so that all the second transistors 162 are turned off. The potential of the floating gate portion FG of the first row is 0 V or V2; thus, the potential of the second signal line S2(1) is set to 0 V, whereby all the second transistors 162 of the first row can be turned off. On the other hand, the potential of the floating gate portion FG of the second row is lower than the potential at the time directly after data writing if the potential VL is supplied to the word line WL(2). Therefore, to prevent the second transistor 162 from being turned on, the potential of the second signal line S2(2) is set to low similarly to the potential of the word line WL(2). Thus, all the second transistors 162 can be turned off.

Figure 21:
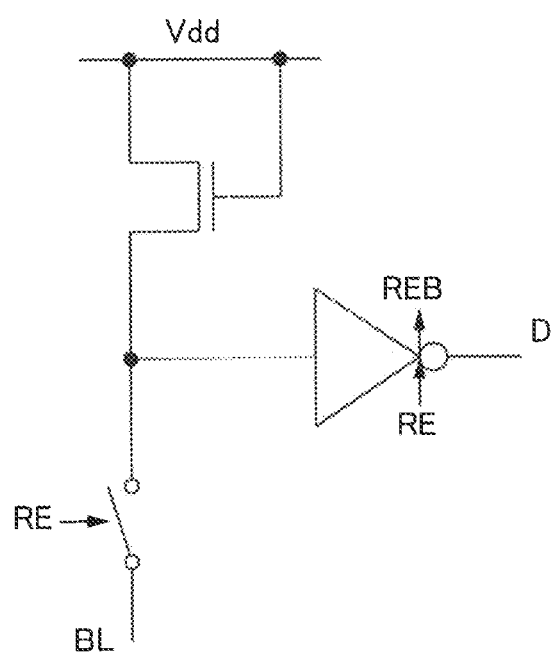
FIG. 21 is a circuit diagram of a semiconductor device.

Next, an output potential in the case where a circuit in FIG. 21 is used as a reading circuit will be described. Since the resistance between the bit line BL(1) and the source line SL(1) is low, a low potential is supplied to a clocked inverter and an output D(1) is a signal High. Since the resistance between the bit line BL(2) and the source line SL(2) is high, a high potential is supplied to the clocked inverter and an output D(2) is a signal Low.

As for the operating voltage, it can be assumed that for example, VDD=2 V, V2=1.5 V, VH=2V, and VL=-2 V are satisfied.

As described in this embodiment, by providing a plurality of memory cells, memory capacity of a semiconductor device can be increased. Note that the number and arrangement of memory cells, the number and arrangement of lines, the number and arrangement of driver circuits, and the like can be designed as appropriate; therefore, they are not limited to the above structures.

The methods and structures described in this embodiment can be combined as appropriate with any of the methods and structures described in the other embodiments.

Embodiment 4

In this embodiment, a structure and a manufacturing method of a semiconductor device according to another embodiment of the disclosed invention, which are different from those of Embodiments 1 and 2, will be described with reference to FIGS. 22A and 22B, FIGS. 23A to 23D, and FIGS. 24A to 24C. Note that a transistor 260, a transistor 262, and a capacitor 264 which are to be described in this embodiment can be used respectively as the transistor 160, the transistor 162, and the capacitor 164 which are in the circuit diagrams of the foregoing embodiments.

<Cross-Sectional Structure and Planar Structure of Semiconductor Device>

Figure 22A:
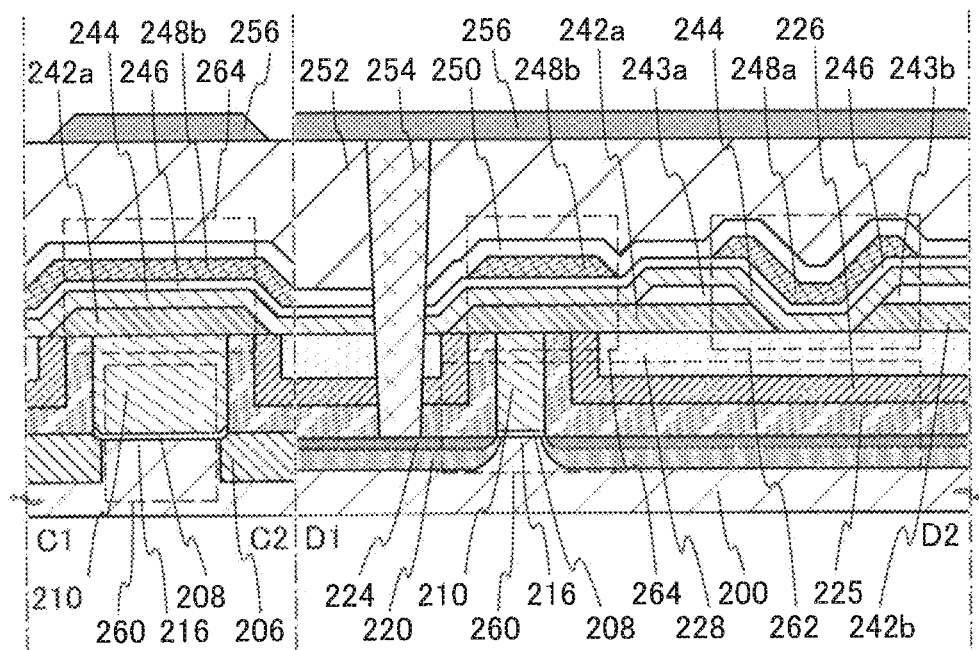
FIGS. 22A and 22B are a cross-sectional view and a plan view for illustrating a semiconductor device.
Figure 22B:
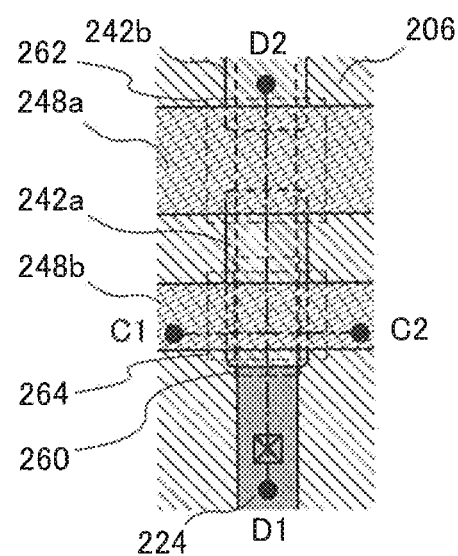

FIGS. 22A and 22B illustrate an example of a structure of the semiconductor device. FIG. 22A illustrates a cross section of the semiconductor device, and FIG. 22B illustrates a plan view of the semiconductor device. Here, FIG. 22A corresponds to a cross section along line C1-C2 and line D1-D2 in FIG. 22B. In the plan view of FIG. 22B, some of components, such as the source/drain electrode 254 and the line 256, are omitted to avoid complexity. The semiconductor device illustrated in FIGS. 22A and 22B includes the transistor 260 including a semiconductor material other than an oxide semiconductor in a lower portion, and the transistor 262 including an oxide semiconductor in an upper portion. A transistor formed using a semiconductor material other than an oxide semiconductor can operate at high speed easily. On the other hand, a transistor including an oxide semiconductor can hold charge for a long time owing to its characteristics.

Although all the transistors are n-channel transistors here, it is needless to say that p-channel transistors can be used. Since the technical nature of the disclosed invention is to use an oxide semiconductor in the transistor 262 so that data can be stored, it is not necessary to limit a specific structure of a semiconductor device to the structure described here.

In the semiconductor device in FIGS. 22A and 22B, the transistor 262 and the capacitor 264 are provided so as to overlap with the transistor 260. By adopting such a planar layout in FIG. 22B, high integration can be possible. For example, given that the minimum processing dimension is F, the area occupied by a memory cell can be 15 $F^2$ to 25 $F^2$.

The semiconductor device in FIGS. 22A and 22B is different from the semiconductor device described in the foregoing embodiment in that a sidewall insulating layer is not provided in the transistor 260. That is, the semiconductor device in FIGS. 22A and 22B does not include a sidewall insulating layer. Since a sidewall insulating layer is not formed, the impurity region 114 (e.g., see FIGS. 2A and 2B) is not formed. Thus, in the case where a sidewall insulating layer is not provided, high integration is easy as compared to the case where a sidewall insulating layer is provided. In addition, the manufacturing process can be simplified as compared to the case where a sidewall insulating layer is provided.

The semiconductor device in FIGS. 22A and 22B is also different from the semiconductor device of the foregoing embodiment in an interlayer insulating layer provided in the transistor 260. That is, the semiconductor device in FIGS. 22A and 22B includes a hydrogen-containing interlayer insulating layer 225 which is in contact with a metal compound region 224 of the transistor 260. By providing the hydrogen-containing interlayer insulating layer 225 so as to be in contact with the metal compound region 224, hydrogen can be supplied to the transistor 260 to improve characteristics of the transistor 260. As the interlayer insulating layer 225, for example, a silicon nitride layer containing hydrogen, which is formed by a plasma CVD method, is given. Further, by using an insulating layer in which the hydrogen concentration is low as an interlayer insulating layer 226, hydrogen which can adversely affect the transistor 262 can be prevented from entering the transistor 262. As the interlayer insulating layer 226, for example, a silicon nitride layer formed by a sputtering method in the absence of hydrogen is given. When such a structure is employed, the characteristics of the transistors 260 and 262 can be improved sufficiently. Note that in FIGS. 22A and 22B, a substrate 200, an element isolation insulating layer 206 a gate insulating layer 208, a gate electrode 210, a channel formation region 216, a high-concentration impurity region 220, and the metal compound region 224 correspond to the substrate 100, the element isolation insulating layer 106, the gate insulating layer 108, the gate electrode 110, the channel formation region 116, a high-concentration impurity region 120, and the metal compound region 124 which are in Embodiment 1, respectively.

The semiconductor device in FIGS. 22A and 22B is also different from the semiconductor device of the foregoing embodiment in that insulating layers 243a and 243b are provided between an oxide semiconductor layer 244 and a source electrode 242a and between the oxide semiconductor layer 244 and a drain electrode 242b, respectively, in the transistor 262. By thus providing the insulating layers 243a and 243b, so-called gate capacitance formed by a gate electrode 248a and the source electrode 242a (or the gate electrode 248a and a drain electrode 242b) can be reduced to increase the operating speed of the transistor 262.

Note that as in Embodiment 1, the source electrode 242a is formed directly on the gate electrode 210, whereby the transistor 260 in the lower portion and the transistor 262 in the upper portion are electrically connected to each other. With such a structure, an integration degree can be increased as compared to the case where an electrode and a line are provided additionally. In addition, the manufacturing process can be simplified.

Although the structure including all the differences is described in this embodiment, a structure including any one of the differences may be employed.

<Method for Manufacturing Semiconductor Device>

Next, an example of a method for manufacturing the aforementioned semiconductor device will be described. Hereinafter, steps performed after formation of the transistor 260 in the lower portion and a method for manufacturing the transistor 262 in the upper portion will be described with reference to FIGS. 23A to 23D and FIGS. 24A to 24C. The transistor 260 in the lower portion can be formed by a method similar to the method described in Embodiment 1. Embodiment 1 can be referred to for the details. Note that the capacitor 264 is provided in this embodiment. In addition, three interlayer insulating layers 225, 226, and 228 are formed so as to cover the transistor 260 in this embodiment. Note that the source/drain electrodes 130a and 130b in Embodiment 1 are not formed through the manufacturing process of the transistor 260 in this embodiment, and even the structure in which the source/drain electrodes 130a and 130b are not formed is called the transistor 260 for convenience.

The transistor 260 in the lower portion is formed by the method described in Embodiment 1 first, and then, a portion over a top surface of the gate electrode 210 of the transistor 260 is removed. For the removing step, polishing treatment such as CMP (chemical mechanical polishing) may be used. Thus, portions of the interlayer insulating layers 225, 226, and 228 over the top surface of the gate electrode 210 are removed. Note that the surface subjected to such polishing treatment is planarized sufficiently, whereby an electrode, a line, an insulating layer, a semiconductor layer, or the like can be formed favorably in later steps.

Figure 23A:
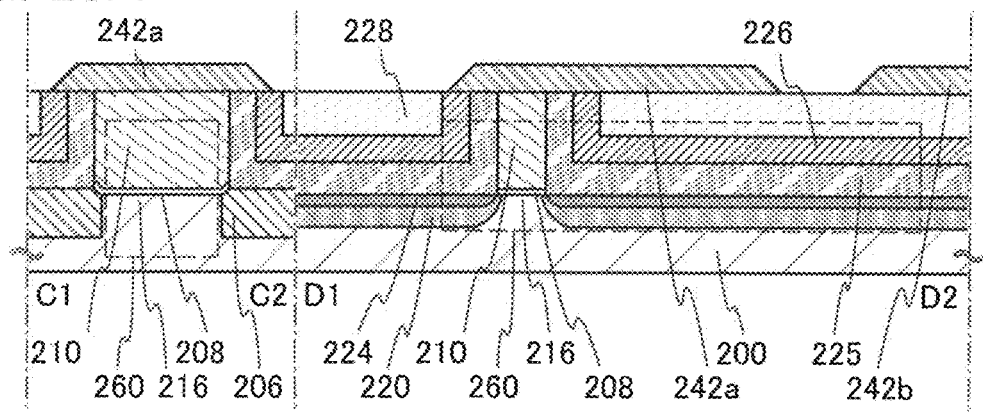
FIGS. 23A to 23D are cross-sectional views illustrating the semiconductor device.

Then, a conductive layer is formed over the gate electrode 210 and the interlayer insulating layers 225, 226, and 228, and the conductive layer is selectively etched, so that the source and drain electrodes 242a and 242b are formed (see FIG. 23A). Here, the source electrode 242a is formed in direct contact with the gate electrode 210.

The conductive layer for forming the source and drain electrodes 242a and 242b can be formed using a material similar to that of the source/drain electrodes 142a and 142b described in Embodiment 1. Further, the conductive layer can be etched by a method similar to the method described in Embodiment 1. Embodiment 1 can be referred to for the details.

Figure 23B:
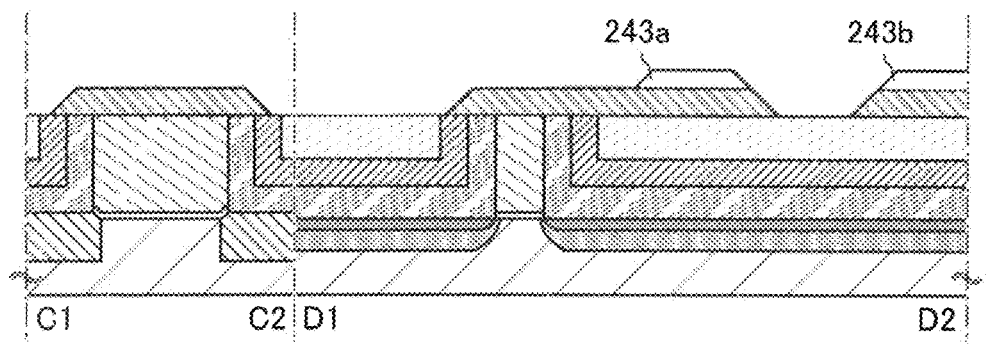

Next, an insulating layer is formed so as to cover the source and drain electrodes 242a and 242b and selectively etched, so that the insulating layer 243a and 243b are formed over the source and drain electrodes 242a and 242b, respectively (see FIG. 23B).

By providing the insulating layers 243a and 243b, parasitic capacitance formed between the gate electrode 248a to be formed later and the source and drain electrodes 242a and 242b can be reduced.

Figure 23C:
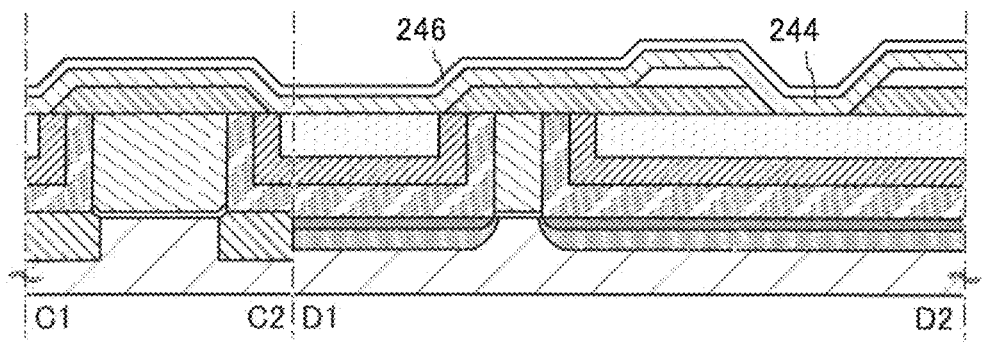

After that, the oxide semiconductor layer 244 is formed so as to cover the source and drain electrodes 242a and 242b, and a gate insulating layer 246 is formed over the oxide semiconductor layer 244 (see FIG. 23C).

The oxide semiconductor layer 244 can be formed using the material and the method of the oxide semiconductor layer 140 described in Embodiment 1. Further, the oxide semiconductor layer 244 is desirably subjected to heat treatment (first heat treatment). Embodiment 1 can be referred to for the details.

The gate insulating layer 246 can be formed using the material and the method of the gate insulating layer 138 described in Embodiment 1. Further, the formed gate insulating layer 246 is desirably subjected to heat treatment (second heat treatment) in an inert gas atmosphere or an oxygen atmosphere. Embodiment 1 can be referred to for the details.

Figure 23D:
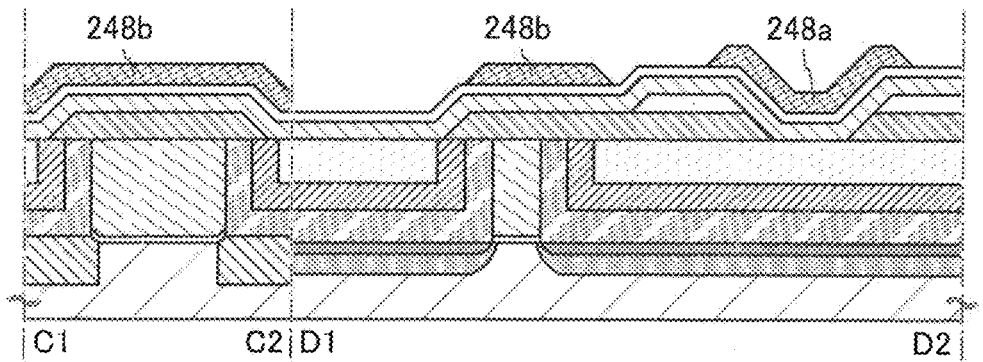

Then, over the gate insulating layer 246, the gate electrode 248a is formed in a region overlapping with a region of the transistor 262, which serves as a channel formation region, and the electrode 248b is formed in a region overlapping with the source electrode 242a (see FIG. 23D).

The gate electrode 248a and the electrode 248b can be formed in such a manner that a conductive layer is formed over the gate insulating layer 246 and then etched selectively. The conductive layer to be the gate electrode 248a and the electrode 248b can be formed by a PVD method typified by a sputtering method or a CVD method such as a plasma CVD method. The details are similar to those of the source electrode 242a or the like; thus, the description thereof can be referred to.

Figure 24A:
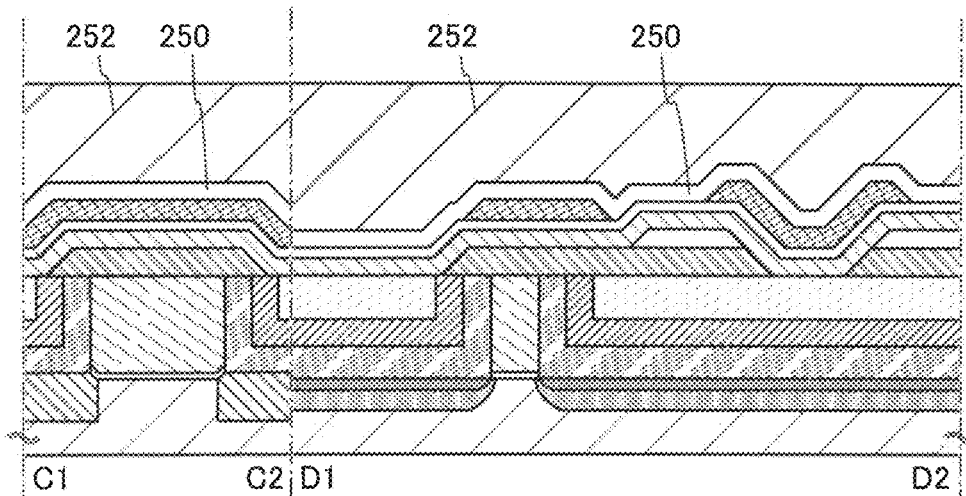
FIGS. 24A to 24C are cross-sectional views illustrating the semiconductor device.

Next, interlayer insulating layers 250 and 252 are formed over the gate insulating layer 246, the gate electrode 248a, and the electrode 248b (see FIG. 24A). The interlayer insulating layers 250 and 252 can be formed using the materials and the methods of the protective insulating layer 144 and the interlayer insulating layer 146 described in Embodiment 1. Embodiment 1 can be referred to for the details.

Note that the interlayer insulating layer 252 is desirably formed so as to have a planarized surface. This is because an electrode, a line, or the like can be favorably formed over the interlayer insulating layer 252 even in the case where the semiconductor device is reduced in size, for example. The interlayer insulating layer 252 can be planarized using a method such as CMP (chemical mechanical polishing).

Figure 24B:
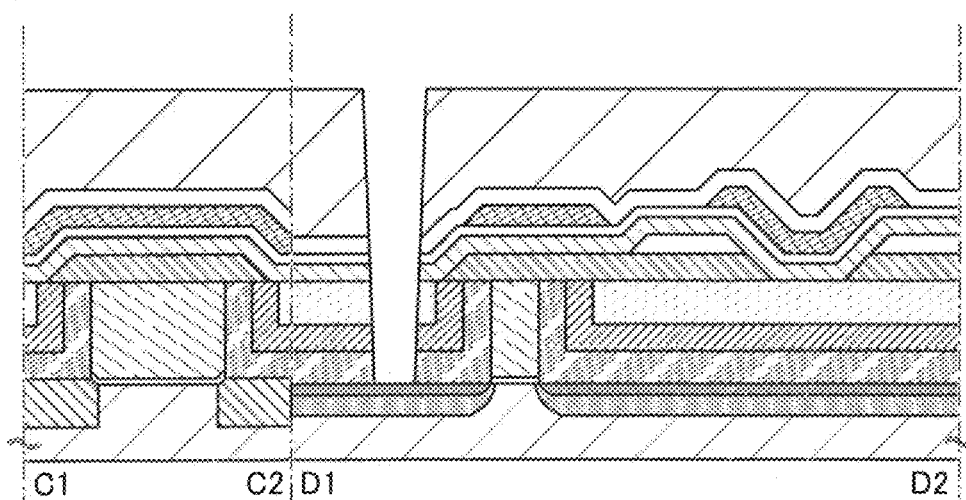
Figure 24C:
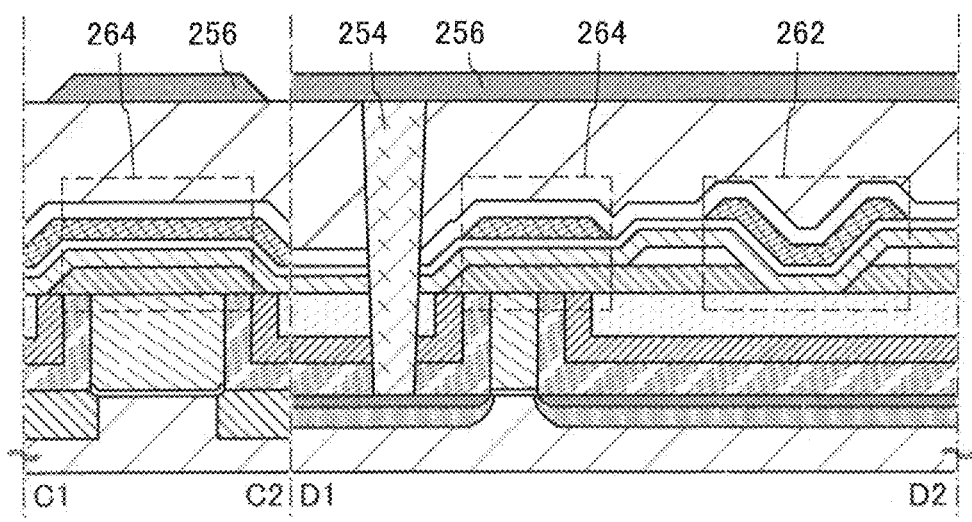

After that, the interlayer insulating layers 225, 226, and 228, the oxide semiconductor layer 244, the gate insulating layer 246, and the interlayer insulating layers 250 and 252 are selectively etched so that an opening that reaches the metal compound region 224 of the transistor 260 is formed (see FIG. 24B). As the etching, either dry etching or wet etching may be used; in terms of microfabrication, dry etching is desirably adopted.

The source/drain electrode 254 is formed so as to be embedded in the opening. Then, the line 256 is formed to be connected to the source/drain electrode 254 (see FIG. 24C).

The source/drain electrode 254 can be formed in such a manner, for example, that a conductive layer is formed in a region including the opening by a PVD method, a CVD method, or the like and then part of the conductive layer is removed by etching, CMP, or the like. Specifically, it is possible to employ a method, for example, in which a thin titanium film is formed in a region including the opening by a PVD method and a thin titanium nitride film is formed by a CVD method, and then, a tungsten film is formed so as to be embedded in the opening. Here, the titanium film formed by a PVD method has a function of reducing an oxide film (e.g., a natural oxide film) formed on a surface over which the titanium film is formed, to decrease the contact resistance with the lower electrodes (e.g., the metal compound region 224, here). The titanium nitride film formed after the formation of the titanium film has a barrier function of preventing diffusion of the conductive material. A copper film may be formed by a plating method after the formation of the barrier film of titanium, titanium nitride, or the like.

The line 256 can be formed in such a manner that a conductive layer is formed in contact with the source/drain electrode 254 and then etched selectively. The conductive layer can be formed by a PVD method typified by a sputtering method or a CVD method such as a plasma CVD method. The details are similar to those of the source electrode 242a or the like.

Thus, the semiconductor device including the transistor 260, the transistor 262, and the capacitor 264 is completed.

In the semiconductor device described in this embodiment, for example, the transistor 262 and the capacitor 264 overlap with the transistor 260, the transistor 260 does not include a sidewall insulating layer, the source electrode 242a is formed directly on the gate electrode 210; therefore, high integration is possible. Further, the manufacturing process is simplified.

Further, in the semiconductor device described in this embodiment, an insulating layer containing hydrogen and an insulating layer with a reduced hydrogen concentration are used as the interlayer insulating layers 225 and 226, respectively; thus, characteristics of the transistors 260 and 262 are improved. Owing to the insulating layers 243a and 243b, so-called gate capacitance is reduced and thus, an operating speed of the transistor 262 is increased.

The above features described in this embodiment make it possible to provide a semiconductor device having significantly excellent characteristics.

The methods and structures described in this embodiment can be combined as appropriate with any of the methods and structures described in the other embodiments.

Embodiment 5

This embodiment describes, with reference to FIGS. 10A to 10F, examples of electronic devices in which a semiconductor device obtained in any of the previous embodiments is mounted. The semiconductor device obtained in any of the previous embodiments can store data even when power is not supplied. Further, deterioration from writing and erasing is not caused. Additionally, the operation of writing and erasing is also high-speed. For this reason, it is possible to provide an electronic device of a new structure using the aforementioned semiconductor device. Note that the semiconductor device according to any of the previous embodiments is mounted on an integrated circuit board and the like, and is mounted inside of each electronic device.

Figure 10A:
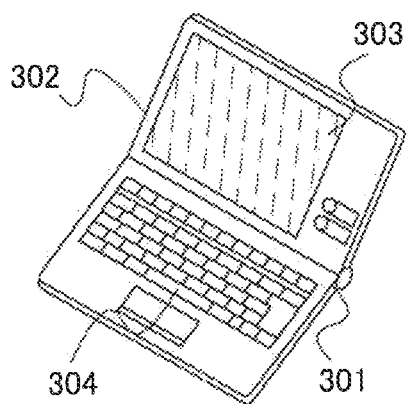
FIGS. 10A to 10F each illustrate an electronic device.

FIG. 10A is a notebook style personal computer which includes the semiconductor device according to any of the previous embodiments, and is formed with a housing 301, a housing 302, a display portion 303, a keyboard 304, and the like.

Figure 10D:
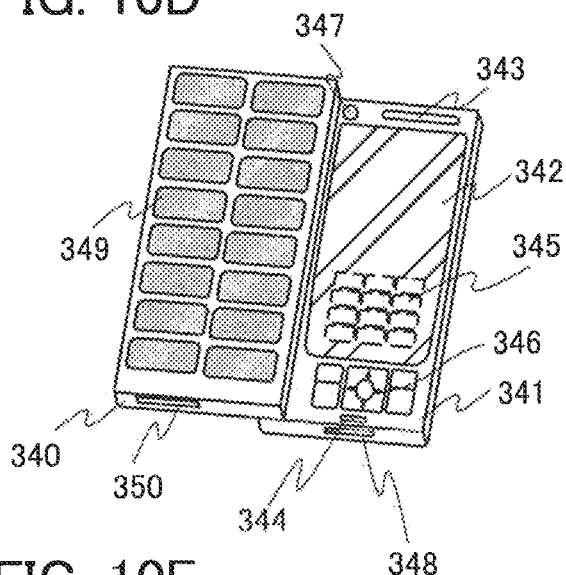
Figure 10B:
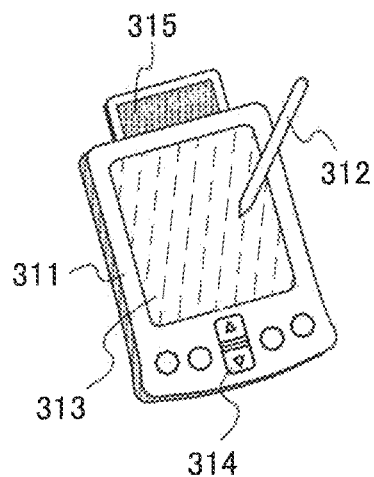

FIG. 10B is a personal digital assistant (PDA) which includes the semiconductor device according to any of the previous embodiments, and is provided with a housing 311, a display portion 313, an external interface 315, operation buttons 314, and the like. Additionally, there is a stylus 312 as an operation accessory.

Figure 10E:
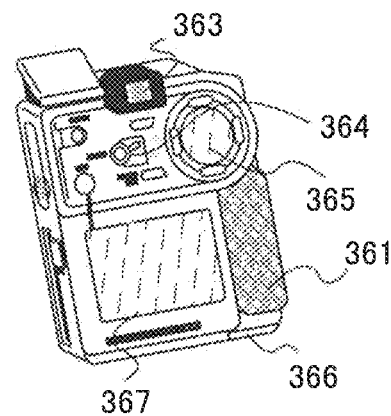
Figure 10C:
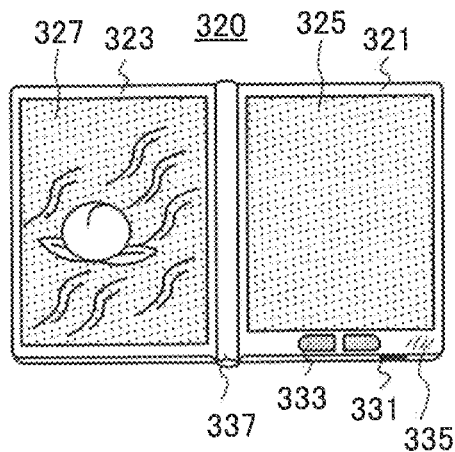

As an example of electronic paper, FIG. 10C is an illustration of an e-book reader 320 which includes the semiconductor device according to any of the previous embodiments. The e-book reader 320 includes two housings, a housing 321 and a housing 323. The housings 321 and 323 are attached by a hinge 337 so that the e-book reader 320 can be opened and closed along the hinge 337. With such a structure, the e-book reader 320 can be used like a paper book.

A display portion 325 is incorporated in the housing 321, and a display portion 327 is incorporated in the housing 323. The display portion 325 and the display portion 327 may display one image or different images. In the case where the display portion 325 and the display portion 327 display different images, for example, a display portion on the right side (the display portion 325 in FIG. 10C) can display text and a display portion on the left side (the display portion 327 in FIG. 10C) can display graphics.

FIG. 10C illustrates an example in which the housing 321 is provided with an operation portion and the like. For example, the housing 321 includes a power source 331, operation keys 333, a speaker 335, and the like. Pages can be turned with the operation keys 333. Note that a keyboard, a pointing device, or the like may also be provided on the surface of the housing on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or a side surface of the housing. Additionally, the e-book reader 320 may have a function of an electronic dictionary.

Further, the e-book reader 320 may send and receive data wirelessly. Through wireless communication, desired book data or the like can be purchased and downloaded from an electronic book server.

Note that the electronic paper can be applied to devices of any field as long as they can display data. For example, other than the e-book reader, electronic paper can be used for posters, advertisement in vehicles such as trains, display in a variety of cards such as credit cards, and so on.

FIG. 10D is a cellular phone including the semiconductor device according to any of the previous embodiments. The aforesaid cellular phone includes two housings, a housing 340 and a housing 341. The housing 341 includes a display panel 342, a speaker 343, a microphone 344, a pointing device 346, a camera lens 347, an external connection terminal 348, and the like. Further, the housing 341 includes a solar cell battery cell 349 which charges the cellular phone, an external memory slot 350, and the like. In addition, an antenna is incorporated in the housing 341.

The display panel 342 functions as a touch panel, and as illustrated by dashed lines in FIG. 10D, a plurality of operation keys 345 is displayed as an image. Note that the cellular phone is mounted with a boosting circuit for boosting an output voltage of the solar battery cell 349 into the necessary voltage for each circuit. Further, in addition to the above structure, the cellular phone can be further incorporated with a contactless IC chip, a small memory device, or the like.

In the display panel 342, a display orientation can be appropriately changed according to a usage pattern. Further, since the camera lens 347 is provided on the same surface as the display panel 342, the cellular phone can be used as a video phone. The speaker 343 and the microphone 344 can be used not only for voice calls, but also for video phone calls, recording, playing sound, and the like. Moreover, the housings 340 and 341 developed as illustrated in FIG. 10D can be slid so that one overlaps the other; therefore, the size of the cellular phone can be reduced, which makes the cellular phone suitable for being carried.

The external connection terminal 348 can be connected to various cables such as an AC adapter or a USB cable, whereby the cellular phone can be charged or can perform data communication or the like. Moreover, by inserting a recording medium into the external memory slot 350, the cellular phone can handle the storage and transfer of a large amount of data. Further, in addition to the above functions, an infrared communication function, a television reception function, or the like may be provided.

FIG. 10E is a digital camera including the semiconductor device according to any of the previous embodiments. The digital camera includes a main body 361, a display portion A 367, an eye piece 363, an operation switch 364, a display portion B 365, a battery 366, and the like.

Figure 10F:
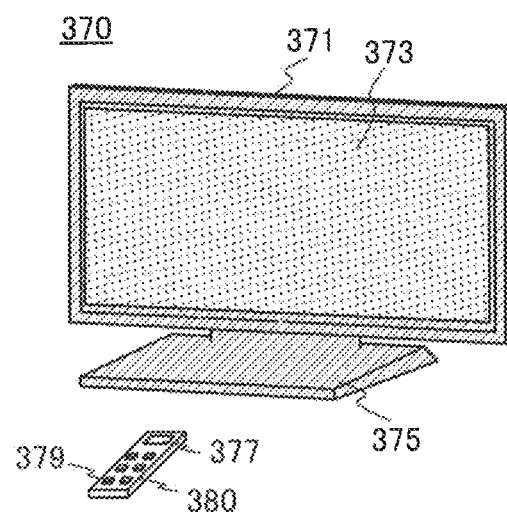

FIG. 10F is a television set including the semiconductor device according to any of the previous embodiments. The television set 370 has a display portion 373 incorporated in a housing 371. Images can be displayed on the display portion 373. Note that here, the housing 371 is supported by a stand 375.

The television set 370 can be operated by an operation switch of the housing 371 or a separate remote controller 380. Channels and volume can be controlled with operation keys 379 of the remote controller 380, thus an image displayed on the display portion 373 can be controlled. Moreover, the remote controller 380 may have a display portion 377 in which the information output from the remote controller 380 is displayed.

Note that the television set 370 is preferably provided with a receiver, a modem, and the like. With the use of the receiver, general television broadcasting can be received. Additionally, when the display device is connected to a communication network with or without wires via the modem, one-way (from a sender to a receiver) or two-way (between a sender and a receiver or between receivers) data communication can be performed.

The structures, methods, and the like described in this embodiment can be combined as appropriate with any of the structures, methods, and the like described in the other embodiments.

Example 1

In this example, results obtained by measuring the off current of a transistor including a highly purified oxide semiconductor will be described.

Figure 25:
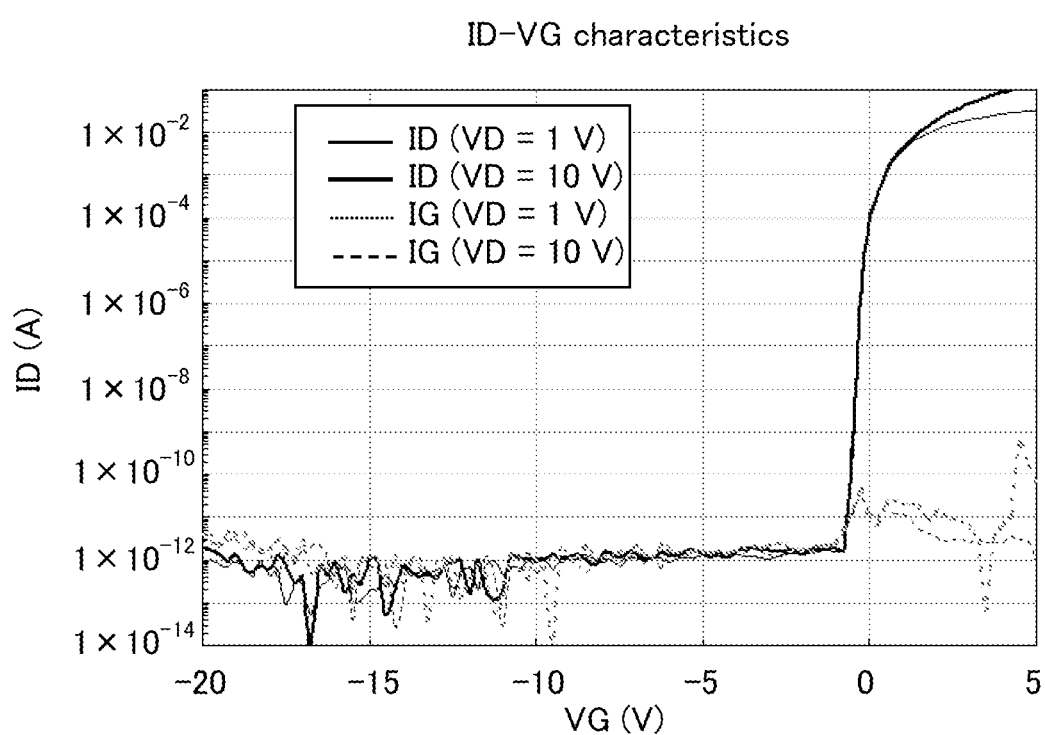
FIG. 25 is a graph showing characteristics of a transistor including an oxide semiconductor.

First, a transistor with a channel width W of 1 m, which is sufficiently wide, was prepared in consideration of the very small off current of a transistor including a highly purified oxide semiconductor, and the off current is measured. FIG. 25 shows the results obtained by measurement of the off current of a transistor with a channel width W of 1 m. In FIG. 25, the horizontal axis shows a gate voltage VG and the vertical axis shows a drain current ID. In the case where the drain voltage VD is +1 V or +10 V and the gate voltage VG is within the range of −5 V to −20 V, the off current of the transistor was found to be smaller than or equal to $1 \times 10^{-13}$ A which is the detection limit. Moreover, it was found that the off current of the transistor (per unit channel width (1 µm)) is smaller than or equal to 1 aA/µm ($1 \times 10^{-18}$ A/µm).

Next will be described the results obtained by measuring the off current of the transistor including a highly purified oxide semiconductor more accurately. As described above, the off current of the transistor including a highly purified oxide semiconductor was found to be smaller than or equal to $1 \times 10^{-13}$ A which is the measurement limit of measurement equipment. Here, the results obtained measuring more accurate off current (the value smaller than or equal to the detection limit of measurement equipment in the above measurement), with the use of an element for characteristic evaluation, will be described.

First, the element for characteristic evaluation will be described with reference to FIG. 26.

Figure 26:
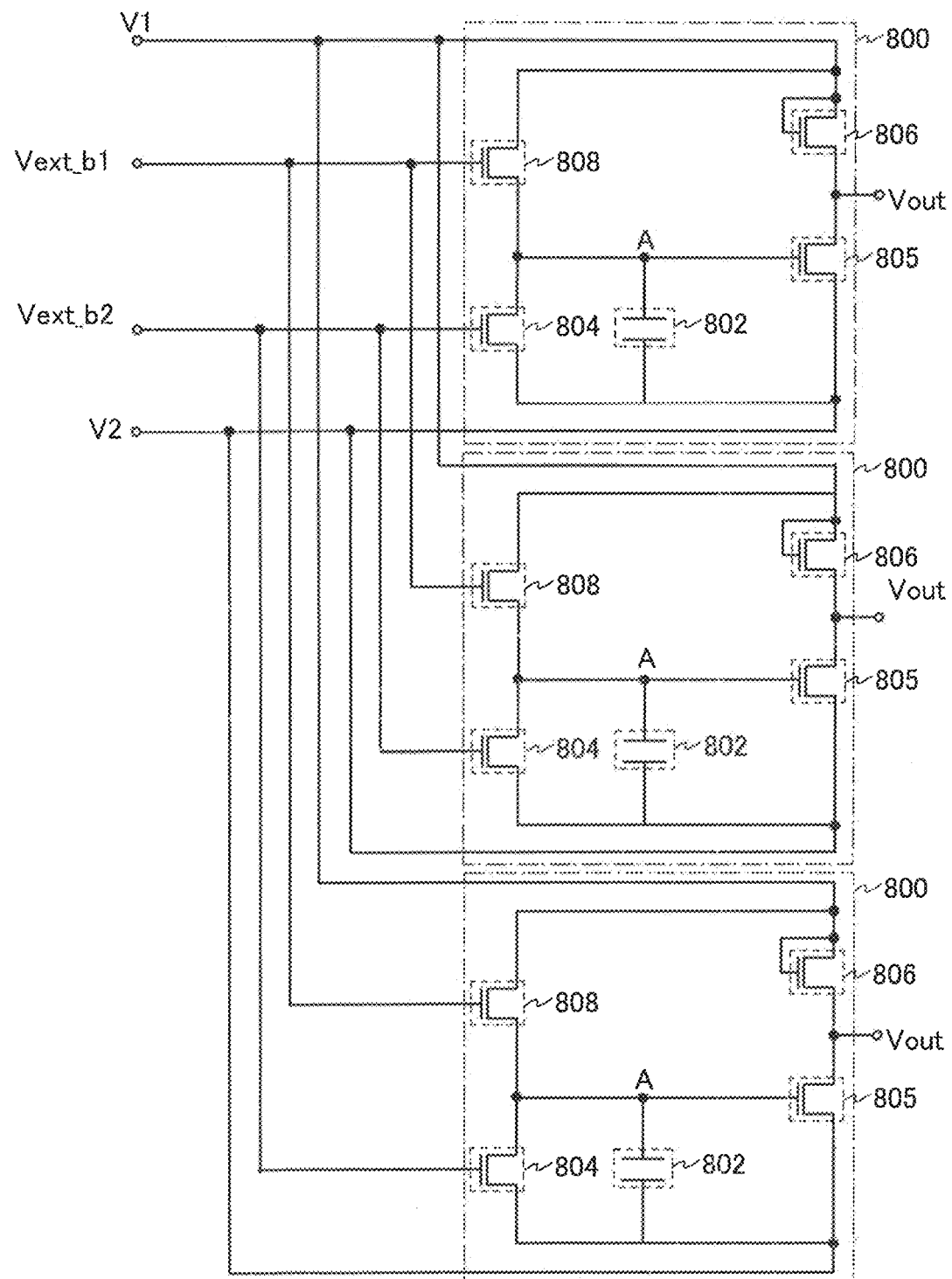
FIG. 26 is a circuit diagram for evaluating characteristics of a transistor including an oxide semiconductor.

In the element for characteristic evaluation in FIG. 26, three measurement systems 800 are connected in parallel. The measurement system 800 includes a capacitor 802, a transistor 804, a transistor 805, a transistor 806, and a transistor 808. A transistor including a highly purified oxide semiconductor was used as each of the transistors 804, 805, and 806.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of a source terminal and a drain terminal of the transistor 808, one of a source terminal and a drain terminal of the transistor 806, and a gate terminal of the transistor 806 are connected to a power source (for supplying V1). The other of the source terminal and the drain terminal of the transistor 805, the other of the source terminal and the drain terminal of the transistor 806 are connected to each other. In addition, an output terminal is provided.

A potential Vext_b2 for controlling an on state and an off state of the transistor 804 is supplied to the gate terminal of the transistor 804. A potential Vext_b1 for controlling an on state and an off state of the transistor 808 is supplied to the gate terminal of the transistor 808. A potential Vout is output from the output terminal.

Next, a method for measuring current with the use of the element for characteristic evaluation will be described.

First, an initial period in which a potential difference is applied to measure the off current will be described briefly. In the initial period, the potential Vext_b1 for turning on the transistor 808 is input to the gate terminal of the transistor 808, and a potential V1 is supplied to a node A that is a node connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is, for example, a high potential. The transistor 804 is off.

After that, the potential Vext_b1 for turning on the transistor 808 is input to the gate terminal of the transistor 808 so that the transistor 808 is turned off. After the transistor 808 is turned off, the potential V1 is set to low. Still, the transistor 804 is off. The potential V2 is the same potential as V1. Thus, the initial period is completed. In a state where the initial period is completed, a potential difference is generated between the node A and one of the source terminal and the drain terminal of the transistor 804, and also, a potential difference is generated between the node A and the other of the source terminal and the drain terminal of the transistor 808. Therefore, charge flows slightly through the transistor 804 and the transistor 808. In other words, an off current is generated.

Next, a measurement period of the off current will be described briefly. In the measurement period, the potential (that is, V2) of one of the source terminal and the drain terminal of the transistor 804 and the potential (that is, V1)

of the other of the source terminal and the drain terminal of the transistor 808 are set to low and fixed. On the other hand, the potential of the node A is not fixed (the node A is in a floating state) in the measurement period. Accordingly, charge flows through the transistor 804 and the amount of charge held at the node A is changed as time goes by. Further, as the amount of charge held at the node A is changed, the potential of the node A varies. That is to say, the output potential Vout of the output terminal also varies.

Figure 27:
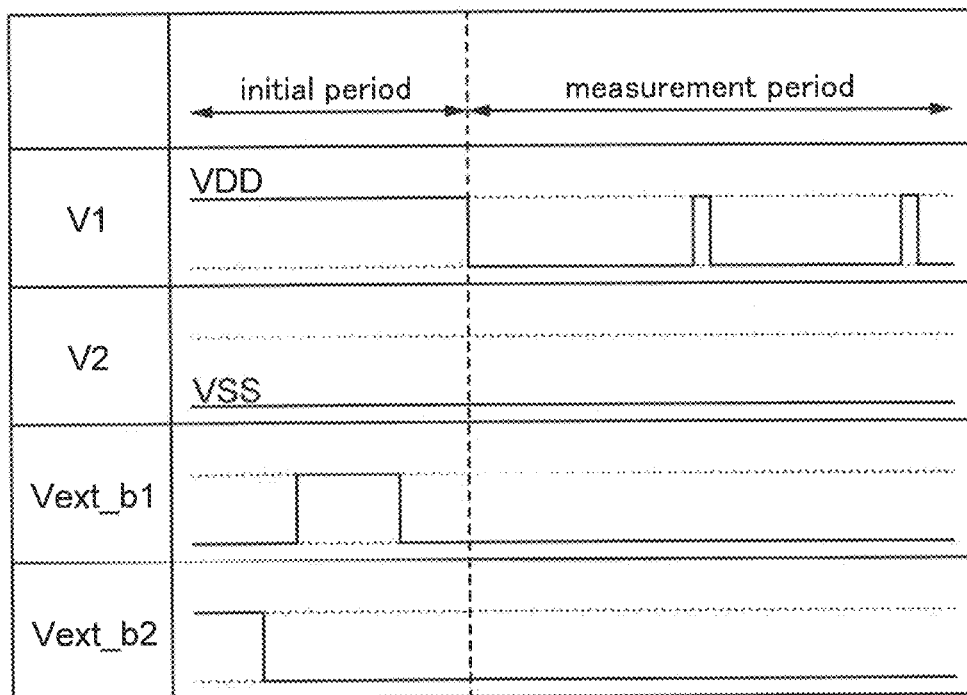
FIG. 27 is a timing chart for evaluating characteristics of a transistor including an oxide semiconductor.

FIG. 27 shows details of the relation between potentials in the initial period in which the potential difference is applied and in the following measurement period (timing chart).

In the initial period, first, the potential Vext_b2 is set to a potential (high potential) at which the transistor 804 is turned on. Thus, the potential of the node A comes to be V2, that is, a low potential (VSS). After that, the potential Vext_b2 is set to a potential (low potential) at which the transistor 804 is turned off, whereby the transistor 804 is turned off. Then, the potential Vext_b1 is set to a potential (high potential) at which the transistor 808 is turned on. Thus, the potential of the node A comes to be V1, that is, a high potential (VDD). After that, the potential Vext_b1 is set to a potential at which the transistor 808 is turned off. Accordingly, the node A is brought into a floating state and the initial period is completed.

In the following measurement period, the potential V1 and the potential V2 are individually set to potentials at which charge flow to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When a potential difference is applied as described above to start the measurement period, the amount of charge held at the node A is changed as time passes and accordingly, the potential of the node A varies. This means that the potential of a gate terminal of the transistor 805 varies and thus, the output potential Vout of the output terminal also varies with the lapse of time.

A method for calculating the off current based on the obtained output potential Vout will be described below.

The relation between the potential $V_A$ of the node A and the output potential Vout is obtained in advance before the off current is calculated. Thus, the potential $V_A$ of the node A can be obtained based on the output potential Vout. From the relation described above, the potential $V_A$ of the node A can be expressed by the following equation as a function of the output potential Vout.

$$V_A = F(Vout) \quad \text{[Equation 1]}$$

Charge $Q_A$ of the node A is expressed by the following equation, using the potential $V_A$ of the node A, capacitance $C_A$ connected to the node A, and a constant (const). Here, the capacitance $C_A$ connected to the node A is the sum of capacitance of the capacitor 802 and the other capacitance.

$$Q_A = C_A V_A + \text{const} \quad \text{[Equation 2]}$$

Since a current $I_A$ of the node A is obtained by differentiating charge flowing to the node A (or charge flowing from the node A) with respect to time, the current $I_A$ of the node A is expressed by the following equation.

$$I_A = \frac{\Delta Q_A}{\Delta t} = \frac{C_A \cdot \Delta F(Vout)}{\Delta t} \quad \text{[Equation 3]}$$

Thus, the current $I_A$ of the node A can be obtained based on the capacitance $C_A$ connected to the node A and the output potential Vout of the output terminal.

By the method described above, a leakage current (off current) flowing between the source and the drain of the transistor which is off can be calculated.

In this example, the transistor 804, the transistor 805, the transistor 806, and the transistor 808 were fabricated using a highly purified oxide semiconductor with a channel length L of 10 μm and a channel width W of 50 μm. In each of the measurement systems 800 arranged in parallel, capacitance values of capacitors 802a, 802b, and 802c were 100 fF, 1 pF, and 3 pF, respectively.

Note that the measurement according to this example was performed assuming that VDD=5 V and VSS=0 V are satisfied. In the measurement period, the potential V1 was basically set to VSS and set to VDD only in a period of 100 msec every 10 to 300 seconds, and Vout was measured. Further, Δt used when the current I flowing through an element was about 30,000 seconds.

Figure 28:
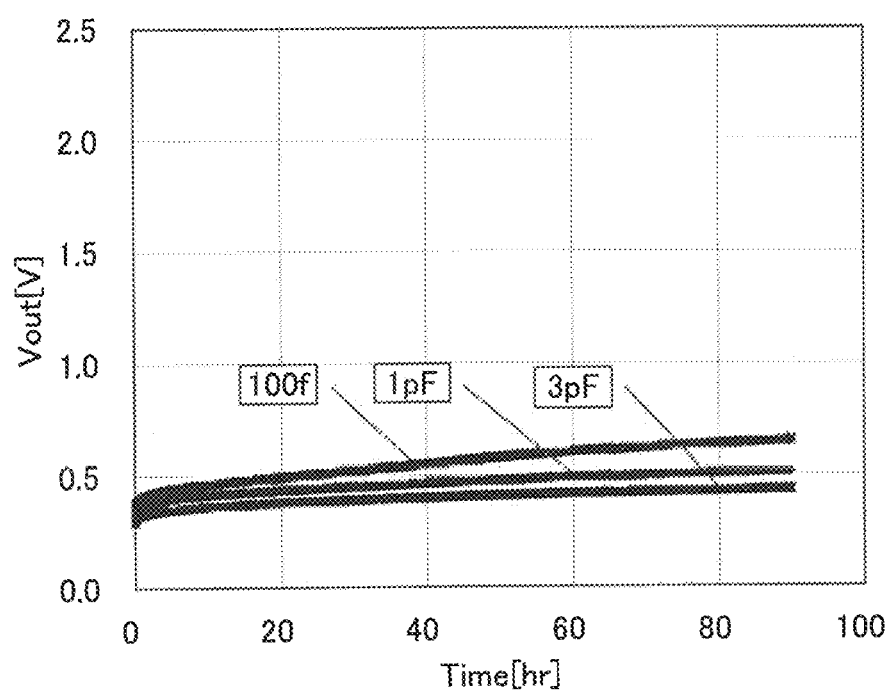
FIG. 28 is a graph showing characteristics of a transistor including an oxide semiconductor.

FIG. 28 shows the relation between the output potential Vout and elapsed time Time in the current measurement. According to FIG. 28, the potential varies as time advances.

Figure 29:
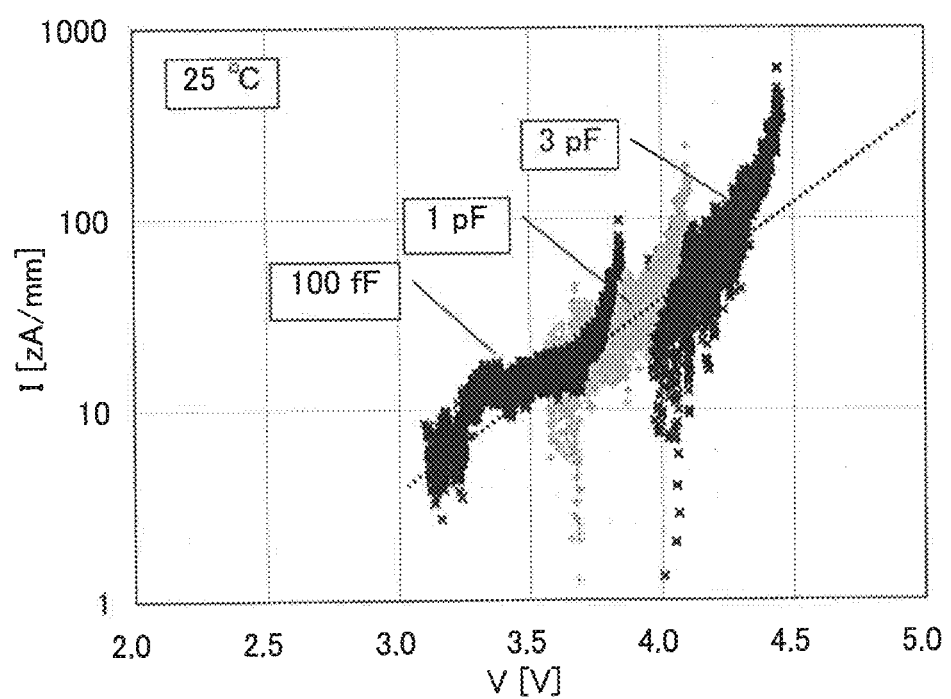
FIG. 29 is a graph showing characteristics of a transistor including an oxide semiconductor.

FIG. 29 shows the off current at room temperature (25° C.) calculated based on the above current measurement. Note that FIG. 29 shows the relation between a source-drain voltage V and an off current I. According to FIG. 29, an off current was about 40 zA/μm, where the source-drain voltage is 4 V. When the source-drain voltage was 3.1 V, the off current was smaller than or equal to 10 zA/μm. Note that 1 zA is equivalent to $10^{-21}$ A.

Figure 30:
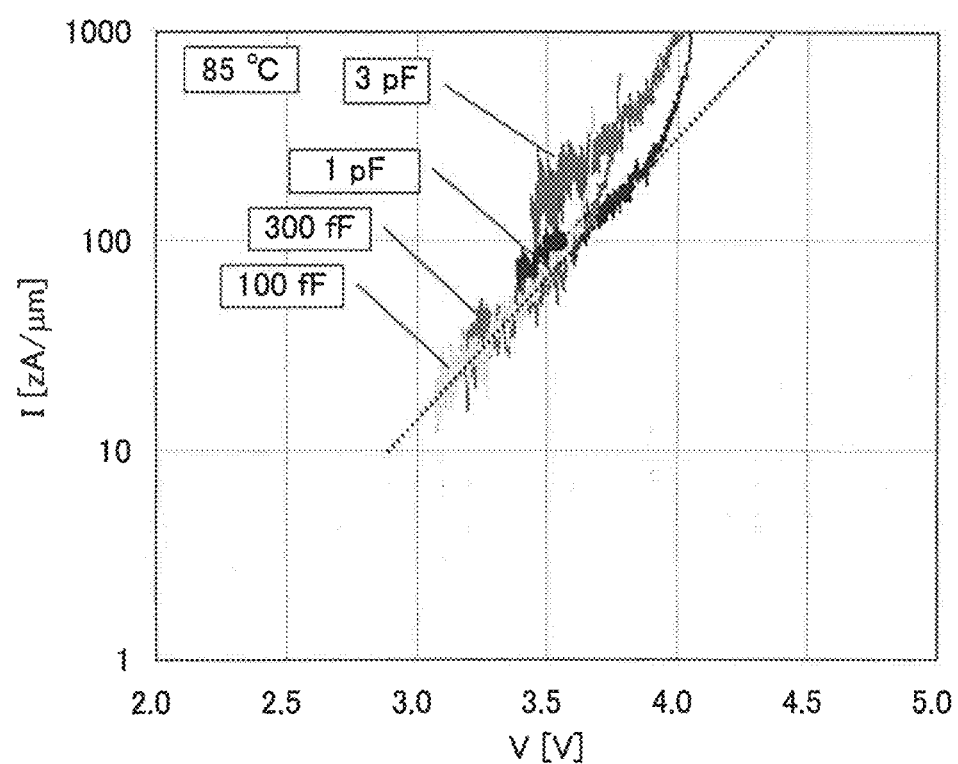
FIG. 30 is a graph showing characteristics of a transistor including an oxide semiconductor.

Further, FIG. 30 shows the off current in an environment at a temperature of 85° C., which was calculated based on the above current measurement. FIG. 30 shows the relation between a source-drain voltage V and an off current I in a circumstance at 85° C. According to FIG. 30, the off current was about 100 zA/μm when the source-drain voltage was 3.1 V.

According to this example, it was confirmed that the off current can be sufficiently small in a transistor including a highly purified oxide semiconductor.

Example 2

The number of times the semiconductor device according to an embodiment of the disclosed invention can rewrite data was examined. In this example, the examination results will be described with reference to FIG. 31.

A semiconductor device used for the examination is the semiconductor device having the circuit configuration in FIG. 15A. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width at the time after storing and writing data were repeated predetermined times. Data was stored and written by applying 0 V or 5 V to a line corresponding to the third line in FIG. 15A and applying 0 V or 5 V to a line corresponding to the fourth line in FIG. 15A. When the potential of the line corresponding to the fourth line is 0 V, the transistor (writing transistor) corresponding to the transistor 162 is off; thus, a potential supplied to a node FG is held. When the potential of the line corresponding to the fourth line is 5 V, the transistor (writing transistor) corresponding to the transistor 162 is on; thus, a potential of the line corresponding to the third line is supplied to the node FG.

The memory window width is one of indicators of characteristics of a memory device. Here, the memory window width represents the shift amount ΔVcg in curves (Vcg–Id curves) between different memory states, which show the relation between the potential Vcg of a line corresponding to the fifth line and a drain current Id of a transistor (reading transistor) corresponding to the transistor 160. The different memory states mean a state where 0 V is applied to the node FG (hereinafter referred to as a low state) and a state where 5 V is applied to the node FG (hereinafter referred to as a high state). That is, the memory window width can be checked by sweeping the potential Vcg in the low state and in the high state.

Figure 31:
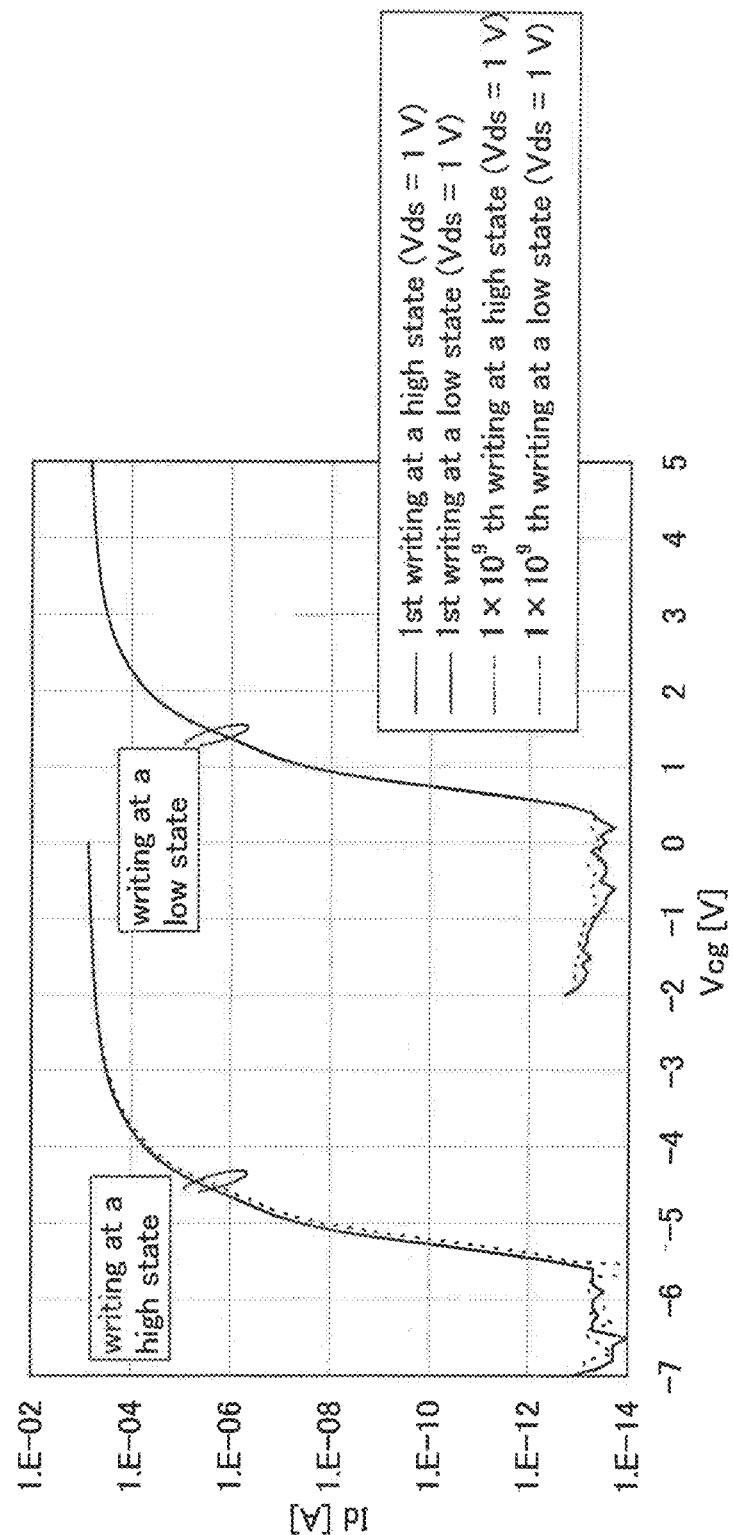
FIG. 31 is a graph showing evaluation results of a memory window width.

FIG. 31 shows the examination results of the memory window width at the time after writing was performed $1\times10^9$ times. Note that in FIG. 31, the horizontal axis shows a Vcg (V) and the vertical axis shows Id (A). According to FIG. 31, the memory window width was not changed after data was written $1\times10^9$ times, which means that at least during the period after data is written $1\times10^9$ times, the semiconductor device does not deteriorate.

As described above, in a semiconductor device according to an embodiment of the disclosed invention, characteristics were not changed even after data is stored and written $1\times10^9$ times and resistance against rewriting was very high. That is, it can be said that according to an embodiment of the disclosed invention, a significantly reliable semiconductor device can be realized.

This application is based on Japanese Patent Application serial no. 2009-249330 filed with Japan Patent Office on Oct. 29, 2009, the entire contents of which are hereby incorporated by reference.

The invention claimed is:

1. A semiconductor device comprising:
a plurality of circuits arranged in matrix,
wherein each of the plurality of circuits comprises a first transistor, a second transistor, first to sixth conductive layers, first and second insulating layers, and a capacitor,
wherein the first transistor comprises a first channel formation region,
wherein the second transistor comprises a second channel formation region formed in an oxide semiconductor layer,
wherein the first channel formation region comprises silicon,
wherein the second channel formation region comprises an oxide semiconductor,
wherein a gate electrode of the first transistor is electrically connected to the capacitor,
wherein the first conductive layer comprises a region configured to function as the gate electrode of the first transistor, the region being over the first channel formation region,
wherein the first conductive layer is electrically connected to one of the second conductive layer and the third conductive layer,
wherein the first insulating layer comprises a region in contact with a side surface of the first conductive layer,
wherein the second conductive layer comprises a region configured to function as one of a source electrode and a drain electrode of the second transistor, the region being over the first insulating layer,
wherein the third conductive layer comprises a region configured to function as the other of the source electrode and the drain electrode of the second transistor, the region being over the first insulating layer,
wherein the oxide semiconductor layer comprises a region over the second conductive layer, a region in contact with a side surface of the second conductive layer, a region in contact with a side surface of the third conductive layer, and a region over the third conductive layer,
wherein the fourth conductive layer comprises a region configured to function as a gate electrode of the second transistor, the region being over the second channel formation region,
wherein the fifth conductive layer comprises a region configured to function as an electrode of the capacitor,
wherein the fifth conductive layer is positioned at a same layer as the fourth conductive layer,
wherein the second insulating layer comprises a region over the fourth conductive layer and a region over the fifth conductive layer,
wherein the sixth conductive layer comprises a region over the second insulating layer, the sixth conductive layer being electrically connected to one of a source region and a drain region of the first transistor through a contact hole provided in the second insulating layer,
wherein the sixth conductive layer comprises a region overlapping with the capacitor with the second insulating layer therebetween, a region overlapping with the oxide semiconductor layer with the second insulating layer therebetween in a region between the fourth conductive layer and the fifth conductive layer, and a region overlapping with the second channel formation region with the second insulating layer and the fourth conductive layer therebetween,
wherein in a plan view of the plurality of circuits, a channel width direction of the second transistor is a first direction,
wherein in the plan view of the plurality of circuits, a width of the fourth conductive layer in the first direction is greater than a width of the fourth conductive layer in a second direction intersecting the first direction, and
wherein in the plan view of the plurality of circuits, a width of the fifth conductive layer in the first direction is greater than a width of the fifth conductive layer in the second direction.

2. The semiconductor device according to claim 1, wherein the first channel formation region is formed in a semiconductor layer different from the oxide semiconductor layer.

3. The semiconductor device according to claim 1, wherein the first channel formation region is formed in a single crystal silicon substrate.

4. The semiconductor device according to claim 1, wherein the fourth conductive layer and the fifth conductive layer are formed by an etching process of a same conductive layer.

5. The semiconductor device according to claim 1, wherein the oxide semiconductor comprises indium, gallium, and zinc.

6. A semiconductor device comprising:
a plurality of circuits arranged in matrix,
wherein each of the plurality of circuits comprises a first transistor, a second transistor, first to sixth conductive layers, first and second insulating layers, and a capacitor,
wherein the first transistor comprises a first channel formation region, wherein the second transistor comprises a second channel formation region formed in an oxide semiconductor layer, wherein the first channel formation region comprises silicon, wherein the second channel formation region comprises an oxide semiconductor, wherein a gate electrode of the first transistor is electrically connected to the capacitor, wherein the first conductive layer comprises a region configured to function as the gate electrode of the first transistor, the region being over the first channel formation region, wherein the first conductive layer is electrically connected to one of the second conductive layer and the third conductive layer, wherein the first insulating layer comprises a region in contact with a side surface of the first conductive layer, wherein the second conductive layer comprises a region configured to function as one of a source electrode and a drain electrode of the second transistor, the region being over the first insulating layer, wherein the third conductive layer comprises a region configured to function as the other of the source electrode and the drain electrode of the second transistor, the region being over the first insulating layer, wherein the oxide semiconductor layer comprises a region over the second conductive layer, a region in contact with a side surface of the second conductive layer, a region in contact with a side surface of the third conductive layer, and a region over the third conductive layer, wherein the fourth conductive layer comprises a region configured to function as a gate electrode of the second transistor, the region being over the second channel formation region, wherein the fifth conductive layer comprises a region configured to function as an electrode of the capacitor, wherein the fifth conductive layer comprises the same material as the fourth conductive layer, wherein the second insulating layer comprises a region over the fourth conductive layer and a region over the fifth conductive layer, wherein the sixth conductive layer comprises a region over the second insulating layer, the sixth conductive layer being electrically connected to one of a source region and a drain region of the first transistor through a contact hole provided in the second insulating layer, wherein the sixth conductive layer comprises a region overlapping with the capacitor with the second insulating layer therebetween, a region overlapping with the oxide semiconductor layer with the second insulating layer therebetween in a region between the fourth conductive layer and the fifth conductive layer, and a region overlapping with the second channel formation region with the second insulating layer and the fourth conductive layer therebetween, wherein in a plan view of the plurality of circuits, a channel width direction of the second transistor is a first direction, wherein in the plan view of the plurality of circuits, a width of the fourth conductive layer in the first direction is greater than a width of the fourth conductive layer in a second direction intersecting the first direction, and wherein in the plan view of the plurality of circuits, a width of the fifth conductive layer in the first direction is greater than a width of the fifth conductive layer in the second direction.

7. The semiconductor device according to claim 6, wherein the first channel formation region is formed in a semiconductor layer different from the oxide semiconductor layer.

8. The semiconductor device according to claim 6, wherein the first channel formation region is formed in a single crystal silicon substrate.

9. The semiconductor device according to claim 6, wherein the oxide semiconductor comprises indium, gallium, and zinc.

10. The semiconductor device according to claim 6, wherein the fourth conductive layer and the fifth conductive layer are formed by an etching process of a same conductive layer.

11. A semiconductor device comprising:
a plurality of circuits arranged in matrix,
wherein each of the plurality of circuits comprises a first transistor, a second transistor, first to sixth conductive layers, first and second insulating layers, and a capacitor, wherein the first transistor comprises a first channel formation region, wherein the second transistor comprises a second channel formation region formed in an oxide semiconductor layer, wherein the first channel formation region comprises silicon, wherein the second channel formation region comprises an oxide semiconductor, wherein a gate electrode of the first transistor is electrically connected to the capacitor, wherein the first conductive layer comprises a region configured to function as the gate electrode of the first transistor, the region being over the first channel formation region, wherein the first conductive layer is electrically connected to one of the second conductive layer and the third conductive layer, wherein the first insulating layer comprises a region in contact with a side surface of the first conductive layer, wherein the second conductive layer comprises a region configured to function as one of a source electrode and a drain electrode of the second transistor, the region being over the first insulating layer, wherein the third conductive layer comprises a region configured to function as the other of the source electrode and the drain electrode of the second transistor, the region being over the first insulating layer, wherein the oxide semiconductor layer comprises a region over the second conductive layer, a region in contact with a side surface of the second conductive layer, a region in contact with a side surface of the third conductive layer, and a region over the third conductive layer, wherein the fourth conductive layer comprises a region configured to function as a gate electrode of the second transistor, the region being over the second channel formation region, wherein the fifth conductive layer comprises a region configured to function as an electrode of the capacitor, wherein the fifth conductive layer comprises the same material as the fourth conductive layer, wherein a thickness of the fifth conductive layer and a thickness of the fourth conductive layer is the same, wherein the second insulating layer comprises a region over the fourth conductive layer and a region over the fifth conductive layer, wherein the sixth conductive layer comprises a region over the second insulating layer, the sixth conductive layer being electrically connected to one of a source region and a drain region of the first transistor through a contact hole provided in the second insulating layer, wherein the sixth conductive layer comprises a region overlapping with the capacitor with the second insulating layer therebetween, a region overlapping with the oxide semiconductor layer with the second insulating layer therebetween in a region between the fourth conductive layer and the fifth conductive layer, and a region overlapping with the second channel formation region with the second insulating layer and the fourth conductive layer therebetween, wherein in a plan view of the plurality of circuits, a channel width direction of the second transistor is a first direction, wherein in the plan view of the plurality of circuits, a width of the fourth conductive layer in the first direction is greater than a width of the fourth conductive layer in a second direction intersecting the first direction, and wherein in the plan view of the plurality of circuits, a width of the fifth conductive layer in the first direction is greater than a width of the fifth conductive layer in the second direction.

12. The semiconductor device according to claim 11, wherein the first channel formation region is formed in a semiconductor layer different from the oxide semiconductor layer.

13. The semiconductor device according to claim 11, wherein the first channel formation region is formed in a single crystal silicon substrate.

14. The semiconductor device according to claim 11, wherein the oxide semiconductor comprises indium, gallium, and zinc.

15. The semiconductor device according to claim 11, wherein the fourth conductive layer and the fifth conductive layer are formed by etching a same conductive layer.

* * * * *